(12) United States Patent
Tagami et al.

(10) Patent No.: US 10,510,764 B2
(45) Date of Patent: Dec. 17, 2019

(54) SEMICONDUCTOR DEVICE

(71) Applicant: Toshiba Memory Corporation, Minato-ku (JP)

(72) Inventors: Masayoshi Tagami, Kuwana (JP); Ryota Katsumata, Yokkaichi (JP); Toru Matsuda, Yokkaichi (JP); Yu Hirotsu, Kuwana (JP); Naoki Yamamoto, Kuwana (JP)

(73) Assignee: Toshiba Memory Corporation, Minato-ku (JP)

( * ) Notice: Subject to any disclaimer, the term of this patent is extended or adjusted under 35 U.S.C. 154(b) by 8 days.

(21) Appl. No.: 15/948,057

(22) Filed: Apr. 9, 2018

(65) Prior Publication Data
US 2019/0096899 A1 Mar. 28, 2019

(30) Foreign Application Priority Data
Sep. 28, 2017 (JP) .................. 2017-188918

(51) Int. Cl.
| H01L 27/115 | (2017.01) |
| H01L 21/288 | (2006.01) |
| H01L 21/768 | (2006.01) |
| H01L 23/528 | (2006.01) |
| H01L 29/792 | (2006.01) |
| H01L 23/498 | (2006.01) |
| H01L 27/11524 | (2017.01) |
| H01L 27/11556 | (2017.01) |

(Continued)

(52) U.S. Cl.
CPC .... H01L 27/11524 (2013.01); H01L 27/1157 (2013.01); H01L 27/11556 (2013.01); H01L 27/11582 (2013.01)

(58) Field of Classification Search
CPC ................ H01L 27/11556; H01L 27/11521
See application file for complete search history.

(56) References Cited

U.S. PATENT DOCUMENTS 8,946,665 B2 2/2015 Shim et al.
9,196,627 B2 11/2015 Konno et al.
(Continued)

FOREIGN PATENT DOCUMENTS

JP 2015-028982 2/2015

*Primary Examiner* — Brian Turner
(74) *Attorney, Agent, or Firm* — Oblon, McClelland, Maier & Neustadt, L.L.P.

(57) ABSTRACT

According to one embodiment, a semiconductor device includes a stacked body, first, second, third, and fourth insulating bodies, first and second columnar portions. The stacked body includes a conductive layer and an insulating layer stacked alternately. The first, second, third and fourth insulating bodies, the first and second columnar portions are provided inside the stacked body. The second insulating body is at a position different from the first insulating body. The third insulating body is between the first and second insulating bodies. The fourth insulating body is between the first and second insulating bodies, and includes portions contacting the third insulating body and being separated from each other with the third insulating body interposed. The first columnar portion is between the first and fourth insulating bodies. The second columnar portion is between the second and fourth insulating bodies. The first and second columnar portions include a semiconductor layer.

20 Claims, 34 Drawing Sheets

(51) Int. Cl.
*H01L 27/11582* (2017.01)
*H01L 27/1157* (2017.01)

(56) References Cited

U.S. PATENT DOCUMENTS

| | | | |
|---|---|---|---|
| 2009/0047777 A1* | 2/2009 | Nagano | H01L 21/76837 |
| | | | 438/593 |
| 2013/0009229 A1 | 1/2013 | Lee et al. | |
| 2015/0035036 A1* | 2/2015 | Konno | H01L 27/11565 |
| | | | 257/314 |
| 2017/0053867 A1* | 2/2017 | Chiu | H01L 23/5222 |
| 2017/0271363 A1* | 9/2017 | Kamigaki | H01L 27/11582 |

\* cited by examiner

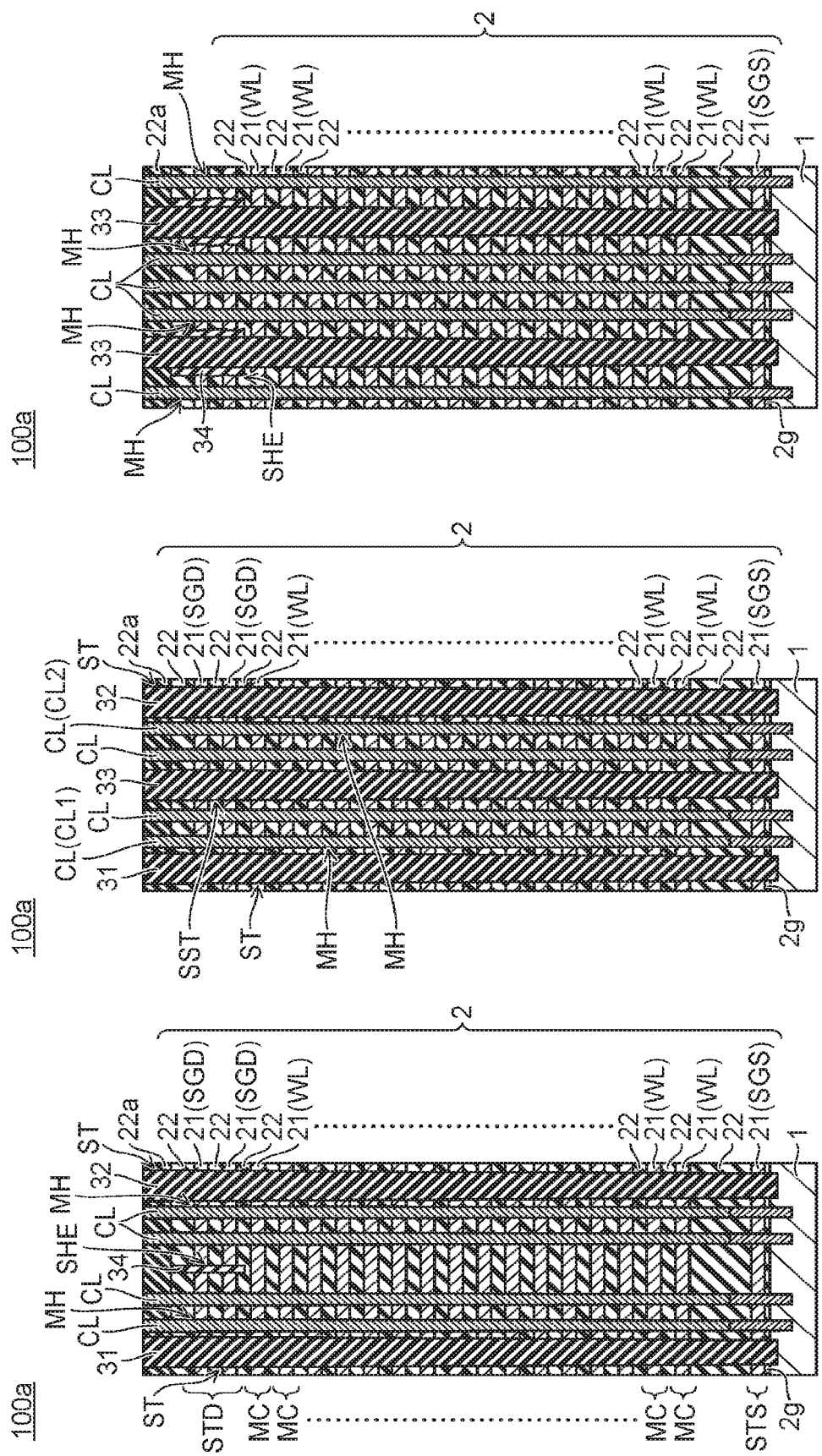

FIRST REFERENCE EXAMPLE

SEMICONDUCTOR DEVICE

CROSS-REFERENCE TO RELATED APPLICATIONS

This application is based upon and claims the benefit of priority from Japanese Patent Application No. 2017-188918, filed on Sep. 28, 2017; the entire contents of which are incorporated herein by reference.

FIELD

Embodiments described herein relate generally to a semiconductor device.

BACKGROUND

Nonvolatile memory is known in which insulating layers and conductive layers are stacked alternately in a stacked body, and memory cells are stacked in a three-dimensional structure in the height direction of the stacked body. The conductive layers that are inside the stacked body are, for example, word lines. A semiconductor layer that is used to form a channel is provided inside a memory hole extending in the height direction of the stacked body. A charge storage portion is provided at each intersection portion between the channel and the word lines; and a memory cell that includes the word line/charge storage portion/channel is obtained at each intersection portion. As downscaling of the memory cells advances, pinch-off of the conductor occurs when performing filling and formation of the conductive layers; and voids occur in the conductive layers. Therefore, there are risks that the resistance value of the conductive layer may increase, etc. It is desirable to suppress the resistance value increase of the conductive layer inside the stacked body, etc.

BRIEF DESCRIPTION OF THE DRAWINGS

FIG. 3A is a schematic cross-sectional view along line IIIA-IIIA in FIG. 2A and FIG. 2B, FIG. 3B is a schematic cross-sectional view along line IIIB-IIIB in FIG. 2A and FIG. 2B, and FIG. 3C is a schematic cross-sectional view along line IIIC-IIIC in FIG. 2A and FIG. 2B;

DETAILED DESCRIPTION

Figure 1A:
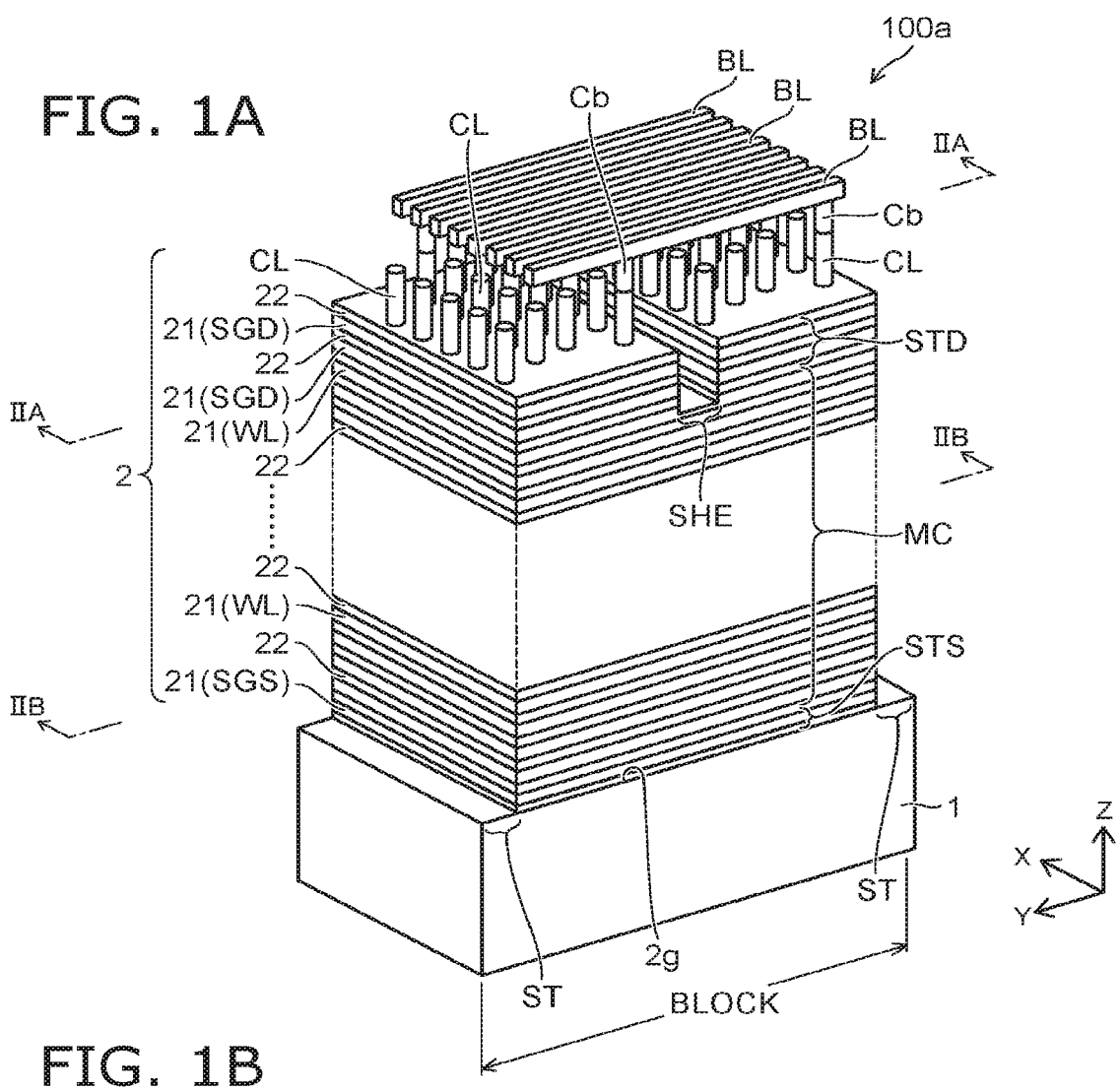
FIG. 1A is a schematic perspective view illustrating a semiconductor device according to a first embodiment.

According to one embodiment, a semiconductor device includes a stacked body, a first insulating body, a second insulating body, a third insulating body, a fourth insulating body, a first columnar portion, and a second columnar portion. The stacked body includes a conductive layer and an insulating layer. The conductive layer and the insulating layer are stacked alternately along a first direction. The first insulating body extends in a second direction and is provided inside the stacked body along the first direction from an upper end of the stacked body to a lower end of the stacked body. The second direction crosses the first direction. The second insulating body extends in the second direction and is provided inside the stacked body along the first direction from the upper end of the stacked body to the lower end of the stacked body. The second insulating body is at a position different from the first insulating body in a third direction. The third direction crosses the first direction and the second direction. The third insulating body is provided inside the stacked body along the first direction from the upper end of the stacked body to the lower end of the stacked body. The third insulating body is between the first insulating body and the second insulating body. The fourth insulating body is provided inside the stacked body along the first direction from the upper end of the stacked body partway through the stacked body. The fourth insulating body is between the first insulating body and the second insulating body. The fourth insulating body includes a plurality of portions extending in the second direction. The plurality of portions contact the third insulating body and are separated from each other in the second direction with the third insulating body interposed. The first columnar portion is provided inside the stacked body along the first direction from the upper end of the stacked body to the lower end of the stacked body. The first columnar portion is between the first insulating body and the fourth insulating body and includes a semiconductor layer. The second columnar portion is provided inside the stacked body along the first direction from the upper end of the stacked body to the lower end of the stacked body. The second columnar portion is between the second insulating body and the fourth insulating body and includes a semiconductor layer.

Embodiments of the invention will now be described with reference to the drawings.

The drawings are schematic or conceptual; and the relationships between the thicknesses and widths of portions, the proportions of sizes between portions, etc., are not necessarily the same as the actual values thereof. There are also cases where the dimensions and/or the proportions are illustrated differently between the drawings, even in the case where the same portion is illustrated. In this specification and each drawing, components similar to ones described in reference to an antecedent drawing are marked with the same reference numerals; and a detailed description is omitted as appropriate.

First Embodiment

Figure 1B:
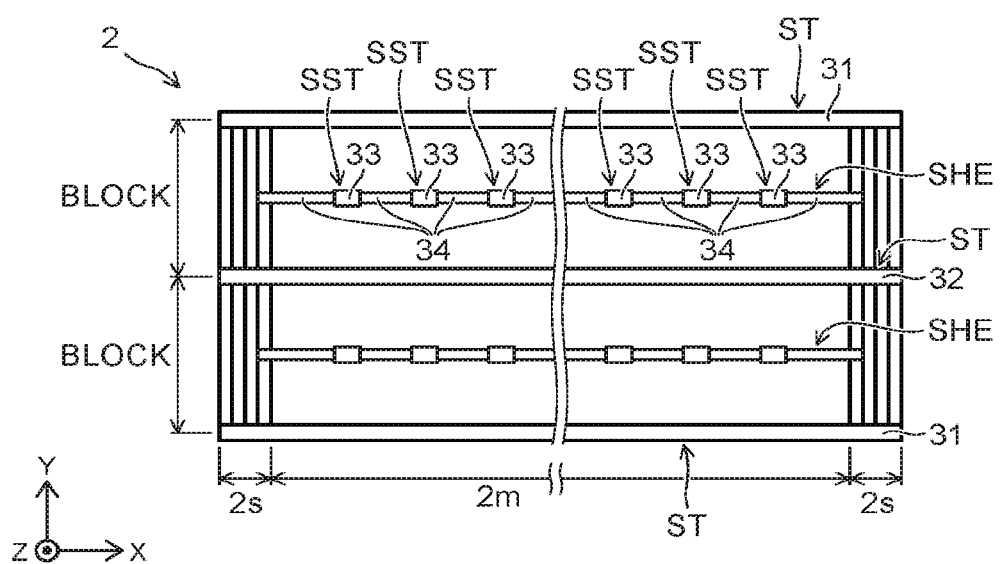
FIG. 1B is a schematic plan view of a stacked body.
Figure 2A:
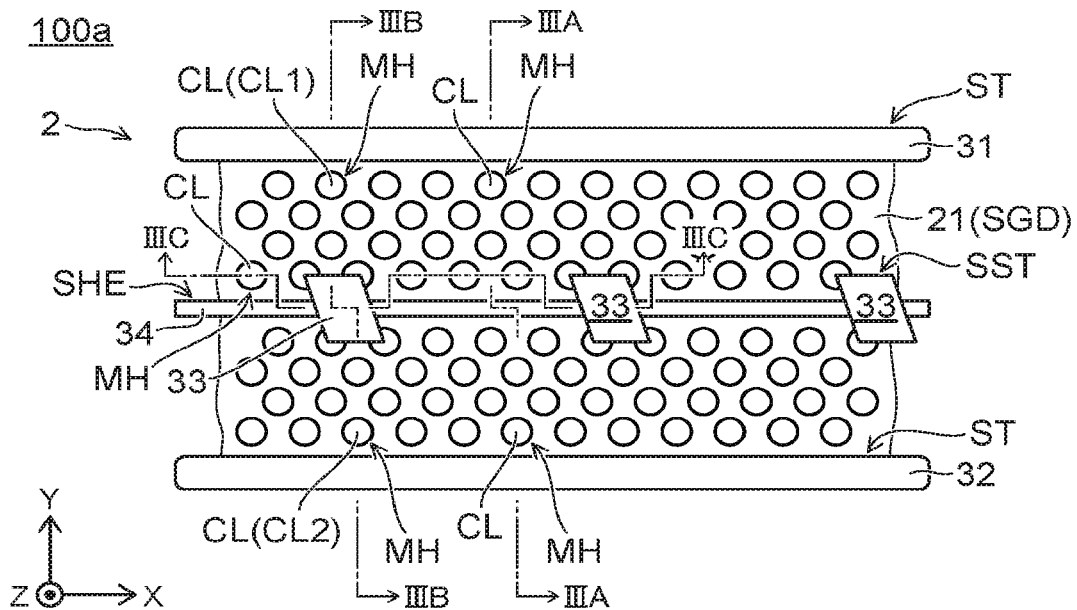
FIG. 2A is a schematic cross-sectional view along line IIA-IIA in FIG. 1A.
Figure 2B:
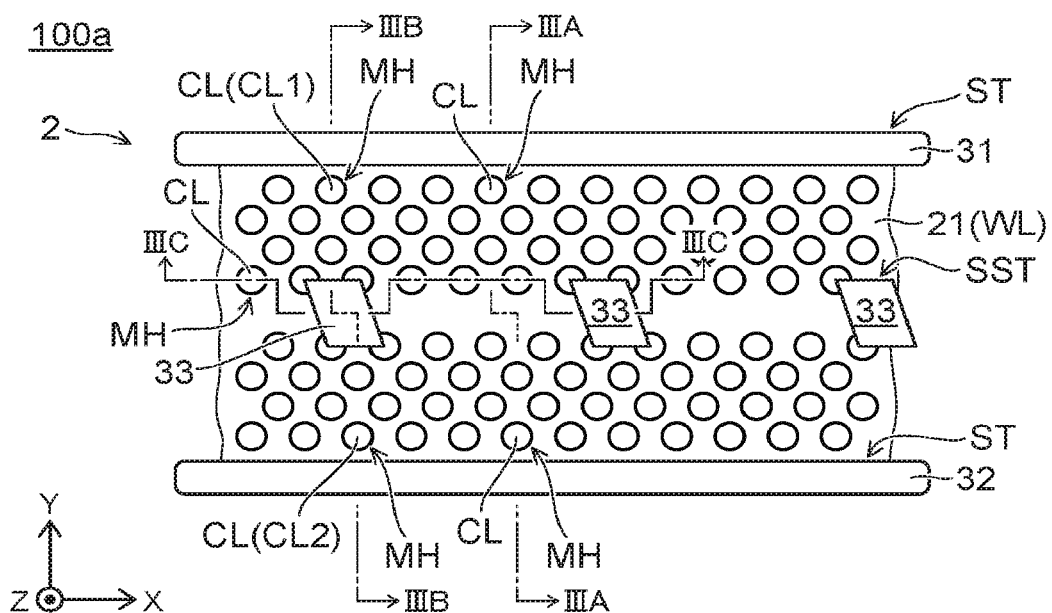
FIG. 2B is a schematic cross-sectional view along line IIB-IIB in FIG. 1A.

FIG. 1A is a schematic perspective view illustrating a semiconductor device 100a according to a first embodiment. FIG. 1B is a schematic plan view of a stacked body 2. FIG. 2A is a schematic cross-sectional view (an X-Y cross section) along line IIA-IIA in FIG. 1A. FIG. 2B is a schematic cross-sectional view (an X-Y cross section) along line IIB-IIB in FIG. 1A. FIG. 3A is a schematic cross-sectional view (a Y-Z cross section) along line IIIA-IIIA in FIG. 2A and FIG. 2B. FIG. 3B is a schematic cross-sectional view (a Y-Z cross section) along line IIIB-IIIB in FIG. 2A and FIG. 2B. FIG. 3C is a schematic cross-sectional view (an X-Z cross section) along line IIIC-IIIC in FIG. 2A and FIG. 2B. In the specification, a first direction is taken as a Z-axis direction. One direction that crosses, e.g., is orthogonal to, the Z-axis direction is taken as a second direction. The second direction is an X-axis direction. One direction that crosses, e.g., is orthogonal to, the Z- and X-axis directions is taken as a third direction. The third direction is a Y-axis direction. In the specification, hatching is omitted from the X-Y cross section.

As shown in FIG. 1A to FIG. 3C, the semiconductor device 100a according to the first embodiment is nonvolatile memory including memory cells having a three-dimensional structure. The semiconductor device 100a includes a semiconductor substrate 1, the stacked body 2, first to fourth insulating bodies 31 to 34, and multiple columnar portions CL.

The stacked body 2 is provided on the semiconductor substrate 1. For example, an insulating film 2g is provided between the stacked body 2 and the semiconductor substrate 1. The stacked body 2 includes multiple conductive layers 21 and multiple insulating layers 22 stacked alternately along the Z-axis direction. The conductive layers 21 include, for example, tungsten (W). The insulating layers 22 include, for example, silicon oxide ($SiO_2$). The insulating layers 22 insulate the conductive layers 21 from each other. The number of stacks of the conductive layers 21 and the number of stacks of the insulating layers 22 are arbitrary.

The conductive layers 21 include at least one source-side selection gate SGS, multiple word lines WL, and at least one drain-side selection gate SGD. The source-side selection gate SGS is a gate electrode of a source-side selection transistor STS. The word lines WL are gate electrodes of memory cells MC. The drain-side selection gate SGD is a gate electrode of a drain-side selection transistor STD. The source-side selection gate SGS is provided in the lower region of the stacked body 2. The drain-side selection gate SGD is provided in the upper region of the stacked body 2. The lower region refers to the region of the stacked body 2 on the side proximal to the substrate 1; and the upper region refers to the region of the stacked body 2 on the side distal to the substrate 1. The word lines WL are provided between the source-side selection gate SGS and the drain-side selection gate SGD.

Among the multiple insulating layers 22, for example, the thickness in the Z-axis direction of the insulating layer 22 insulating the source-side selection gate SGS and the word line WL may be thicker than the thickness in the Z-axis direction of the insulating layer 22 insulating the word line WL and the word line WL. A cover insulating film 22a may be further provided on the insulating layer 22 of the uppermost layer most distal to the semiconductor substrate 1. The cover insulating film 22a includes, for example, silicon oxide.

The semiconductor device 100a includes the multiple memory cells MC connected in series between the drain-side selection transistor STD and the source-side selection transistor STS. The structure in which the drain-side selection transistor STD, the memory cells MC, and the source-side selection transistor STS are connected in series is called a "memory string" or a "NAND string." For example, the memory string is connected to a bit line BL via a contact Cb. The bit line BL is provided above the stacked body 2 and extends in the Y-axis direction.

As shown in FIG. 1B, the stacked body 2 includes a memory cell array 2m and, for example, staircase portions 2s provided at two ends in the X-axis direction of the stacked body 2. Multiple deep slits ST are provided from one staircase portion 2s of the stacked body 2 through the memory cell array 2m to the other staircase portion 2s. Multiple deep and short slits SST are provided at least in the memory cell array 2m. Multiple shallow slits SHE are provided in the memory cell array 2m.

As shown in FIG. 3A and FIG. 3B, the first and second insulating bodies 31 and 32 are provided respectively inside the deep slits ST. The first and second insulating bodies 31 and 32 each are provided inside the stacked body 2 along the Z-axis direction from the upper end of the stacked body 2 to the lower end of the stacked body 2. The first insulating body 31 extends in the X-axis direction; and the second insulating body 32 extends in the X-axis direction at a position different from the first insulating body 31 in the Y-axis direction. The first and second insulating bodies 31 and 32 each include, for example, silicon oxide. The stacked body 2 that is between the first insulating body 31 and the second insulating body 32 is called a block (BLOCK) and is included in, for example, the minimum unit of the data erase.

The third insulating bodies 33 are provided inside the deep and short slits SST. The third insulating bodies 33 are provided inside the stacked body 2 along the Z-axis direction from the upper end of the stacked body 2 to the lower end of the stacked body 2 between the first insulating body 31 and the second insulating body 32.

The fourth insulating body 34 is provided inside the shallow slit SHE. The fourth insulating body 34 is provided along the Z-axis direction from the upper end of the stacked body 2 partway through the stacked body 2. The fourth insulating body 34 includes multiple portions. The multiple portions extend in the X-axis direction and are separated from each other in the X-axis direction with the third insulating body 33 interposed. As shown in FIG. 3C, for example, in the cross section along line IIIC-IIIC, the fourth insulating body 34 contacts the third insulating body 33; but the conductive layers 21 and the insulating layers 22 each contact the columnar portions CL.

The fourth insulating body 34 that is provided partway through the stacked body 2 pierces the conductive layer 21 forming the drain-side selection gate SGD in the upper region of the stacked body 2. As shown in FIG. 1A and FIG. 1B, the conductive layers 21 that form the drain-side selection gates SGD are separated from each other, with the slit SHE interposed, at two Y-axis direction sides of the stacked body 2 between the first insulating body 31 and the second insulating body 32 forming one block. In the specification, the region from the deep slit ST to the shallow slit SHE and the deep and short slits SST is called a "finger." Because the drain-side selection gate SGD is formed for each finger by being subdivided by the slit SHE, one finger inside the block can be set to the selected state by the drain-side selection gate SGD when programming and reading data.

The columnar portions CL are provided respectively inside memory holes MH provided inside the stacked body 2. The memory holes MH are provided inside the stacked body 2 along the Z-axis direction from the upper end of the stacked body 2 to the lower end of the stacked body 2. The columnar portions CL each include a semiconductor layer. The channels of the drain-side selection transistor STD, the memory cells MC, and the source-side selection transistor STS are obtained inside the semiconductor layer. One of the columnar portions CL (a first columnar portion CL1) is provided between the first insulating body 31 and the fourth insulating body 34; and one other columnar portion (a second columnar portion CL2) is provided between the second insulating body 32 and the fourth insulating body 34 (FIG. 2A and FIG. 3A). One of the multiple columnar portions CL selected from each finger is connected to one common bit line BL extending in the Y-axis direction via the contact Cb. For example, one columnar portion CL (the first columnar portion CL1) selected from the finger between the first insulating body 31 and the fourth insulating body 34 and one columnar portion CL (the second columnar portion CL2) selected from the finger between the second insulating body 32 and the fourth insulating body 34 are connected to one common bit line BL extending in the Y-axis direction.

According to such a semiconductor device 100a, for example, advantages such as those recited below can be obtained.

(1) A stacked body 2 having high patterning precision is obtained.

(2) The increase of the resistance value of the conductive layer 21 is suppressed.

Figure 4A:
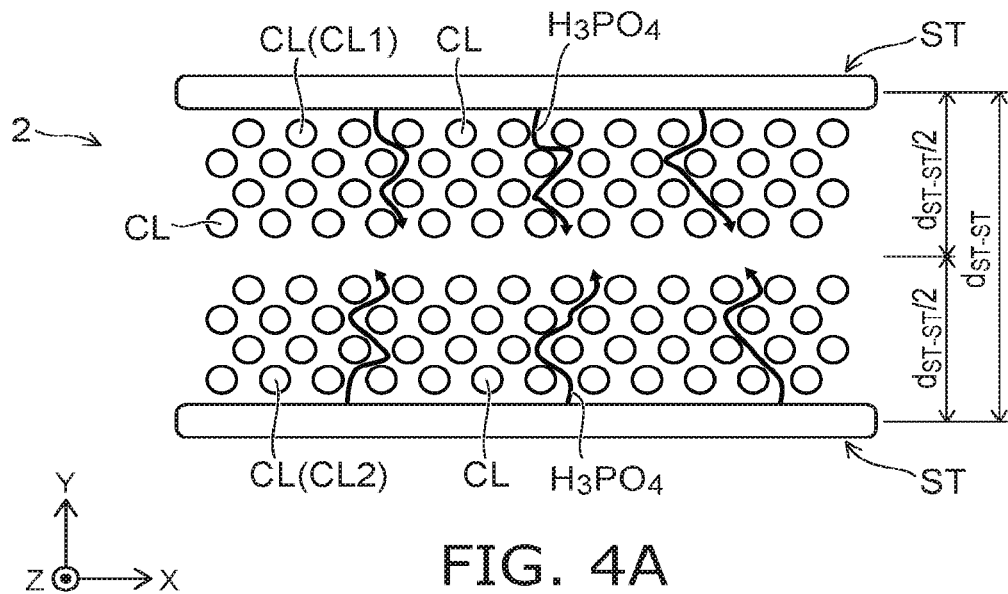
FIG. 4A is a schematic cross-sectional view illustrating a state in the manufacture of a semiconductor device according to a first reference example.
Figure 4B:
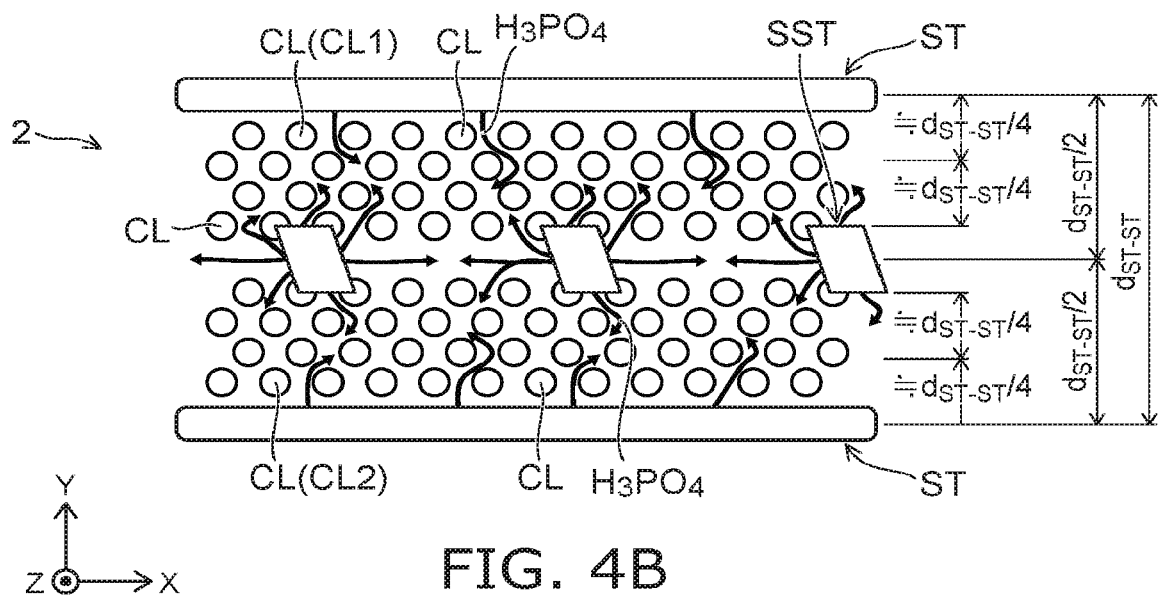
FIG. 4B is a schematic cross-sectional view illustrating a state in the manufacture of the semiconductor device according to the first embodiment.
Figure 5:
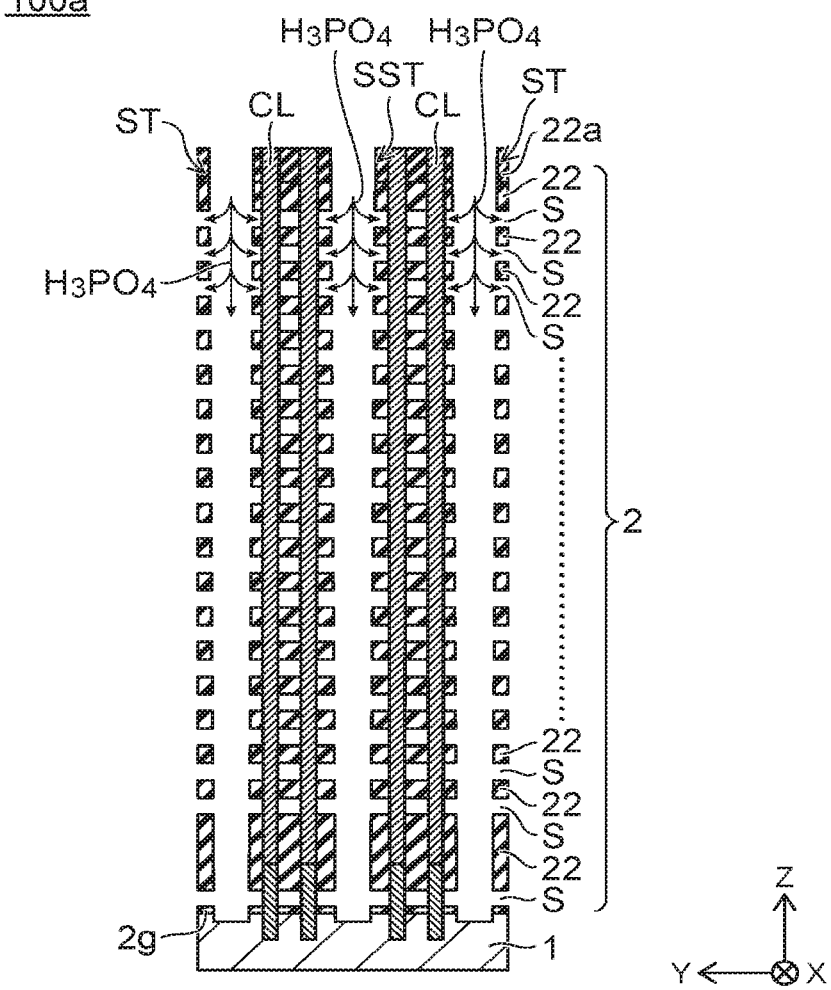
FIG. 5 is a schematic cross-sectional view illustrating a state in the manufacture of the semiconductor device according to the first embodiment.

FIG. 4A is a schematic cross-sectional view (an X-Y cross section) illustrating a state in the manufacture of a semiconductor device according to a first reference example (FIRST REFERENCE EXAMPLE). FIG. 4B is a schematic cross-sectional view (an X-Y cross section) illustrating a state in the manufacture of the semiconductor device according to the first embodiment. FIG. 5 is a schematic cross-sectional view (a Y-Z cross section) illustrating a state in the manufacture of the semiconductor device according to the first embodiment. For example, FIG. 4A and FIG. 4B each correspond to the cross section shown in FIG. 2B. For example, FIG. 5 corresponds to the cross section shown in FIG. 3B. FIG. 4A to FIG. 5 each show removal processes of sacrificial films.

Regarding (1):

Sacrificial films (not illustrated) are provided between the insulating layers 22 before forming the conductive layers 21. The insulating layers 22 include silicon oxide; and the sacrificial films include, for example, silicon nitride. The first and second insulating bodies 31 and 32 have not yet been filled respectively into the deep slits ST. At the side wall of the deep slit ST, the insulating layers 22 (silicon oxide) and the sacrificial films (silicon nitride) are in an alternately-exposed state along the Z-axis direction. Then, an etchant is caused to enter from the deep slits ST; and the sacrificial films (silicon nitride) are selectively removed using the insulating layers 22 (silicon oxide) as a mask. For example, a heated etchant including phosphoric acid ($H_3PO_4$) is used in the selective removal.

As shown in FIG. 4A, the stacked body 2 of the semiconductor device 100ra according to the first reference example does not include the deep and short slits SST. The theoretical distance in the Y-axis direction of the penetration path of the etchant (in FIG. 4A, illustrated as "$H_3PO_4$" for convenience) for removing of the sacrificial films (the distance in the Y-axis direction that the etchant erodes the sacrificial films when the columnar portions CL are considered not to exist) is one-half of a distance $d_{st-st}$ between the deep slit ST-deep slit ST.

In the semiconductor device 100ra, the time that is necessary to remove the sacrificial films is long. In the case where the removal time of the sacrificial films is long, circumstances such as circumstances A and B recited below may be caused.

A. For example, in the upper region of the stacked body 2, the time of exposure to active phosphoric acid is long; and excessive etching of the insulating layers 22 occurs.

B. In the lower region of the stacked body 2, precipitation of silicon occurs; and the silicon crystal precipitates.

Thus, in the semiconductor device 100ra, the stacked body 2 may be damaged; precipitation of the silicon crystal may occur; and it is difficult to finish the stacked body 2 with the designed dimensions.

Conversely, the stacked body 2 of the semiconductor device 100a further includes the deep and short slits SST as shown in FIG. 4B and FIG. 5. The deep and short slits SST are provided at positions substantially halfway between the deep slit ST and the deep slit ST as shown in FIG. 4B. Therefore, the theoretical distance in the Y-axis direction of the penetration path of the etchant for removing of the sacrificial films is not more than about one-fourth of the distance $d_{st-st}$ between the deep slit ST-deep slit ST.

Therefore, according to the semiconductor device 100a, the time to remove the sacrificial films can be short compared to that of the semiconductor device 100ra. Because the time to remove the sacrificial films can be short in the semiconductor device 100a, the circumstances A and B recited above can be suppressed compared to the semiconductor device 100ra. Accordingly, in the semiconductor device 100a, for example, compared to the semiconductor device 100ra, the damage of the stacked body 2 can be suppressed; and the precipitation of the silicon crystal also can be suppressed. According to such a semiconductor device 100a, for example, advantages can be obtained in that the stacked body 2 is easily finished with the designed dimensions; and the stacked body 2 having high patterning precision can be formed.

Regarding (2):

As shown in FIG. 5, a space S is obtained inside the stacked body 2 where the sacrificial films are removed. The space S is obtained between the insulating layer 22 and the insulating layer 22. The conductive layer 21 is formed inside the space S. In the semiconductor device 100a, the conductive layer 21 is formed by depositing a metal (a conductor) in the space S by diffusing a metal precursor from both the deep slit ST and the deep and short slit SST. In the case where tungsten is used as the metal, for example, the conductive layer 21 is formed by CVD (Chemical Vapor Deposition) in which tungsten fluoride is used as the metal precursor.

The film thickness of the metal (the conductor) depositable inside the space S is limited by the distance between the columnar portion CL and the columnar portion CL. This is because the metal precursor cannot diffuse further inward inside the space S once the metal deposited between the columnar portion CL and the columnar portion CL has been pinched off. The deposition of the conductive layer 21 ends when pinch-off occurs. The film thickness of the conductive layer 21 inside the space S is not more than about one-half of the distance between the columnar portion CL and the columnar portion CL where the pinch-off occurred.

In the semiconductor device 100ra according to the first reference example, in the case where, for example, the metal is pinched off at the second columnar portion CL from the deep slit ST in the Y-axis direction, the thickness of the conductive layer 21 is thin at the vicinity of the third and fourth columnar portions CL from the deep slit ST; and the resistance value of the conductive layer 21 increases.

Conversely, in the semiconductor device 100a, the metal precursor can be diffused into the space S from both the deep slit ST and the deep and short slit SST. For example, in the example shown in FIG. 4B, the columnar portions CL are arranged in a staggered configuration in the Y-axis direction.

The deep and short slit SST is provided at the vicinity of the fourth columnar portion CL from the deep slit ST. Therefore, the metal precursor can be diffused into the space S at the vicinity of the third and fourth columnar portions CL along the Y-axis direction from the deep and short slit SST before, for example, the deposited metal is pinched off at the second columnar portion CL vicinity along the Y-axis direction from the deep slit ST.

According to such a semiconductor device 100a, the thickness of the conductive layer 21 at the center vicinity between the deep slit ST and the deep slit ST can be thick compared to that of the semiconductor device 100ra. Accordingly, advantages can be obtained in that the increase of the resistance value of the conductive layer 21 of the semiconductor device 100a can be suppressed compared to that of the conductive layer 21 of the semiconductor device 100ra; and a low-resistance conductive layer 21 can be formed.

First Embodiment: Method for Manufacturing

FIG. 6A to FIG. 8B are schematic cross-sectional views in order of the processes (Y-Z cross sections) illustrating a method for manufacturing the semiconductor device according to the first embodiment. For example, the cross sections shown in FIG. 6A to FIG. 8B correspond to the cross section shown in FIG. 3B. In FIG. 6A to FIG. 8B, for example, the semiconductor device 100a is shown as being more simplified than in FIG. 3B. For example, the insulating film 2g, the cover insulating film 22a, etc., are not illustrated in FIG. 6A to FIG. 8B.

Figure 6A:
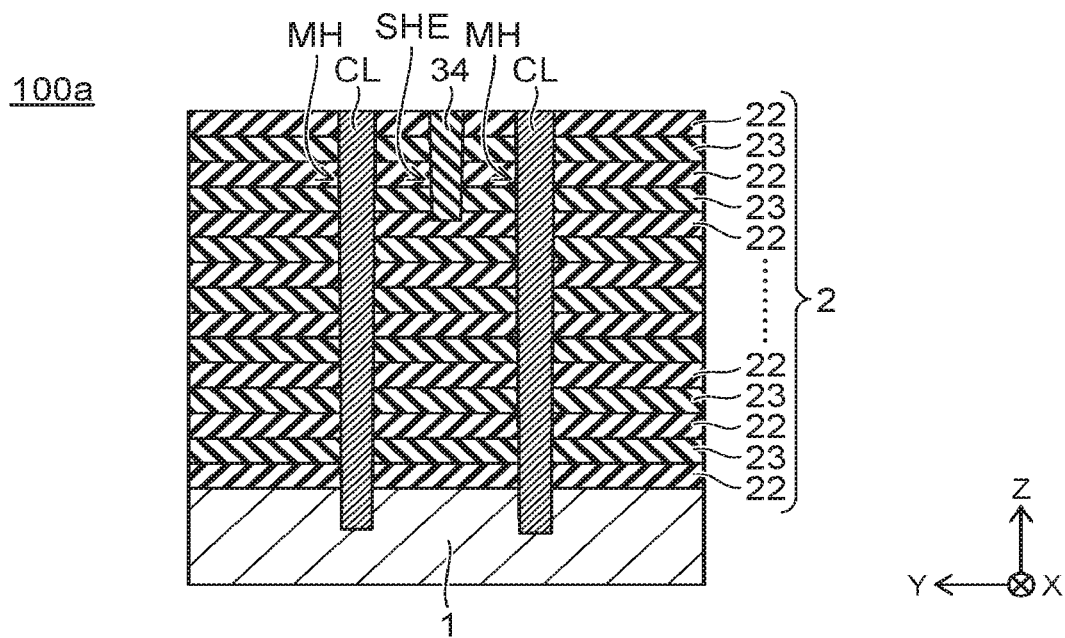
FIG. 6A and FIG. 6B are schematic cross-sectional views in order of the processes illustrating a method for manufacturing the semiconductor device according to the first embodiment.

As shown in FIG. 6A, the stacked body 2 is formed on the semiconductor substrate 1. The stacked body 2 is formed by alternately stacking the insulating layers 22 and sacrificial films 23 along the Z-axis direction on the semiconductor substrate 1. Then, the memory holes MH are formed inside the stacked body 2 along the Z-axis direction from the upper end of the stacked body 2 to the lower end of the stacked body 2. In the embodiment, the memory holes MH reach the interior of the semiconductor substrate 1. Then, the columnar portions CL are formed inside the memory holes MH. Then, the shallow slits SHE are formed inside the stacked body 2 along the Z-axis direction from the upper end of the stacked body 2 partway through the stacked body 2. For example, the lower end of the shallow slit SHE is positioned inside the stacked body 2 partway through the insulating layer 22 directly under the sacrificial film 23 corresponding to the conductive layer of the lowermost layer of the conductive layers of the multiple layers forming the drain-side selection gate SGD. Then, the fourth insulating bodies 34 are formed inside the shallow slits SHE.

Figure 6B:
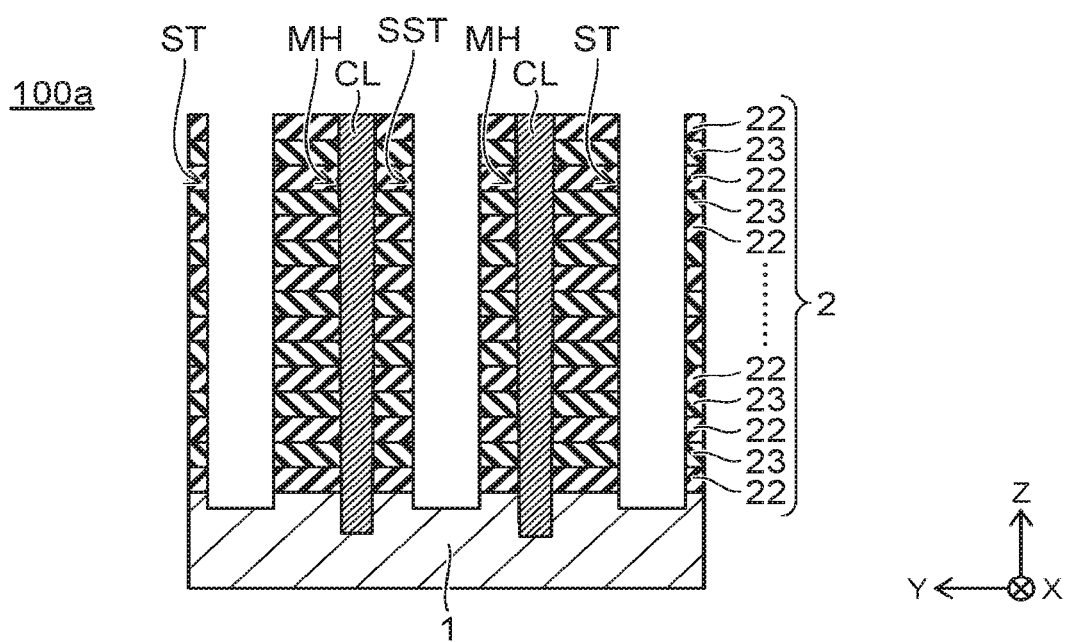

Then, as shown in FIG. 6B, the deep slits ST and the deep and short slits SST are formed inside the stacked body 2 along the Z-axis direction from the upper end of the stacked body 2 to the lower end of the stacked body 2. In the embodiment, the deep slits ST and the deep and short slits SST each reach the interior of the semiconductor substrate 1. For example, the deep and short slits SST are formed inside the stacked body 2 and pierce the fourth insulating bodies 34. In the Y-Z cross section shown in FIG. 6B, the portion of the fourth insulating body 34 overlapping the deep and short slit SST is shown in the state of being removed by forming the deep and short slit SST. The deep slits ST and the deep and short slits SST may be formed simultaneously or may be formed separately.

Figure 7A:
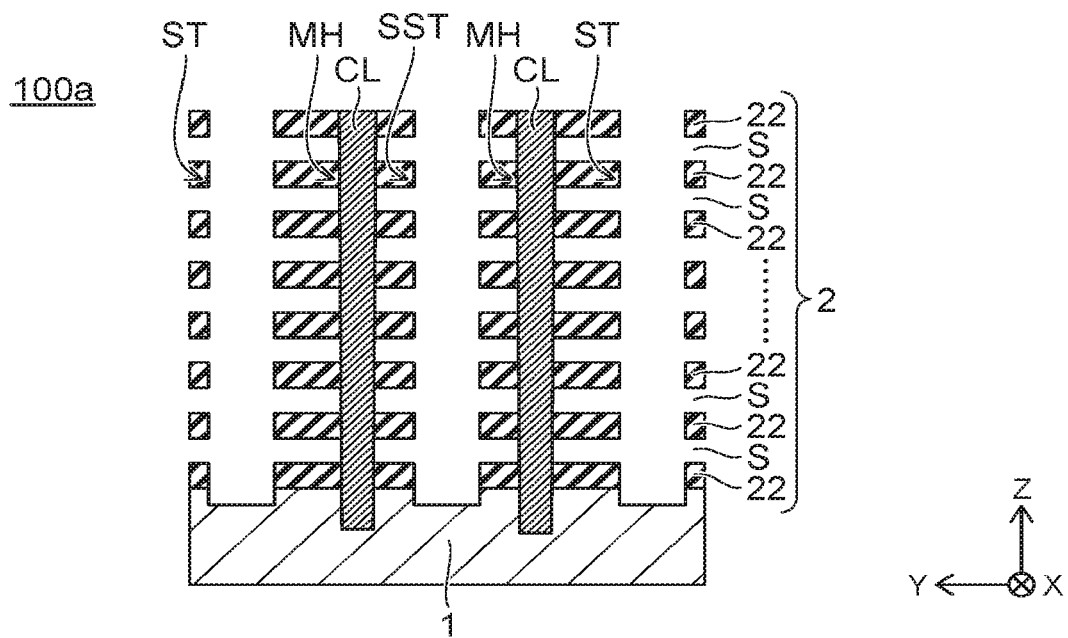
FIG. 7A and FIG. 7B are schematic cross-sectional views in order of the processes illustrating a method for manufacturing the semiconductor device according to the first embodiment.

Then, as shown in FIG. 7A, the sacrificial films 23 are removed via the deep slits ST and the deep and short slits SST. Thereby, the space S is formed between the insulating layers 22. The insulating layers 22 include, for example, silicon oxide; and the sacrificial films 23 include, for example, silicon nitride. For example, wet etching that uses a heated etchant including phosphoric acid is used to remove the sacrificial films 23.

Figure 7B:
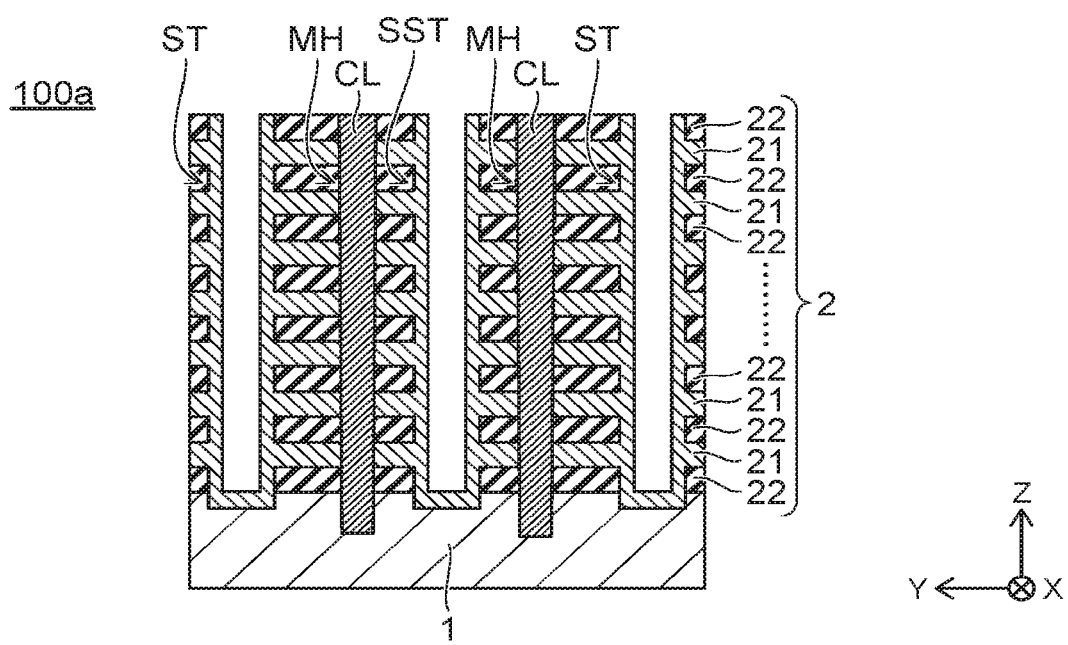

Continuing as shown in FIG. 7B, the interior of the space S is filled with a metal (a conductor) via the deep slits ST and the deep and short slits SST. Thereby, the conductive layer 21 is formed between the insulating layers 22. The metal that is included in the conductive layer 21 is, for example, tungsten. CVD that uses tungsten fluoride as a metal precursor is used to form the conductive layer 21. Although not particularly illustrated, a blocking insulating film and a barrier film may be formed inside the space S before forming the conductive layer 21. The blocking insulating film is, for example, a silicon oxide film or a metal oxide film. For example, in the case where the metal is tungsten, for example, a stacked structure film of titanium nitride and titanium is selected as the barrier film.

Figure 8A:
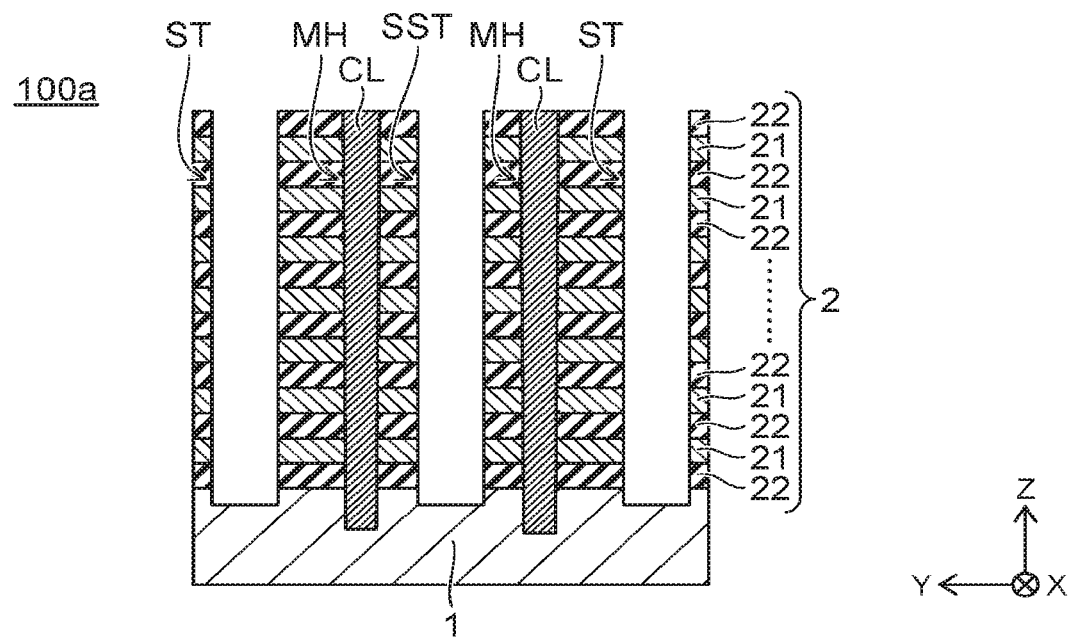
FIG. 8A and FIG. 8B are schematic cross-sectional views in order of the processes illustrating a method for manufacturing the semiconductor device according to the first embodiment.

Then, as shown in FIG. 8A, the conductive layer 21 that is on the side walls and the bottom surfaces of the deep slits ST and the deep and short slits SST is removed. For example, RIE (Reactive Ion Etching) is used to remove the conductive layer 21.

Figure 8B:
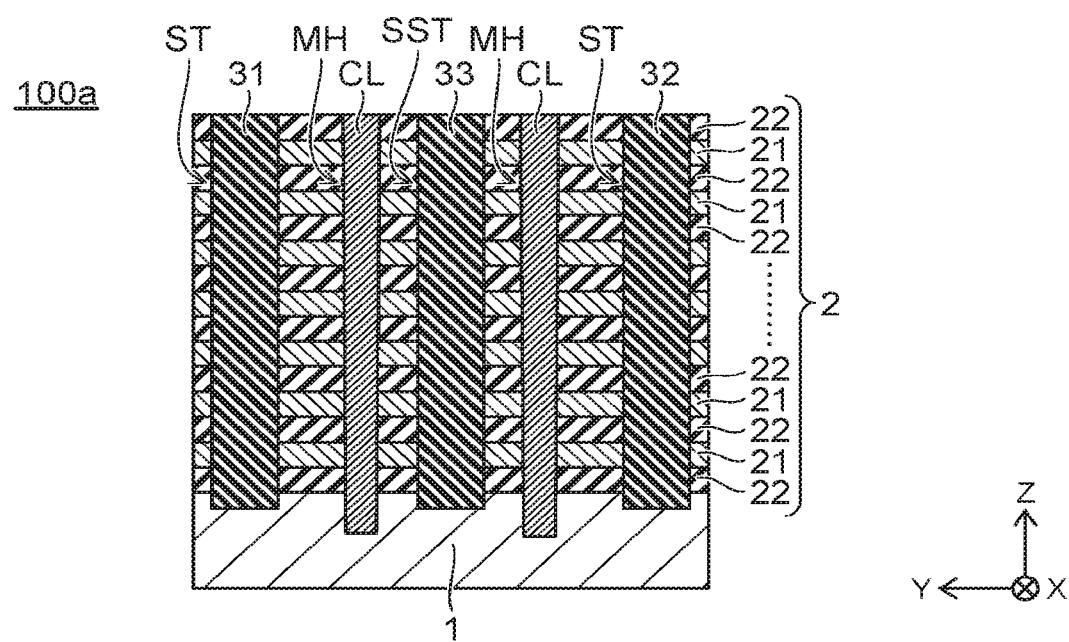

Continuing as shown in FIG. 8B, the interiors of the deep slits ST and the deep and short slits SST are filled with the first to third insulating bodies 31 to 33. The first to third insulating bodies 31 to 33 are, for example, silicon oxide.

Subsequently, although not particularly illustrated, the semiconductor device 100a according to the first embodiment can be manufactured by forming the bit lines BL, etc., according to well-known methods.

First Embodiment: Modification of Manufacturing Method

FIG. 9A to FIG. 9D are schematic cross-sectional views in order of the processes, illustrating a modification of the method for manufacturing the semiconductor device according to the first embodiment.

Figure 9A:
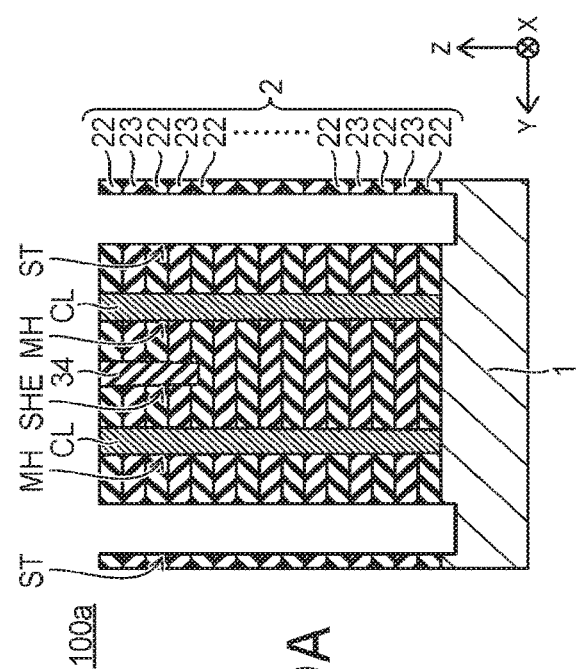
FIG. 9A to FIG. 9D are schematic cross-sectional views in order of the processes, illustrating a variation of the method for manufacturing the semiconductor device according to the first embodiment.

As shown in FIG. 9A, the columnar portions CL, the shallow slits SHE, and the fourth insulating bodies 34 are formed in the stacked body 2. The stacked body 2 is in a state in which the sacrificial films 23 are included. The deep slits ST are formed inside such a stacked body 2 along the Z-axis direction from the upper end of the stacked body 2 to the lower end of the stacked body 2.

Figure 9B:
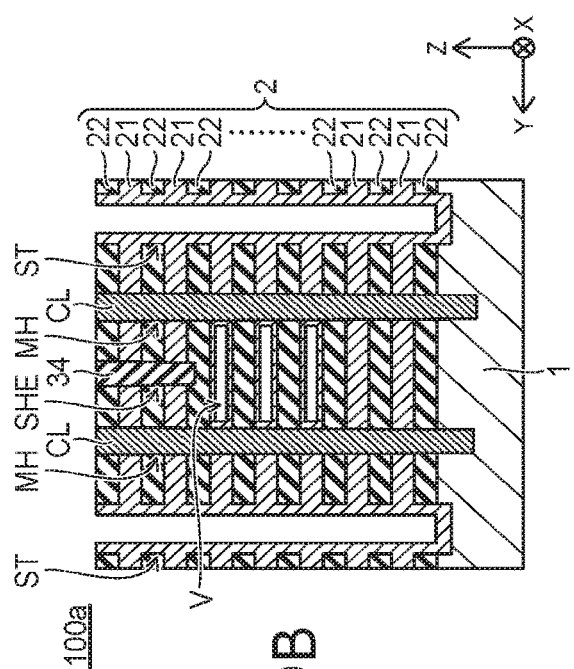

Then, as shown in FIG. 9B, the sacrificial films 23 are removed via the deep slits ST. Then, the conductive layer 21 is formed between the insulating layers 22 by filling the interior of the space S (not illustrated in FIG. 9B, referring to FIG. 7A) with a metal (a conductor) via the deep slits ST. Here, because the metal of the conductive layer 21 is filled from the deep slits ST, the metal may be pinched off; and, for example, voids V may occur between two deep slits ST.

Figure 9C:
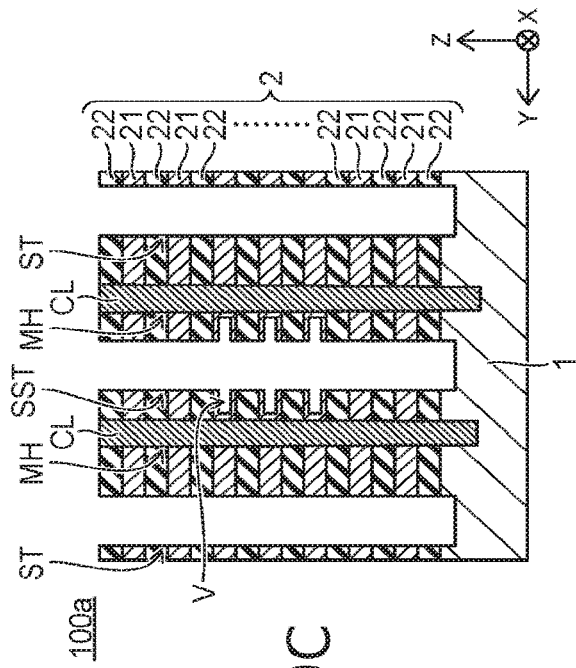

Continuing as shown in FIG. 9C, the conductive layer 21 that is on the side walls and the bottom surfaces of the deep slits ST is removed. Then, the multiple deep and short slits SST are formed inside the stacked body 2 along the Z-axis direction from the upper end of the stacked body 2 to the lower end of the stacked body 2. The deep and short slits SST contact the voids V.

Figure 9D:
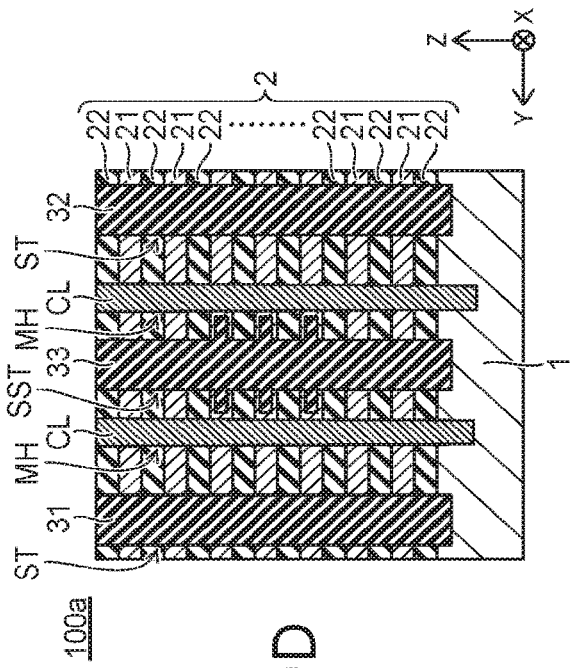

Then, as shown in FIG. 9D, the interiors of the deep slits ST, the deep and short slits SST, and the voids V are filled with the first to third insulating bodies 31 to 33.

Figure 10:
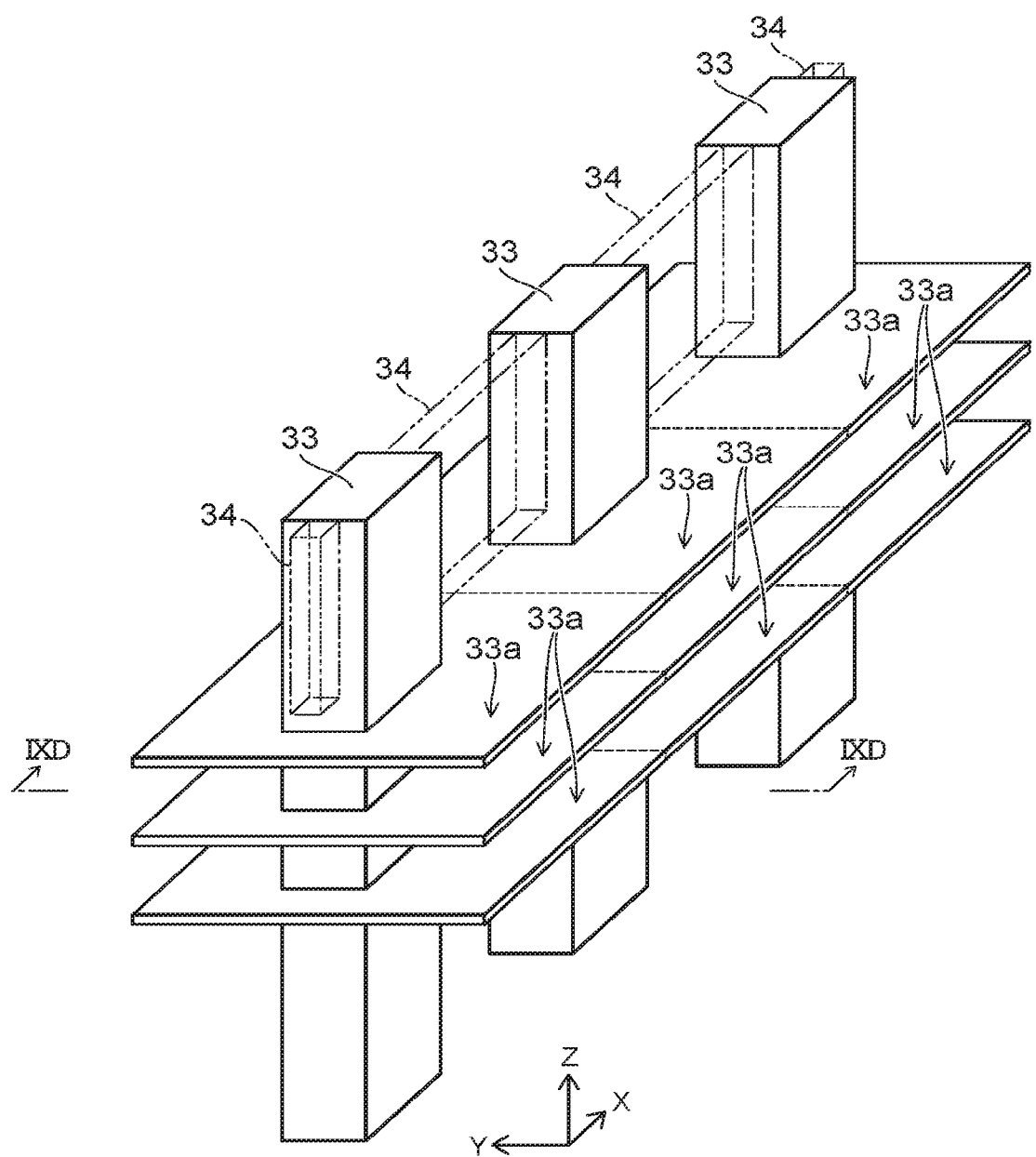
FIG. 10 is a schematic perspective view illustrating third insulating bodies and the fourth insulating bodies.

FIG. 10 is a schematic perspective view illustrating the third insulating bodies 33 and the fourth insulating bodies 34.

As shown in FIG. 10, the multiple third insulating bodies 33 fill the deep and short slits SST and the voids V. For example, the third insulating bodies 33 that are formed by the manufacturing method according to the modification each include a flange part 33a spreading in a flange configuration along the X-Y plane.

The flange parts 33a each spread in a flange configuration along the X-Y plane respectively from the third insulating bodies 33 inside the deep and short slits SST. In the X-Y plane, for example, the flange parts 33a that spread in the X-axis direction from the third insulating bodies 33 inside the deep and short slits SST contact each other. The cross section shown in FIG. 9D described above is along line IXD-IXD shown in FIG. 10.

Thus, it is also possible to form the deep and short slits SST after the conductive layer 21 is formed. It is also possible to fill the interiors of the deep and short slits SST with, for example, the third insulating bodies 33.

According to such a modification of the manufacturing method, for example, even in the case where the voids V occur inside the stacked body 2, the interiors of the voids V can be filled with the third insulating bodies 33.

Accordingly, according to the semiconductor device 100a according to the first embodiment, the undesirable circumstance of the voids V remaining inside the stacked body 2 can be suppressed; and, for example, the collapse of the stacked body 2 caused by the remaining voids V also can be suppressed.

First Embodiment: First Modification

Figure 11:
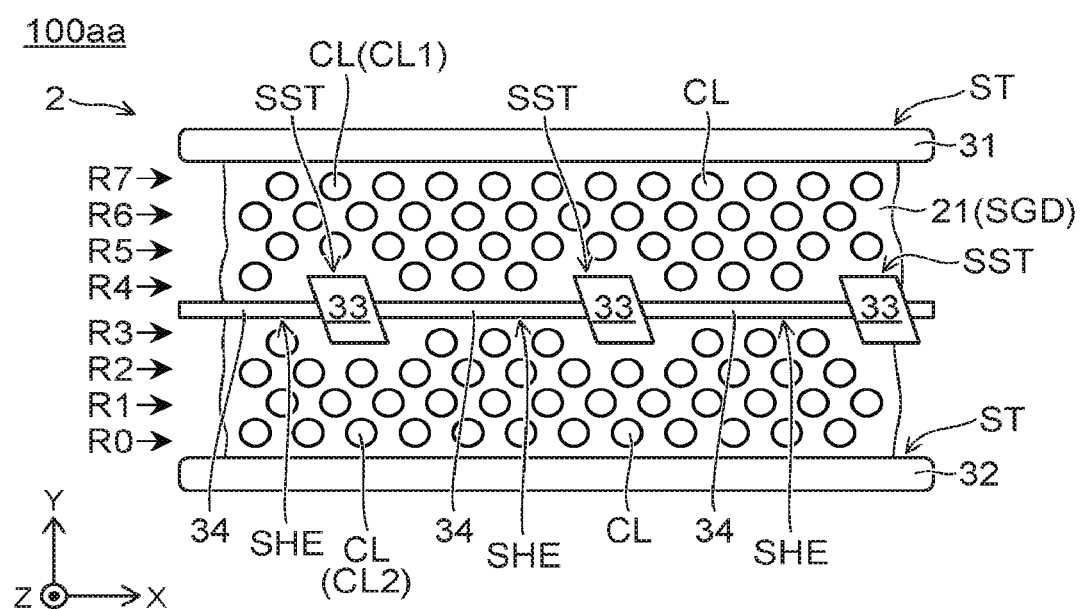
FIG. 11 is a schematic cross-sectional view illustrating a semiconductor device according to a first variation of the first embodiment.

FIG. 11 is a schematic cross-sectional view (an X-Y cross section) illustrating a semiconductor device 100aa according to a first modification of the first embodiment. For example, the cross section shown in FIG. 11 corresponds to the cross section shown in FIG. 2A.

In the X-Y cross section as shown in FIG. 11, the columnar portions CL that overlap the deep and short slits SST may be omitted. The structure of the columnar portion CL is different from the structure of the stacked body 2. For example, the stacked body 2 has a structure in which silicon oxide and silicon nitride are repeatedly stacked along the Z-axis direction. Conversely, for example, the columnar portion CL has a structure in which silicon oxide, silicon nitride, and recrystallized silicon are continuous along the Z-axis direction. Therefore, in the case where the deep and short slits SST overlap the columnar portions CL, it may be difficult to etch the stacked body 2 in the process of forming the deep and short slits SST.

For example, the difficulty of the etching of such a stacked body 2 can be eliminated by setting the deep and short slits SST not to overlap the columnar portions CL. In the semiconductor device 100aa, the third insulating bodies 33 do not contact the columnar portions CL.

Rows R0 to R7 are included between the first insulating body 31 and the second insulating body 32 in the stacked body 2 of the semiconductor device 100aa. The rows R0 to R7 each include multiple columnar portions CL along the X-axis direction. The shallow slit SHE and the deep and short slits SST, that is, the third and fourth insulating bodies 33 and 34, are provided between the row R3 and the row R4. In the rows R3 and R4, the columnar portions CL are omitted from the locations where the deep and short slits SST are formed. For example, the rows R0 to R2 and R5 to R7 each include twelve columnar portions CL in the area of the portion of the stacked body 2 shown in FIG. 11. Conversely, the number of columnar portions CL included in each of the rows R3 and R4 is seven.

Thus, for the rows R3 and R4 adjacent to the third and fourth insulating bodies 33 and 34, the number of the columnar portions CL included in each of the rows R3 and R4 is set to be lower than the number included in each of the rows R0 to R2 and R5 to R7 distal to the shallow slit SHE and the deep and short slits SST. For example, the row R4 that is adjacent to the third and fourth insulating bodies 33 and 34 is taken as a first row; and the row R5 that is separated from the third and fourth insulating bodies 33 and 34 with the row R4 (the first row) interposed is taken as a second row. In such a case, the number of the columnar portions CL included in the row R4 (the first row) may be lower than the number of the columnar portions CL included in the row R5 (the second row). Thereby, the semiconductor device 100aa can be obtained in which the third insulating bodies 33 do not overlap the columnar portions CL. Further, the rows R3 and R4 may include the columnar portions CL and the third insulating bodies 33 in the X-axis direction in which the rows R3 and R4 extend.

First Embodiment: Second Modification

Figure 12A:
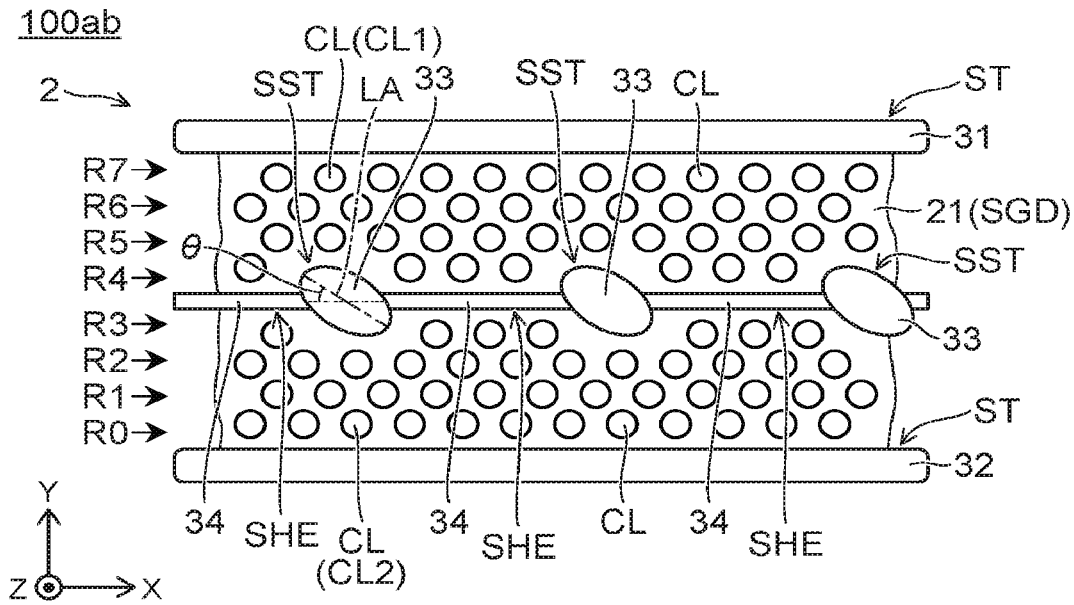
FIG. 12A is a schematic cross-sectional view illustrating a semiconductor device according to a second variation of the first embodiment.
Figure 12B:
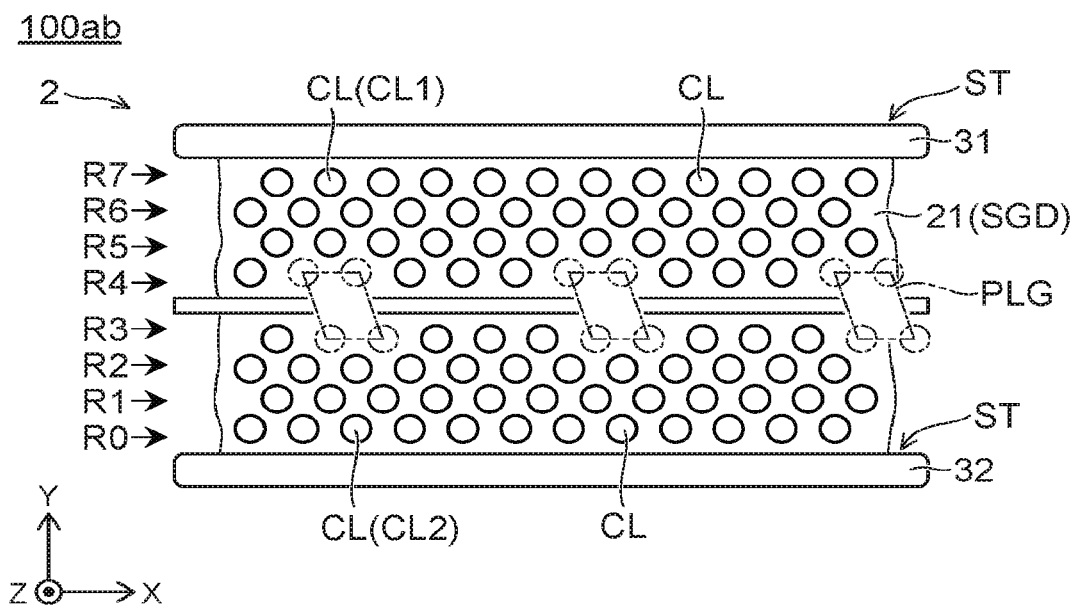
FIG. 12B is a schematic cross-sectional view showing the omitted columnar portions CL.

FIG. 12A is a schematic cross-sectional view (an X-Y cross section) illustrating a semiconductor device 100ab according to a second modification of the first embodiment. FIG. 12B is a schematic cross-sectional view (an X-Y cross section) showing the omitted columnar portions CL. For example, the cross sections shown in FIG. 12A and FIG. 12B correspond to the cross section shown in FIG. 2A.

As shown in FIG. 12A, the X-Y cross section configurations of the multiple third insulating bodies 33 each may be an ellipse.

In the semiconductor device 100ab as shown in FIG. 12B, the columnar portions CL are arranged in a staggered configuration inside the stacked body 2. In the case where the columnar portions CL are arranged in a staggered configuration inside the stacked body 2, the columnar portions CL are omitted at a constant period along the X-axis direction from each of the rows R3 and R4. For example, in the semiconductor device 100ab, two of the columnar portions CL are omitted; and three remain. This pattern is repeated along the X-axis direction. A virtual parallelogram PLG is obtained in the X-Y cross section by connecting the two columnar portions CL omitted from the row R3 and the two columnar portions CL omitted from the row R4 with virtual lines. For example, the configuration of the X-Y cross section of the deep and short slit SST is set to be a configuration corresponding to the virtual parallelogram PLG.

It is difficult to pattern the deep and short slit SST so that the X-Y cross section configuration is a parallelogram. Therefore, for example, the X-Y cross section configuration of the deep and short slit SST is set to be an ellipse. Thereby, the patternability of the deep and short slit SST can be improved compared to the case where the X-Y cross section configuration is the parallelogram PLG. Unlike a parallelogram, an ellipse has no corners. Therefore, the patternability of the ellipse is good compared to the parallelogram PLG which has corners.

For example, in the case where the ellipse is designed based on the virtual parallelogram PLG, a major axis LA of the ellipse is tilted an angle θ from the X-axis direction in the X-Y cross section (FIG. 12A). For example, the X-axis direction matches the direction in which the fourth insulating body 34 extends. In the semiconductor device 100ab, the major axis LA of the ellipse which is the X-Y cross section configuration of the third insulating body 33 is tilted some angle θ from the direction in which the fourth insulating body 34 extends. In the X-Y cross section, the angle θ may have various values according to the pattern of the columnar portions CL.

According to such a semiconductor device 100ab, an advantage can be obtained in that the patternability of the deep and short slit SST can be improved. In the X-Y cross section as shown in the semiconductor device 100ab, the major axis LA of the ellipse of the third insulating body 33 may be tilted at some angle θ from the direction in which the fourth insulating body 34 extends.

First Embodiment: Third Modification

Figure 13:
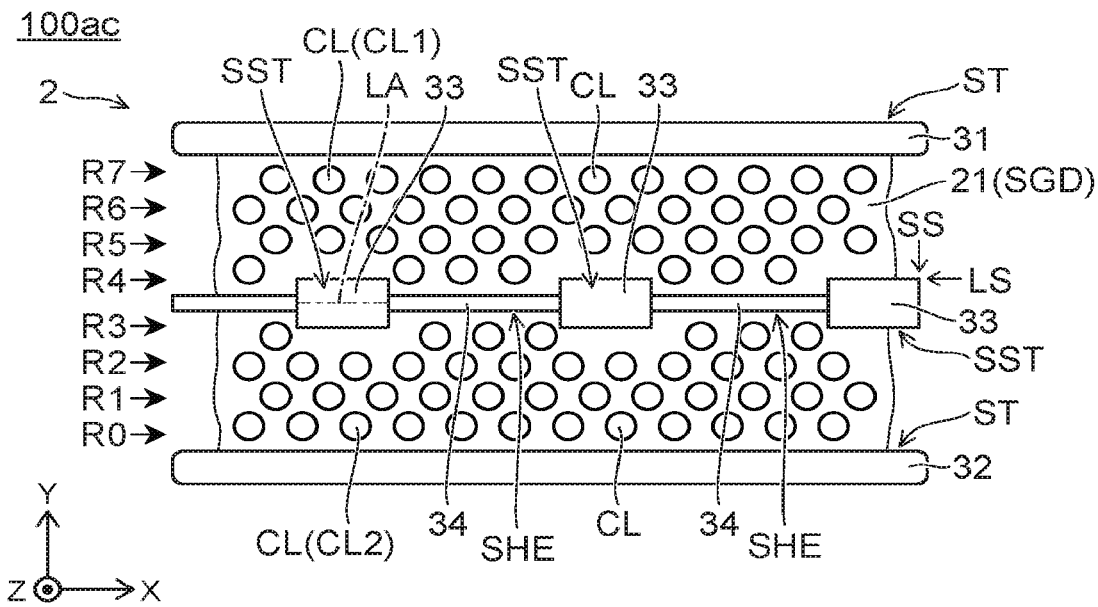
FIG. 13 is a schematic cross-sectional view illustrating a semiconductor device according to a third variation of the first embodiment.

FIG. 13 is a schematic cross-sectional view (an X-Y cross section) illustrating a semiconductor device 100ac according to a third modification of the first embodiment. For example, the cross section shown in FIG. 13 corresponds to the cross section shown in FIG. 2A.

As shown in FIG. 13, the X-Y cross section configuration of the third insulating body 33 may be a rectangle. For example, the rectangle has a short side SS and a long side LS. The direction in which the long side LS extends may be the X-axis direction and may substantially match, for example, the direction in which the fourth insulating body 34 extends. In the case where the direction in which the long side LS extends substantially matches the direction in which the fourth insulating body 34 extends, for example, the part where the deep and short slit SST and the stacked body 2 contact along the X-axis direction can be increased while suppressing the enlargement of the stacked body 2 in the Y-axis direction. Therefore, in the process of removing the sacrificial films 23, more of the etchant can be supplied to the sacrificial films 23. Also, in the process of forming the conductive layer 21, more of the metal precursor can be supplied to the interior of the space S. Accordingly, the occurrence of the voids V in the conductive layer 21 can be suppressed more effectively.

According to such a semiconductor device 100ab, advantages can be obtained in that the voids V do not occur easily in the conductive layer 21; and a low-resistance conductive layer 21 is obtained.

First Embodiment: Fourth Modification

Figure 14:
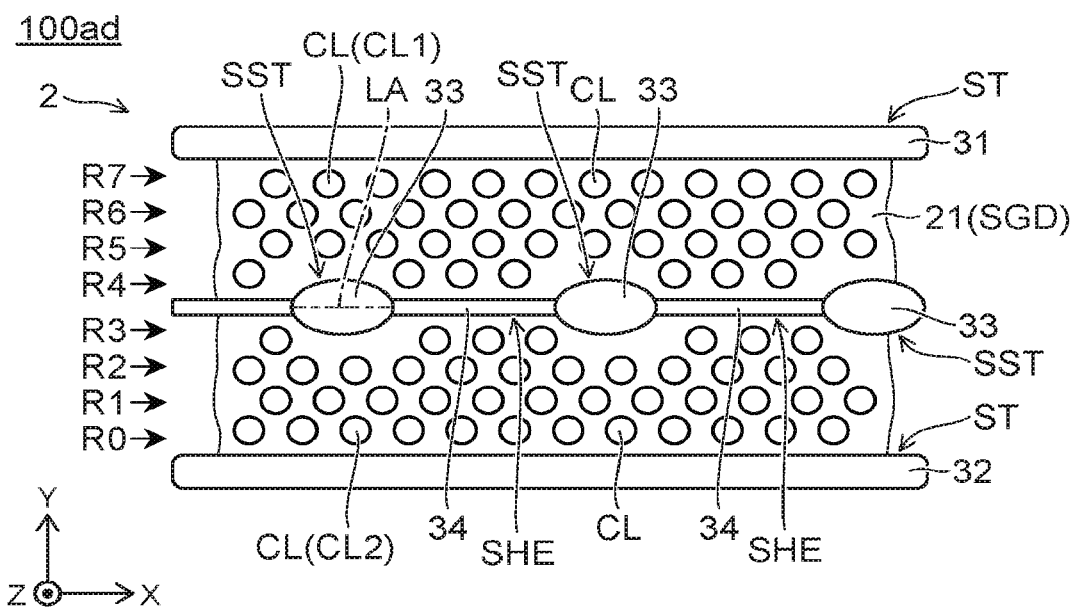
FIG. 14 is a schematic cross-sectional view illustrating a semiconductor device according to a fourth variation of the first embodiment.

FIG. 14 is a schematic cross-sectional view (an X-Y cross section) illustrating a semiconductor device 100ad according to a fourth modification of the first embodiment. For example, the cross section shown in FIG. 14 corresponds to the cross section shown in FIG. 2A.

As shown in FIG. 14, in the case where the X-Y cross section configuration of the third insulating body 33 is an ellipse, the major axis LA of the ellipse may be the X-axis direction and may substantially match, for example, the direction in which the fourth insulating body 34 extends.

According to such a semiconductor device 100ad, in addition to the advantage obtained from the semiconductor device 100ac, for example, the advantage can be further obtained in that the patternability of the deep and short slit SST can be improved.

First Embodiment: Fifth Modification

Figure 15:
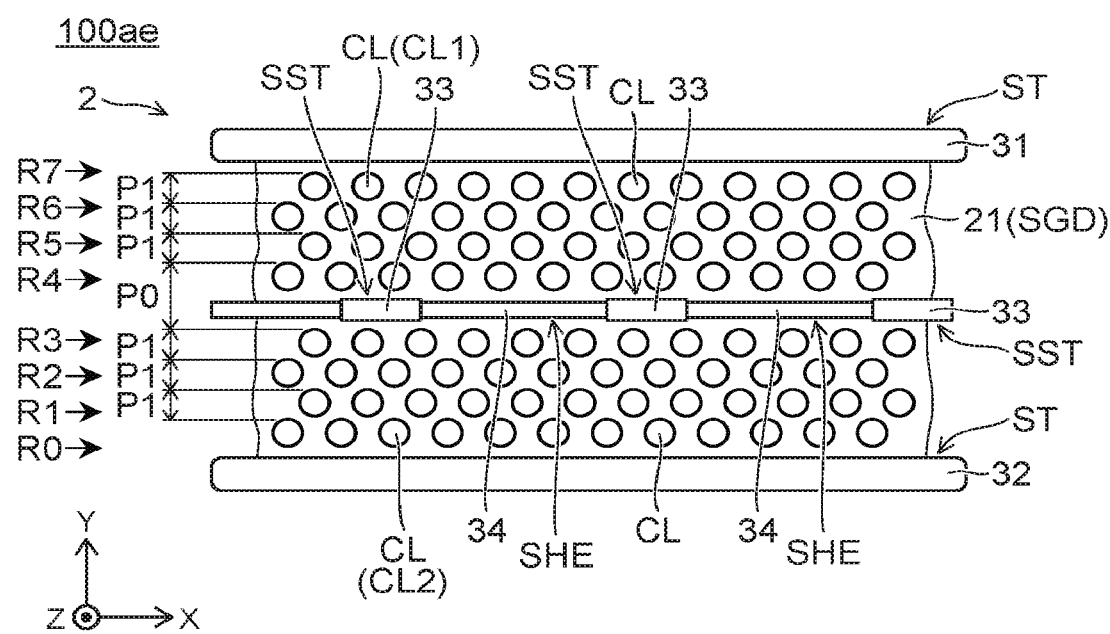
FIG. 15 is a schematic cross-sectional view illustrating a semiconductor device according to a fifth variation of the first embodiment.

FIG. 15 is a schematic cross-sectional view (an X-Y cross section) illustrating a semiconductor device 100ae according to a fifth modification of the first embodiment. For example, the cross section shown in FIG. 15 corresponds to the cross section shown in FIG. 2A.

As shown in FIG. 15, the multiple third insulating bodies also can be provided without contacting the columnar portions CL in the X-Y cross section, even without omitting the columnar portions CL. For example, the pitch between the row R3 and the row R4 is taken as "P0." The pitch of the other rows is taken as "P1." For example, the relationship between the pitch P0 and the pitch P1 is set to be $P0 > P1$.

Thus, the number of the columnar portions CL included in each of the rows R0 to R7 can be the same between rows. For example, the row R4 that is adjacent to the third and fourth insulating bodies 33 and 34 is taken as a first row; and the row R5 that is separated from the third and fourth insulating bodies 33 and 34 with the row R4 (the first row) interposed is taken as a second row. In such a case, the number of the columnar portions CL included in the row R4 (the first row) may be equal to the number of the columnar portions CL included in the row R5 (the second row).

For example, the pitch P0 is set to be larger than the pitch P1; and the third and fourth insulating bodies 33 and 34 are disposed between the row R3 and the row R4. Thereby, the semiconductor device 100ae can be obtained in which the third insulating bodies 33 do not contact the columnar portions CL while the number of the columnar portions CL included in each of the rows R0 to R7 is the same between rows.

In the specification, the pitches P0 and P1 are taken to be the distance in the Y-axis direction orthogonal to an X-axis direction tangent contacting the outer edge of one columnar portion CL and an X-axis direction tangent contacting the outer edge of another columnar portions CL adjacent to the one columnar portion CL in the Y-axis direction. This is similar for the other pitches described below.

First Embodiment: Sixth Modification

Figure 16A:
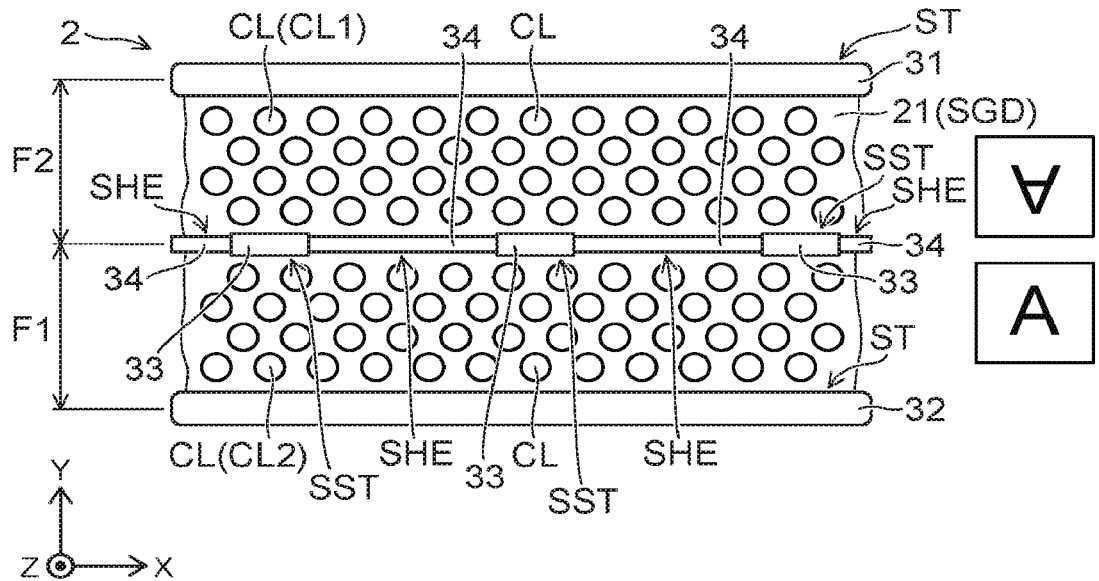
FIG. 16A is a schematic cross-sectional view illustrating a semiconductor device according to a sixth variation of the first embodiment.
Figure 16B:
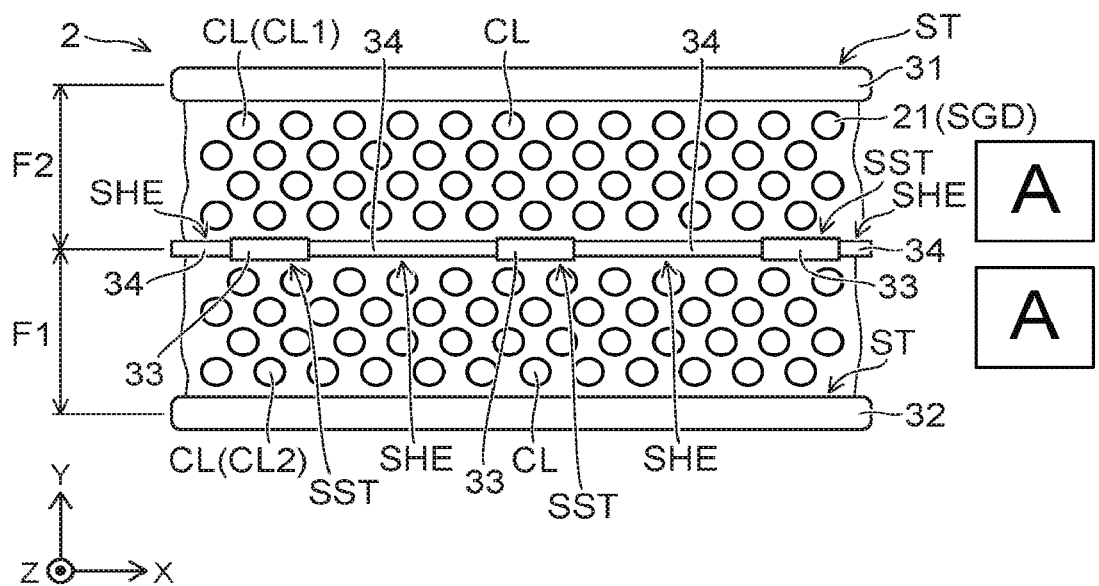
FIG. 16B is a schematic cross-sectional view illustrating the semiconductor device according to the fifth variation of the first embodiment.

FIG. 16A is a schematic cross-sectional view (an X-Y cross section) illustrating a semiconductor device 100af according to a sixth modification of the first embodiment. FIG. 16B is a schematic cross-sectional view (an X-Y cross section) illustrating the semiconductor device 100ae according to the fifth modification of the first embodiment. For example, the cross sections shown in FIG. 16A and FIG. 16B correspond to the cross section shown in FIG. 2A.

As shown in FIG. 16A, the semiconductor device 100af includes first and second fingers F1 and F2 between the first insulating body 31 and the second insulating body 32. For example, four columnar portions CL are arranged in a staggered configuration in the Y-axis direction in each of the first and second fingers F1 and F2. In the semiconductor device 100af, for example, the pattern of the columnar portions CL of the first finger F1 and the pattern of the columnar portions CL of the second finger F2 have a "line symmetry" relationship around the third and fourth insulating bodies 33 and 34. In other words, the pattern of the second finger F2 is a "mirror pattern" of the pattern of the first finger F1.

The schematic cross-sectional view of the semiconductor device 100ae according to the fifth modification described above is redrawn in FIG. 16B. In the semiconductor device 100ae, the pattern of the first finger F1 is the same as the pattern of the second finger F2, including the orientation of the pattern. In the semiconductor device 100ae, the pattern of the second finger F2 is a "repeat pattern" of the pattern of the first finger F1.

The characters "A" shown in FIG. 16A and FIG. 16B allow easier understanding of the orientations of the patterns of the first and second fingers F1 and F2.

As shown by the characters "A" in FIG. 16A, the pattern of the second finger F2 has the reverse orientation of the pattern of the first finger F1 for the semiconductor device 100af. Conversely, as shown by the characters "A" in FIG. 16B, the pattern of the second finger F2 has the same orientation as the pattern of the first finger F1 for the semiconductor device 100ae.

Thus, it is possible to set the pattern of the second finger F2 to be the mirror pattern of the pattern of the first finger F1. Also, the pattern of the second finger F2 may be set to be the repeat pattern of the pattern of the first finger F1.

Figure 17A:
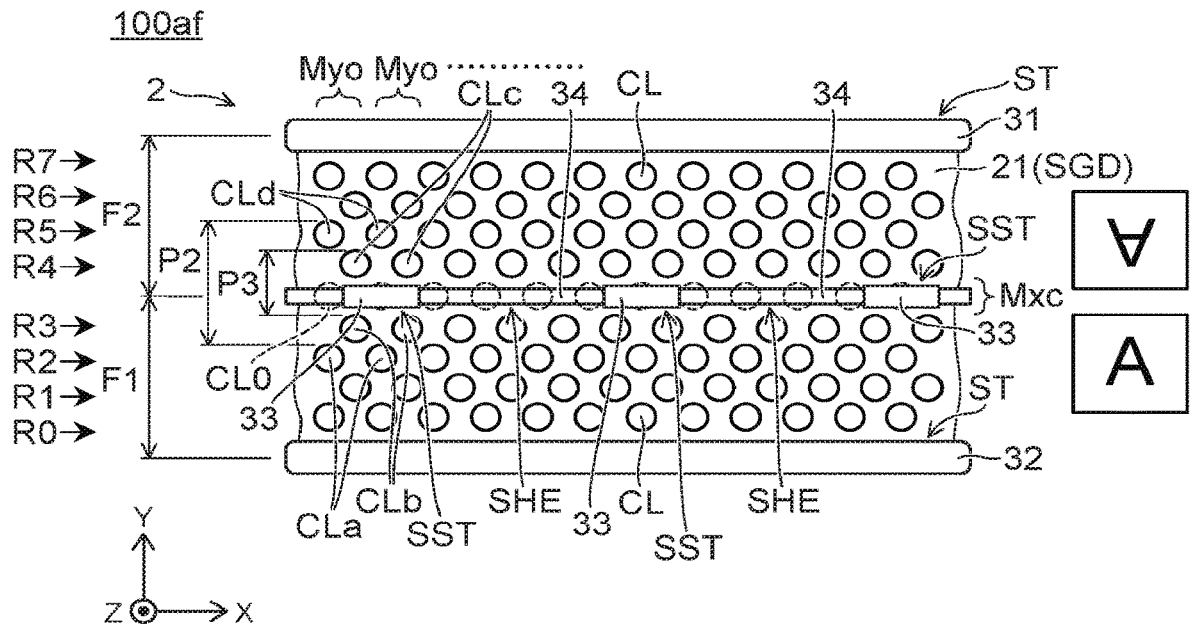
FIG. 17A is a schematic cross-sectional view illustrating a pattern example of the semiconductor device according to the sixth variation of the first embodiment.

FIG. 17A is a schematic cross-sectional view (an X-Y cross section) illustrating a pattern example of the semiconductor device 100*af* according to the sixth modification of the first embodiment. For example, the cross section shown in FIG. 17A corresponds to the cross section shown in FIG. 2A.

As shown in FIG. 17A, in the case where the pattern of the second finger F2 is set to be the mirror pattern of the pattern of the first finger F1, for example:

(a1) A pattern Myo that extends in the Y-axis direction and includes an odd number of the columnar portions CL arranged in a staggered configuration is made (an example of the odd number being nine).

(a2) The pattern Myo is sequentially arranged along the X-axis direction.

(a3) A pattern Mxc that extends in the X-axis direction and does not include the columnar portions CL is obtained by eliminating, along the X-axis direction, the columnar portions CL0 positioned at the Y-axis direction center.

(a4) The pattern of the shallow slit SHE and the deep and short slits SST is disposed in the area corresponding to the pattern Mxc.

For example, the pattern of the second finger F2 can be set to be the mirror pattern of the pattern of the first finger F1 by the method of (a1) to (a4) recited above.

According to such a semiconductor device 100*af*, the rows R2 and R3 are adjacent to one side along the X-axis direction of the third and fourth insulating bodies 33 and 34. Further, the rows R4 and R5 are adjacent to one other side along the X-axis direction of the third and fourth insulating bodies 33 and 34. The rows R2 to R5 respectively include multiple columnar portions CLa to CLd along the X-axis direction. The pitch along the Y-axis direction between the columnar portion CLa and the columnar portion CLd is taken as "P2." The pitch along the Y-axis direction between the columnar portion CLb and the columnar portion CLc is taken as "P3." The relationship between the pitch P2 and the pitch P3 is $$P2 > P3.$$

According to the semiconductor device 100*af*, the pitch P3 is substantially $$P3 \approx P2/2.$$

In the semiconductor device 100*af*, for example, the two columnar portions CLa and CLd that are separated at the pitch P2 in the Y-axis direction and the two columnar portions CLb and CLc that are separated at the pitch P3 in the Y-axis direction are arranged alternately along the X-axis direction. Also, in the semiconductor device 100*af*, the third and fourth insulating bodies 33 and 34 are disposed between the columnar portion CLa and the columnar portion CLd and between the columnar portion CLb and the columnar portion CLc. The pitch P2 is larger than the pitch P3. For example, the pitch P3 is substantially P2/2. Thus, the pattern of the second finger F2 may be set to be the mirror pattern of the pattern of the first finger F1 by alternately repeating, along the X-axis direction, the pitch P2 and the pitch P3 which is smaller than the pitch P2, e.g., P2/2.

Figure 17B:
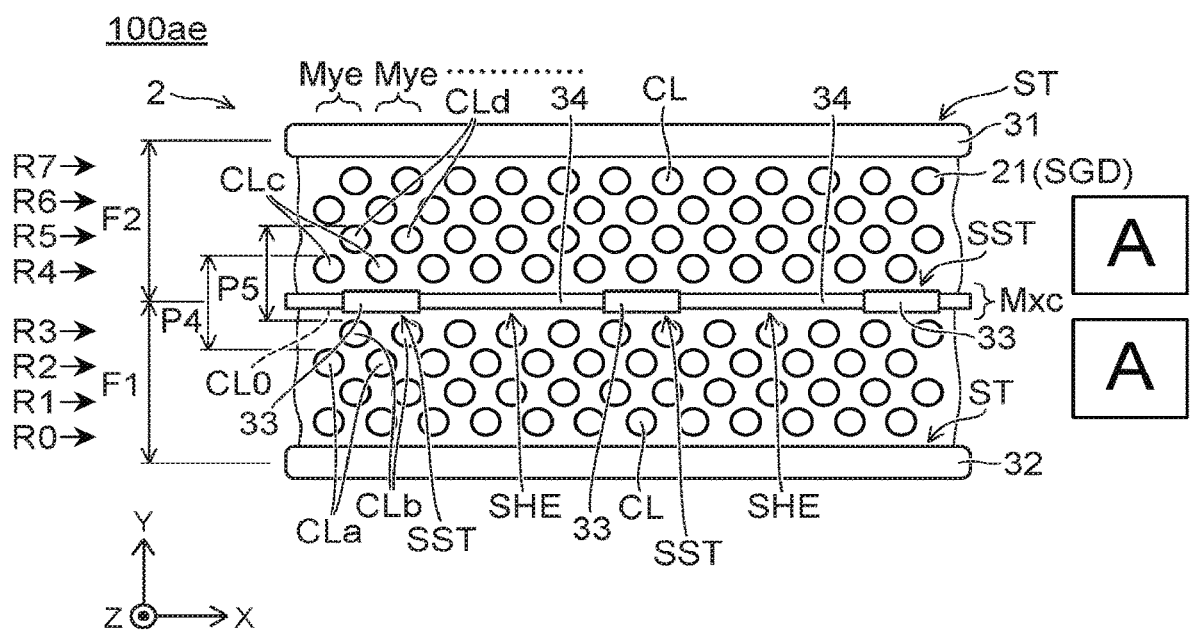
FIG. 17B is a schematic cross-sectional view illustrating the pattern example of the semiconductor device according to the fifth variation of the first embodiment.

FIG. 17B is a schematic cross-sectional view (an X-Y cross section) illustrating the pattern example of the semiconductor device 100*ae* according to the fifth modification of the first embodiment. For example, the cross section shown in FIG. 17B corresponds to the cross section shown in FIG. 2A.

As shown in FIG. 17B, in the case where the pattern of the second finger F2 is set to be the repeat pattern of the first finger F1, for example:

(b1) A pattern Mye that extends in the Y-axis direction and includes an even number of the columnar portions CL arranged in a staggered configuration is made (an example of the even number being eight).

(b2) The pattern Mye is sequentially arranged along the X-axis direction.

(b3) The area that is between the columnar portions CL positioned at the center in the Y-axis direction is widened along the Y-axis direction; and the pattern Mxc that extends in the X-axis direction and does not include the columnar portions CL is obtained.

(b4) The pattern of the shallow slit SHE and the deep and short slits SST is disposed in the area corresponding to the pattern Mxc.

For example, the pattern of the second finger F2 can be set to be the repeat pattern of the first finger F1 by the method of (b1) to (b4) recited above.

Similarly to the semiconductor device 100*af*, in the semiconductor device 100*ae* as well, the rows R2 and R3 are adjacent to one side along the X-axis direction of the third and fourth insulating bodies 33 and 34; and the rows R4 and R5 are adjacent to one other side along the X-axis direction of the third and fourth insulating bodies 33 and 34. The pitch along the Y-axis direction between the columnar portion CLa and the columnar portion CLc is taken as "P4." The pitch along the Y-axis direction between the columnar portion CLb and the columnar portion CLd is taken as "P5." The relationship between the pitch P4 and the pitch P5 substantially is $$P4 \approx P5.$$

In the semiconductor device 100*ae*, for example, the two columnar portions CLa and CLc that are separated at the pitch P4 in the Y-axis direction and the two columnar portions CLb and CLd that are separated at the pitch P5 in the Y-axis direction are arranged alternately along the X-axis direction. Also, in the semiconductor device 100*af*, the third and fourth insulating bodies 33 and 34 are disposed between the columnar portion CLa and the columnar portion CLc and between the columnar portion CLb and the columnar portion CLd. The pitch P4 is substantially equal to the pitch P5. Thus, the pattern of the second finger F2 may be set to be the repeat pattern of the pattern of the first finger F1 by repeating along the X-axis direction, in a zigzag in the Y-axis direction, the pitch P4 and the pitch P5 which is substantially equal to the pitch P4.

First Embodiment: Seventh Modification

Figure 18A:
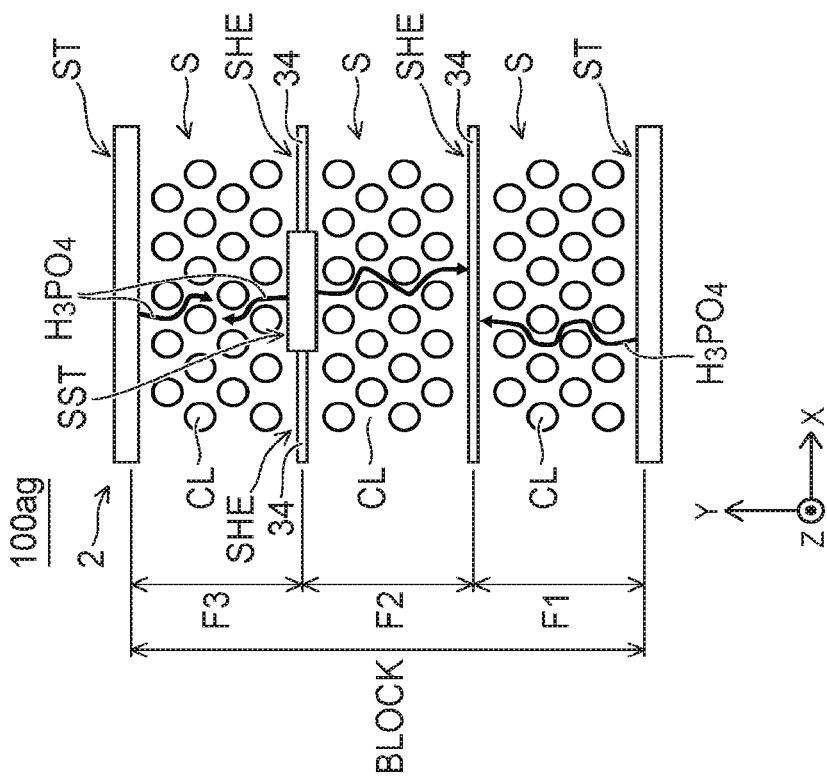
FIG. 18A is a schematic cross-sectional view illustrating a state in the manufacture of a semiconductor device according to a second reference example.
Figure 18B:
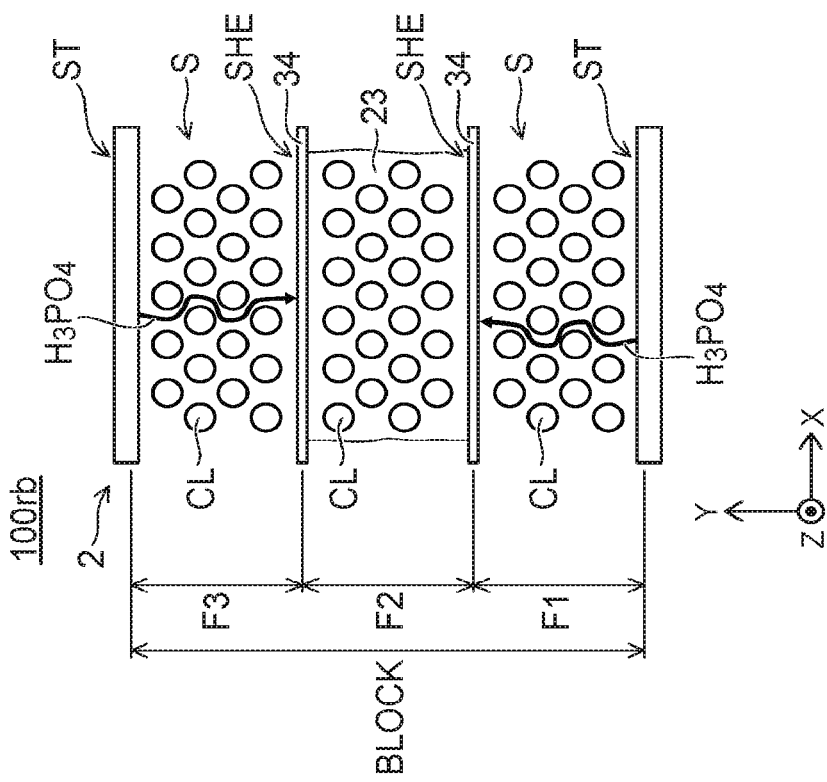
FIG. 18B is a schematic cross-sectional view illustrating a state in the manufacture of a semiconductor device according to a seventh variation of the first embodiment.

FIG. 18A is a schematic cross-sectional view (an X-Y cross section) illustrating a state in the manufacture of a semiconductor device 100*rb* according to a second reference example (SECOND REFERENCE EXAMPLE). FIG. 18B is a schematic cross-sectional view illustrating a state in the manufacture of a semiconductor device 100*ag* according to a seventh modification of the first embodiment. FIG. 18A and FIG. 18B each show examples in which the shallow slit SHE and the deep and short slit SST are multiply arranged along the Y-axis direction between the two deep slits ST. In such a case, in addition to the region from the deep slit ST to the shallow slit SHE and the deep and short slit SST, the region that is interposed between the multiple shallow slits SHE and the deep and short slits SST is used as a finger.

As shown in FIG. 18A, the semiconductor device 100rb according to the second reference example is an example in which three or more fingers F1 to F3 are provided inside one block (BLOCK). However, in the semiconductor device 100rb, it is difficult to provide the three or more fingers F1 to F3 inside the one block. In the layers inside the stacked body 2 where the drain-side selection gate SGD is formed, two lines of the fourth insulating bodies 34 having line configurations exist between two deep slits ST. In the process of forming the space S (the removal process of the sacrificial films 23), the etchant ($H_3PO_4$) does not enter the portion interposed between the fourth insulating bodies 34 having the line configurations. Therefore, the sacrificial films 23 remain; and the drain-side selection gate SGD cannot be formed.

As shown in FIG. 18B, the semiconductor device 100ag according to the seventh modification includes three or more fingers F1 to F3 inside one block. The semiconductor device 100ag includes the deep and short slit SST between two deep slits ST. Accordingly, in the process of forming the space S (the removal process of the sacrificial films 23), the etchant ($H_3PO_4$) can enter the portion interposed between the fourth insulating bodies 34 from the deep and short slit SST. Accordingly, according to the semiconductor device 100ag, the space S can be formed in the portion interposed between the fourth insulating bodies 34.

According to the semiconductor device 100ag in which the deep and short slit SST and the third insulating bodies 33 are provided between the first insulating body 31 and the second insulating body 32, the three or more fingers F1 to F3 can be provided inside one block.

Figures 19A, 19B, 19C:
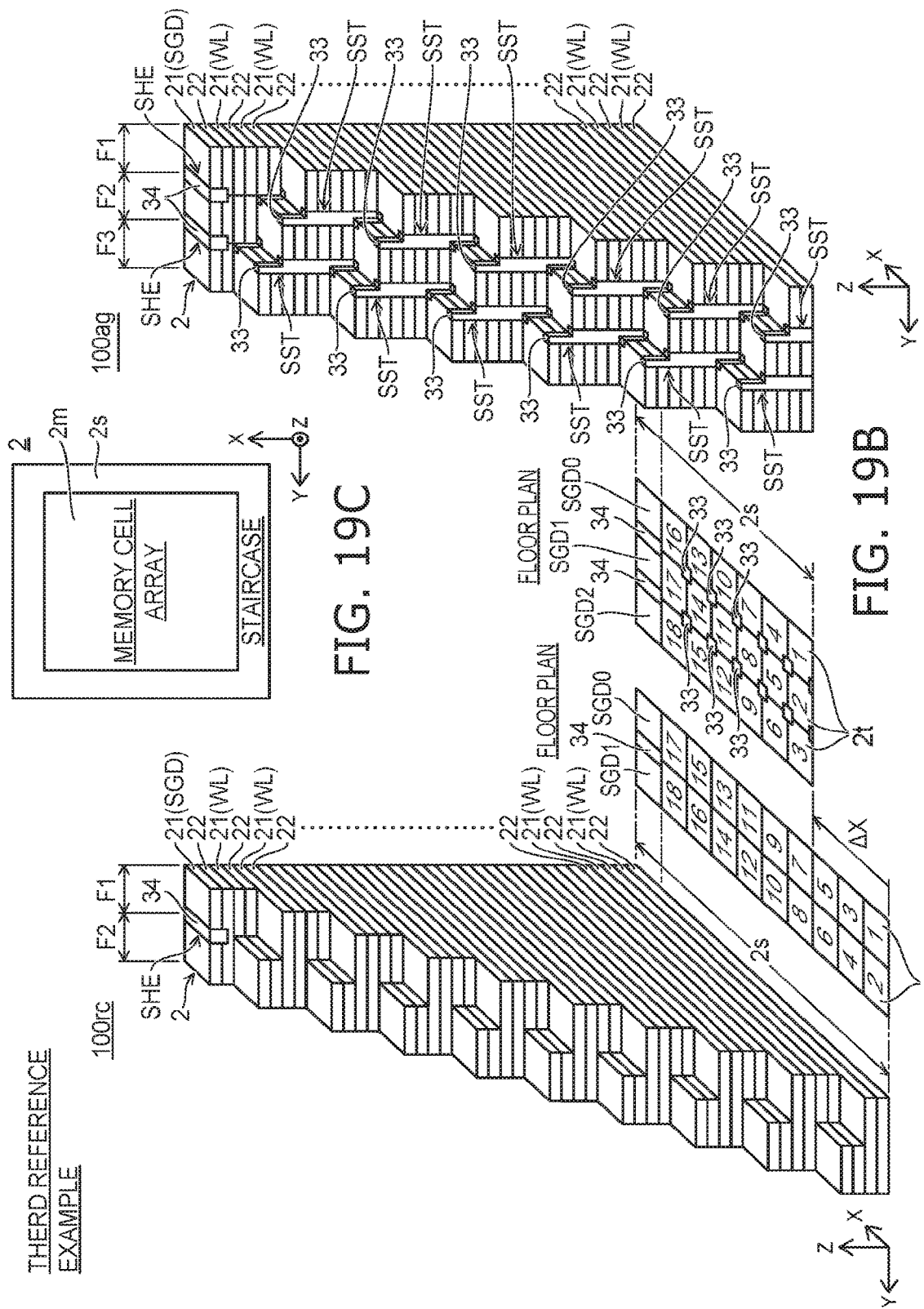
FIG. 19A is a schematic perspective view showing a semiconductor device according to a third reference example.
FIG. 19B is a schematic perspective view illustrating the semiconductor device according to the seventh variation of the first embodiment.
FIG. 19C is a schematic plan view illustrating the stacked body.

FIG. 19A is a schematic perspective view showing a semiconductor device 100rc according to a third reference example (THIRD REFERENCE EXAMPLE). FIG. 19B is a schematic perspective view illustrating the semiconductor device 100ag according to the seventh modification of the first embodiment. FIG. 19C is a schematic plan view illustrating the stacked body 2. FIG. 19A and FIG. 19B each show a staircase portion (STAIRCASE) 2s provided at, for example, the periphery of the stacked body 2 (FIG. 19C). For example, the region that is surrounded with the staircase portion 2s is the memory cell array 2m (MEMORY CELL ARRAY). Also, the number of layers of the conductive layers 21 used as the word lines WL is eighteen layers for convenience. FIG. 19A and FIG. 19B each show the floor plan (FLOOR PLAN) of terraces 2t. "1 to 18" inside the floor plan show the order of the stacked conductive layers 21.

As shown in FIG. 19A, the semiconductor device 100rc according to the third reference example includes the two fingers F1 and F2. In such a case, in the staircase portion 2s, a method for reducing the length in the X-axis direction of the staircase portion can be employed by patterning the conductive layers 21 along the X-axis direction into a staircase configuration two layers at a time, and by subsequently patterning the conductive layers 21 along the Y-axis direction into a staircase configuration one layer at a time. In the case of the two fingers F1 and F2, the number of the terraces 2t in the X-axis direction can be reduced to ½ of the number of layers of the conductive layers 21 used as the word lines WL. For example, in the case where the number of layers of the conductive layers 21 is eighteen layers as shown in the floor plan in FIG. 19A, the number of the terraces 2t in the X-axis direction is nine. Although not particularly illustrated, electrical interconnects that apply potentials to the conductive layers 21 are provided at the terraces 2t.

As shown in FIG. 19B, the semiconductor device 100ag according to the seventh modification includes three or more fingers, e.g., the fingers F1 to F3. In the staircase portion in the case where the fingers F1 to F3 are included, the conductive layers 21 are patterned into a staircase configuration three layers at a time in the X-axis direction; and subsequently, the conductive layers 21 can be patterned twice into a staircase configuration one layer at a time in the Y-axis direction. According to the semiconductor device 100ag, the number of the terraces 2t in the X-axis direction can be reduced further to ⅓ of the number of layers of the conductive layers 21. For example, in the case where the number of layers of the conductive layers 21 is eighteen layers as shown in the floor plan in FIG. 19B, the number of the terraces 2t in the X-axis direction is six.

Thus, according to the semiconductor device 100ag, for example, the length along the X-axis direction of the staircase portion can be shortened "ΔX" compared to the semiconductor device 100rc. Accordingly, an advantage can be further obtained in that it is possible to further reduce the dimensions of the stacked body 2.

Also, as shown in FIG. 19B, the deep and short slits SST may be provided in the staircase portion 2s. In the staircase portion 2s as well, the third insulating bodies 33 are provided inside the deep and short slits SST. However, it is not always necessary to provide the third insulating bodies 33 in the staircase portion 2s because the shallow slits SHE provided in the memory cell array 2m are not formed to extend to the staircase portion 2s. However, for example, in the case where three or more fingers are provided inside the stacked body 2, it is favorable for the deep and short slits SST to be provided and for the third insulating bodies 33 to be provided in the staircase portion 2s as well. Thereby, in the staircase portion 2s, the occurrence of the voids V in the conductive layer 21 can be suppressed; and a low-resistance conductive layer 21 can be obtained.

Although the third insulating bodies 33 are shown as stopping at the terrace 2t upper surface height of the stacked body 2 in the staircase portion 2s in FIG. 19B, the third insulating bodies 33 are provided inside the staircase portion 2s along the Z-axis direction from the height corresponding to the upper end of the stacked body 2 where the drain-side selection gate SGD is formed to the lower end of the stacked body 2. It is unnecessary to provide the fourth insulating bodies 34 in the staircase portion 2s. In the staircase portion 2s, for example, there are no fourth insulating bodies 34 between the third insulating body 33 and the third insulating body 33 adjacent to each other in the X-axis direction.

First Embodiment: Eighth Modification

Figure 20:
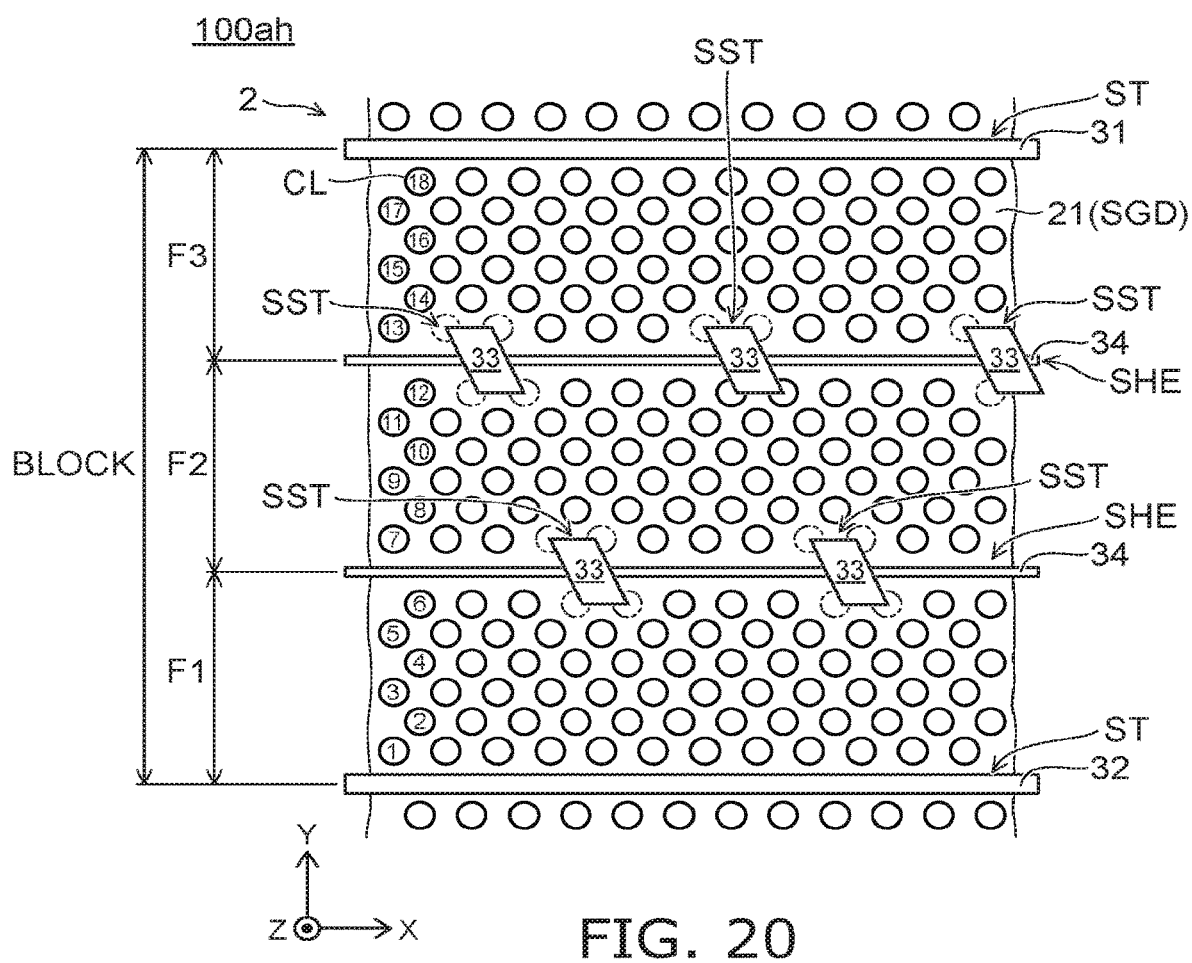
FIG. 20 is a schematic cross-sectional view illustrating a semiconductor device according to an eighth variation of the first embodiment.

FIG. 20 is a schematic cross-sectional view (an X-Y cross section) illustrating a semiconductor device 100ah according to an eighth modification of the first embodiment. For example, the cross section shown in FIG. 20 corresponds to the cross section shown in FIG. 2A.

As shown in FIG. 20, for one finger, it is also possible for the maximum number of the columnar portions CL arranged in a staggered configuration in the Y-axis direction to be, for example, a number exceeding four. In the semiconductor device 100ah, for one finger, the maximum number of the columnar portions CL arranged in a staggered configuration in the Y-axis direction is set to six. Per one block BLOCK, the number of the shallow slits SHE is two; and the maximum number of the columnar portions CL arranged in the staggered configuration in the Y-axis direction is eighteen. "1 to 18" in FIG. 20 show the order of the columnar portions CL arranged in the staggered configuration in the Y-axis direction.

As shown in the semiconductor device 100ah, the maximum number of the columnar portions CL arranged in the staggered configuration in the Y-axis direction per one finger may be set to a number exceeding four.

Figures 21A, 21B:
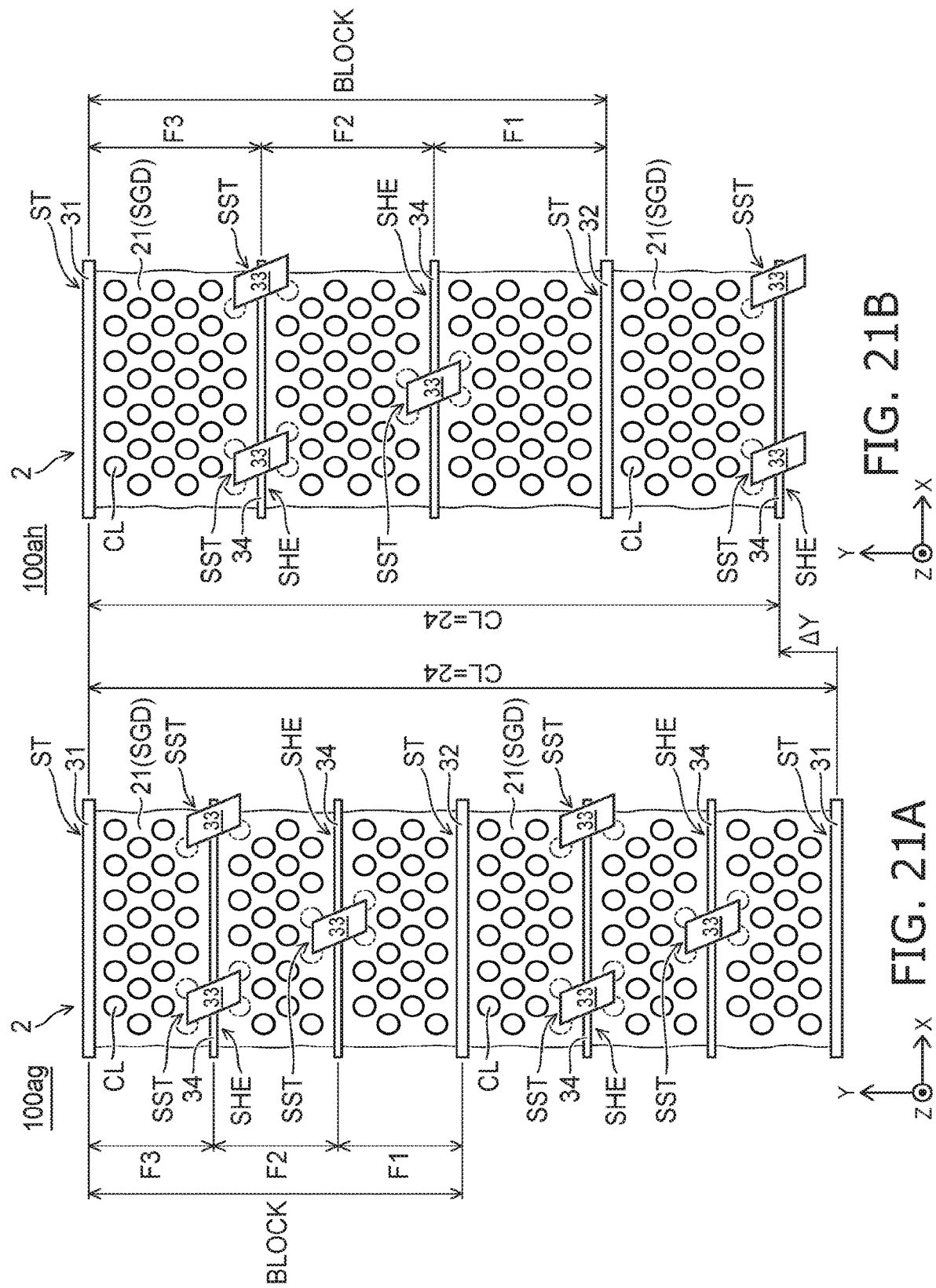
FIG. 21A is a schematic cross-sectional view illustrating the semiconductor device according to the seventh variation of the first embodiment.
FIG. 21B is a schematic cross-sectional view illustrating the semiconductor device according to the eighth variation of the first embodiment.

FIG. 21A is a schematic cross-sectional view (an X-Y cross section) illustrating the semiconductor device 100ag according to the seventh modification of the first embodiment. FIG. 21B is a schematic cross-sectional view (an X-Y cross section) illustrating the semiconductor device 100ah according to the eighth modification of the first embodiment. For example, the cross sections shown in FIG. 21A and FIG. 21B correspond to the cross section shown in FIG. 2A.

In the semiconductor device 100ag as shown in FIG. 21A, for one finger, the maximum number of the columnar portions CL arranged in the staggered configuration in the Y-axis direction is four. Per one block BLOCK, the number of the shallow slits SHE is two; and the maximum number of the columnar portions CL arranged in the staggered configuration in the Y-axis direction is twelve. In the semiconductor device 100ag, per twenty-four columnar portions in the Y-axis direction, the number of the deep slits ST is three; and the number of the shallow slits SHE is four.

Conversely, in the semiconductor device 100ah as shown in FIG. 21B, per twenty-four columnar portions in the Y-axis direction, the number of the deep slits ST can be reduced to two; and the number of the shallow slits SHE can be reduced to three. In other words, the proportion of the shallow slits SHE per unit number of the columnar portions CL in the Y-axis direction is reduced. Accordingly, in the semiconductor device 100ah, for example, the length in the Y-axis direction of the stacked body 2 per twenty-four columnar portions CL can be shortened "ΔY" compared to the semiconductor device 100ag. Accordingly, according to the semiconductor device 100ah, an advantage can be obtained in that it is possible to further reduce the dimensions of the stacked body 2.

The eighth modification is not an example to negate the seventh modification. It is arbitrary whether the seventh modification is selected or the eighth modification is selected.

First Embodiment: Ninth Modification

Figure 22:
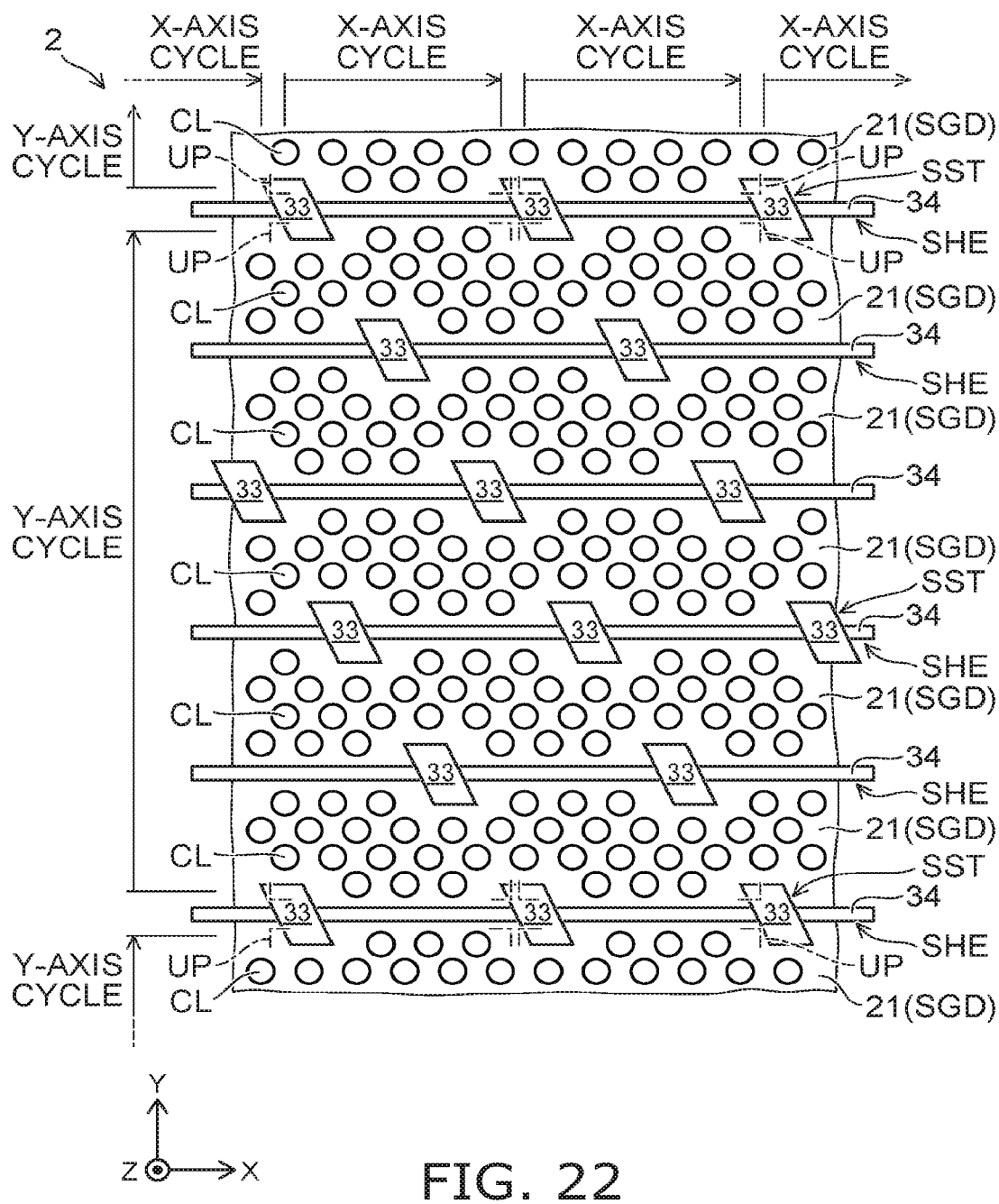
FIG. 22 is a schematic cross-sectional view illustrating a semiconductor device according to a ninth variation of the first embodiment.

FIG. 22 is a schematic cross-sectional view (an X-Y cross section) illustrating a semiconductor device 100ai according to a ninth modification of the first embodiment. For example, the cross section shown in FIG. 22 corresponds to the cross section shown in FIG. 2A.

In the semiconductor device 100ai according to the ninth modification as shown in FIG. 22, in the X-Y cross section, the multiple third insulating bodies 33 are arranged in a staggered configuration; and the third insulating bodies 33 each are disposed to be tilted from, for example, the Y-axis direction. The distance from one third insulating body 33 to another third insulating body 33 adjacent to the one third insulating body 33 in the X-axis direction is taken as an X-axis cycle (X-AXIS CYCLE). The distance from the one third insulating body 33 recited above to another third insulating body 33 adjacent to the one third insulating body 33 in the Y-axis direction is taken as a Y-axis cycle (Y-AXIS CYCLE). The pattern that is subdivided by one of the X-axis cycles and one of the Y-axis cycles is taken as a unit pattern UP. In the semiconductor device 100ai, the unit pattern UP repeatedly appears in the X-axis direction and the Y-axis direction.

Figure 23:
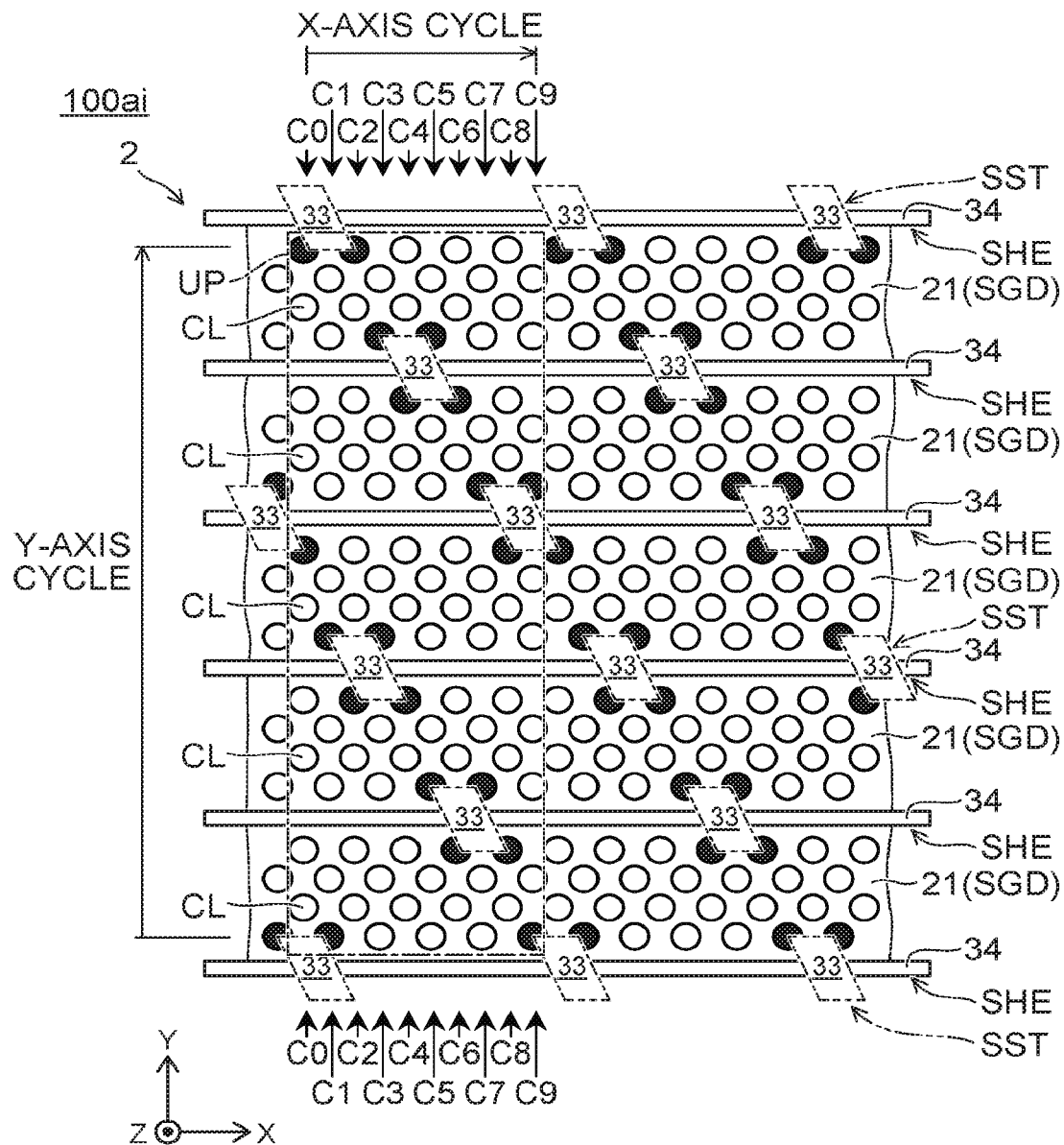
FIG. 23 is a schematic cross-sectional view illustrating the columnar portions CL omitted from the semiconductor device according to the ninth variation of the first embodiment.

FIG. 23 is a schematic cross-sectional view (an X-Y cross section) illustrating the columnar portions CL omitted from the semiconductor device 100ai according to the ninth modification of the first embodiment.

In FIG. 23, the omitted columnar portions CL are shown by black circles. The stacked body 2 includes multiple columns including the multiple columnar portions CL along the Y-axis direction. The unit pattern UP of the semiconductor device 100ai includes ten columns C0 to C9 per one X-axis cycle. The columns C0 to C9 each include the omitted columnar portions CL. In the unit pattern UP of the semiconductor device 100ai, the number of the omitted columnar portions CL is the same between the columns C0 to C9. For example, the number of the omitted columnar portions CL is two for each of the columns C0 to C9. Thereby, the number of the multiple columnar portions CL included in each of the columns C0 to C9 is the same between columns.

Thus, to set the number of the omitted columnar portions CL to be the same between the columns C0 to C9 inside the unit pattern UP, it is sufficient for each of the columns C0 to C9 to include the columnar portions CL and the third insulating bodies 33. Then, it is sufficient to set the columnar portions CL to be omitted by the third insulating bodies 33 in each of the columns C0 to C9. Thereby, the number of the omitted columnar portions CL can be set to be the same between the columns C0 to C9.

Such a unit pattern UP is repeated in the X-axis direction and the Y-axis direction. Thereby, it is possible to set all of the numbers of the columnar portions CL connectable to the bit line BL to be the same between the columns C0 to C9. In one of the columns C0 to C9 in the semiconductor device 100ai, the number of the columnar portions CL connectable to the bit line BL inside one block is eight.

Figure 24:
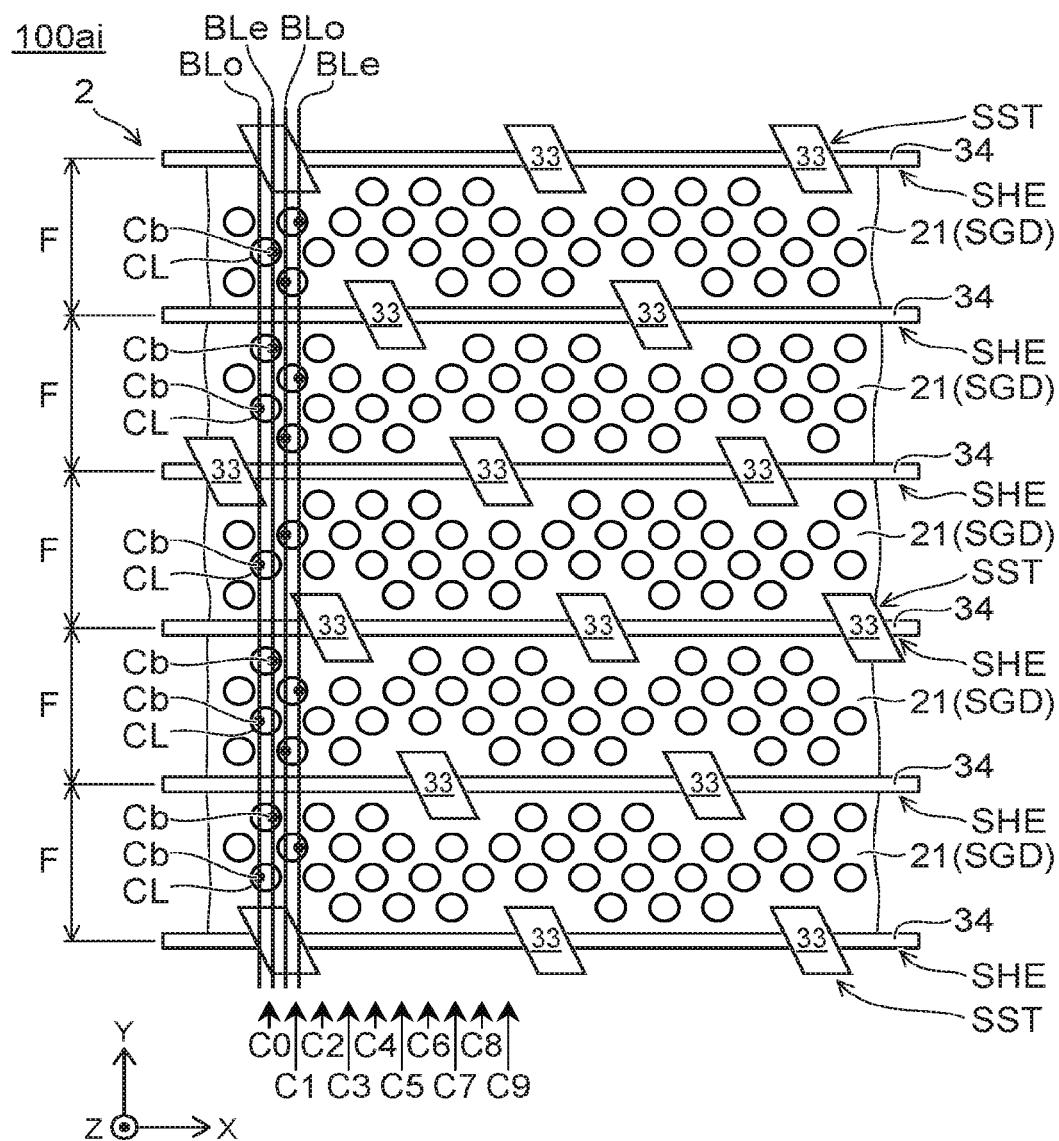
FIG. 24 is a schematic cross-sectional view illustrating a connection example of the bit lines BL of the semiconductor device according to the ninth variation of the first embodiment.

FIG. 24 is a schematic cross-sectional view (an X-Y cross section) illustrating a connection example of the bit lines BL of the semiconductor device 100ai according to the ninth modification of the first embodiment.

In the semiconductor device 100ai as shown in FIG. 24, two bit lines BLo and BLe are disposed over the upper portion of one columnar portion CL. Inside the unit pattern UP, the number of the columnar portions CL connected to the bit line is the same between the bit lines BLe and BLo. Inside the unit pattern UP in the semiconductor device 100ai, the number of the columnar portions CL connected to the bit lines BLe and BLo in each of the columns C0 to C9 is set to four. In FIG. 24, only the columns C0 and C1 are shown for the bit lines BLe and BLo to prevent complexity of the drawing.

In each of the columns C0 to C9, for example, there is a case where the number of the columnar portions CL inside one finger F is odd and a case where the number is even. In the case of the even number, it is sufficient for ½ of the number of the columnar portions CL to be connected to each of the bit lines BLe and BLo. In the case of the odd number, for example, the pattern of the contact Cb is changed alternately between the bit lines BLe and BLo. For example, one columnar portion CL is connected to the bit line BLe, the next one columnar portion CL is connected to the bit line BLo, etc.

In the unit pattern UP according to the semiconductor device 100ai, the number of the omitted columnar portions CL can be the same between the columns C0 to C9. In other words, the number of the columnar portions CL connected to each of the multiple bit lines BL can be substantially uniform between the columns C0 to C9. Thereby, the capacitances of the multiple bit lines BL can be substantially uniform; and faster operations can be realized. Also, because the capacitances of the multiple bit lines BL are substantially uniform, for example, the accuracy of the data discrimination by the sense amplifier can be increased. This advantage is useful for multi-bit stored data.

Figure 25:
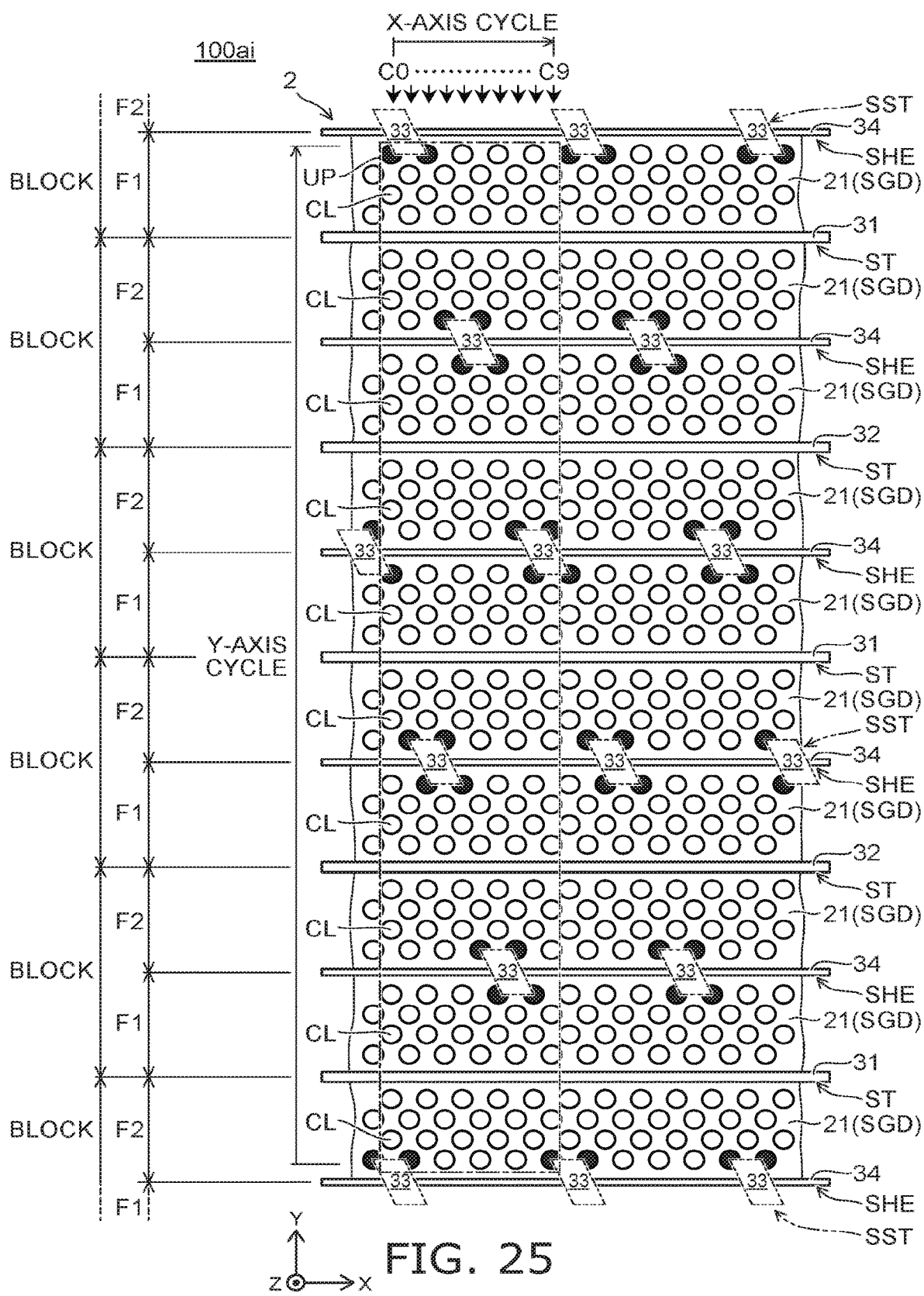
FIG. 25 is a schematic cross-sectional view illustrating the omitted columnar portions CL of the semiconductor device according to another example of the ninth variation of the first embodiment.

FIG. 25 is a schematic cross-sectional view (an X-Y cross section) illustrating the omitted columnar portions CL of the semiconductor device 100ai according to another example of the ninth modification of the first embodiment.

As shown in FIG. 25, the deep slits ST, the first insulating bodies 31, and the second insulating bodies 32 are further illustrated in the semiconductor device 100ai according to the other example. For example, the relationship described in the ninth modification does not change even in the case where the deep slits ST, the first insulating bodies 31, and the second insulating bodies 32 exist. In other words, at the positions where the deep slits ST, the first insulating bodies 31, and the second insulating bodies 32 are disposed, the deep and short slits SST and the third insulating bodies 33 are not formed; and it is unnecessary to omit the columnar portions CL. Therefore, even in the case where the deep slits ST, the first insulating bodies 31, and the second insulating bodies 32 exist between a third insulating body 33 and another third insulating body 33 parallel to the Y-axis direction, the relationship of the number of the columnar portions CL included between the columns C0 to C9 is not affected; and the number of the omitted columnar portions CL can be the same between the columns C0 to C9. Further, the number of the columnar portions CL connectable to the bit line BL for one of the columns C0 to C9 can be the same between columns.

Although the maximum number of the columnar portions CL arranged in the staggered configuration in the Y-axis direction per one finger is set to four in the semiconductor device 100ai, the maximum number may exceed four. Even in the case where the maximum number exceeds four, for the unit pattern UP, the number of the omitted columnar portions CL is set to be the same between the multiple columns; and the number of the columnar portions CL connectable to the bit line BL per column is the same between columns. Thereby, for any maximum number of the columnar portions CL arranged in the staggered configuration in the Y-axis direction per one finger, the number of the columnar portions CL connected to the bit line can be substantially uniform between the multiple bit lines BL.

First Embodiment: Tenth Modification

Figure 26:
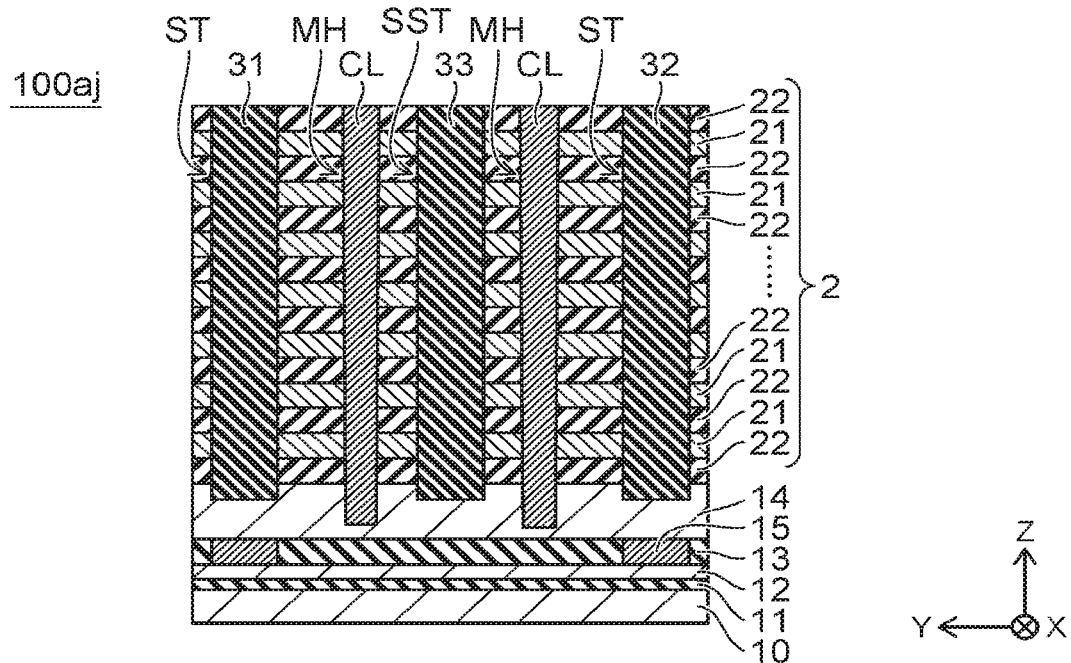
FIG. 26 is a schematic cross-sectional view illustrating a semiconductor device according to a tenth variation of the first embodiment.

FIG. 26 is a schematic cross-sectional view (a Y-Z cross section) illustrating a semiconductor device 100aj according to a tenth modification of the first embodiment. For example, the cross section shown in FIG. 26 corresponds to the cross section shown in FIG. 8B.

As shown in FIG. 26, only insulating bodies may be provided inside the deep slits ST. In the semiconductor device 100aj, for example, the first and second insulating bodies 31 and 32 are provided inside the deep slits ST. In such a case, on a semiconductor substrate, for example, a first semiconductor region 10, an insulating layer 11 provided on the first semiconductor region 10, a conductive layer 12 provided on the insulating layer 11, an insulating layer 13 provided on the conductive layer 12, a second semiconductor region 14 provided on the insulating layer 13, and multiple interconnect members 15 electrically connecting the conductive layer 12 and the second semiconductor region 14 and being provided inside the insulating layer 13 may be included. The stacked body 2 is provided on the second semiconductor region 14. For example, a potential is applied to the second semiconductor region 14 from the conductive layer 12 via the interconnect members 15.

As in the semiconductor device 100aj, it is also possible to provide only insulating bodies inside the deep slits ST.

First Embodiment: Eleventh Modification

Figure 27:
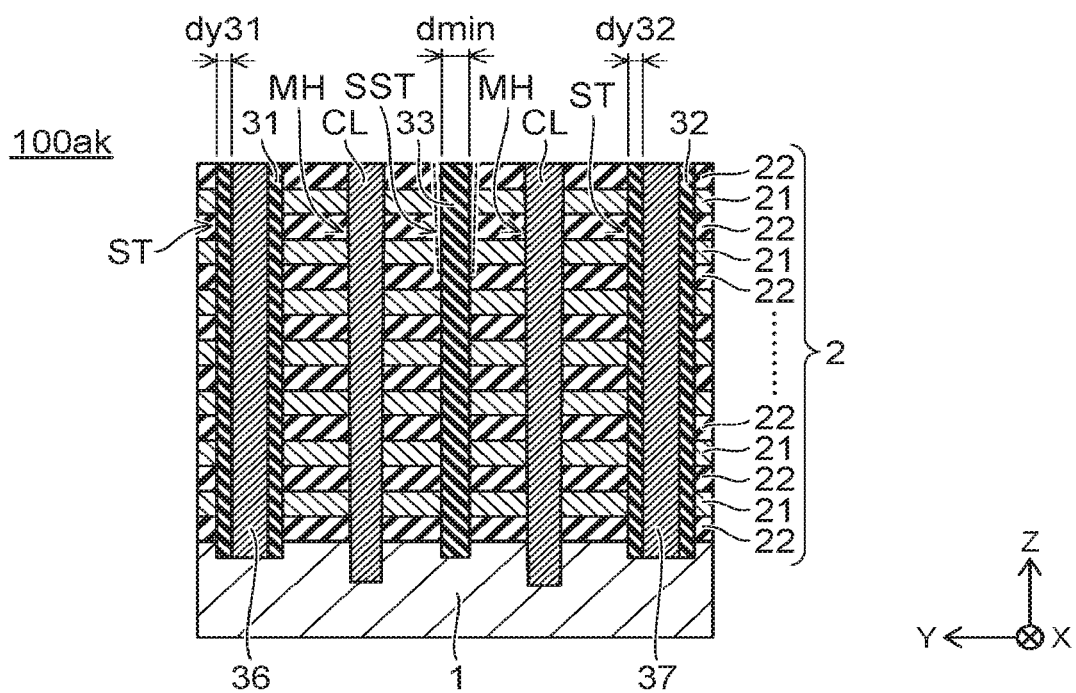
FIG. 27 is a schematic cross-sectional view illustrating a semiconductor device according to an eleventh variation of the first embodiment.

FIG. 27 is a schematic cross-sectional view (a Y-Z cross section) illustrating a semiconductor device 100ak according to an eleventh modification of the first embodiment. For example, the cross section shown in FIG. 27 corresponds to the cross section shown in FIG. 8B.

As shown in FIG. 27, both an insulating body and a conductive body may be provided inside the deep slit ST. In the semiconductor device 100ak, for example, the first insulating body 31 and a first conductive body 36 or the second insulating body 32 and a second conductive body 37 are provided inside the deep slit ST. The stacked body 2 is provided on the semiconductor substrate 1. The first and second conductive bodies 36 and 37 are insulated from the stacked body 2 respectively by the first and second insulating bodies 31 and 32. The first and second conductive bodies 36 and 37 each are electrically connected to the semiconductor substrate 1. For example, a potential is applied to the semiconductor substrate 1 via the first and second conductive bodies 36 and 37.

As in the semiconductor device 100ak, it is also possible to provide both an insulating body and a conductive body inside the deep slit ST.

A minimum width dmin of the third insulating body 33 may be not more than 2 times a width dy31 along the Y-axis direction of the first insulating body 31 or a width dy32 along the Y-axis direction of the second insulating body 32. In the case where the minimum width dmin is not more than 2 times the width dy31 or the width dy32, for example, the deep and short slits SST also can be filled with an insulator when forming the first and second insulating bodies 31 and 32 in the deep slits ST. Accordingly, the first to third insulating bodies 31 to 33 can be formed using the same process. Therefore, for example, it is possible to reduce the number of manufacturing processes or suppress the increase of the number of manufacturing processes.

Second Embodiment

Figure 28A:
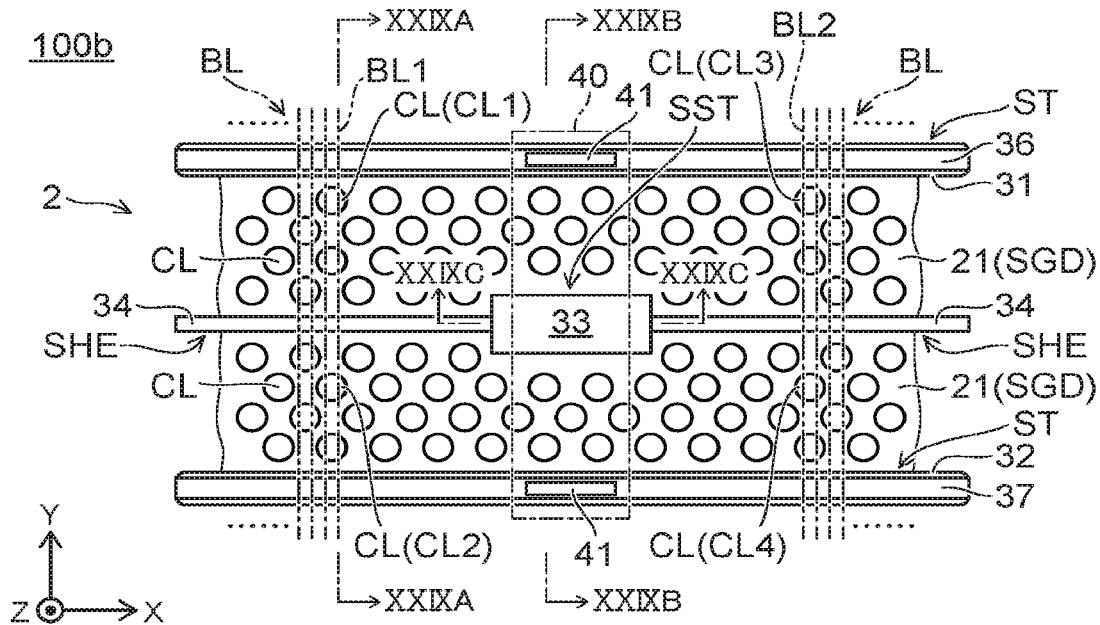
FIG. 28A and FIG. 28B are schematic cross-sectional views illustrating a semiconductor device according to a second embodiment.
Figure 28B:
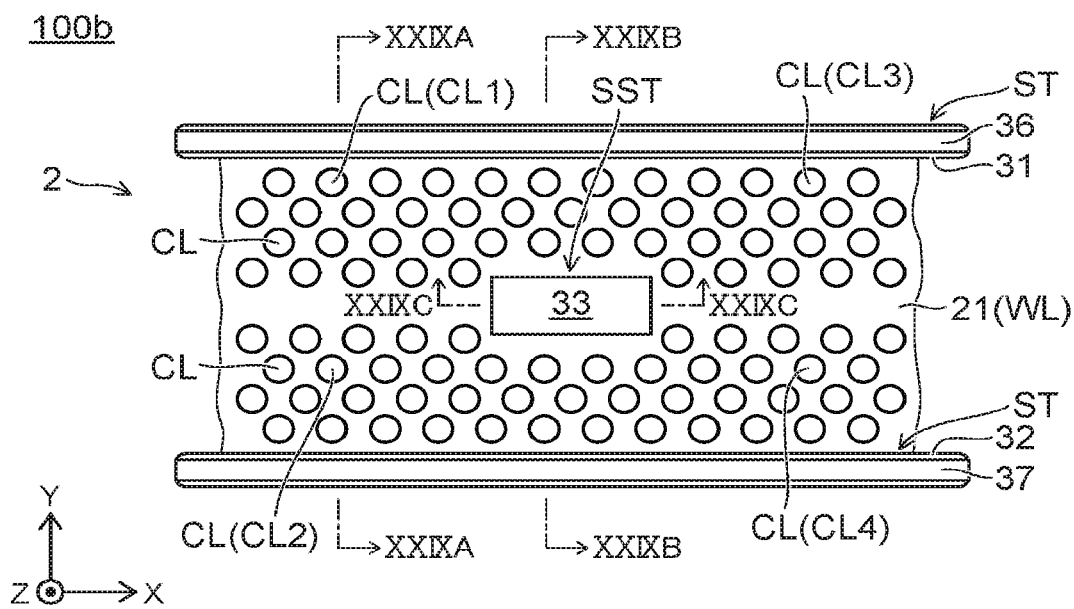
Figures 29A, 29B, 29C:
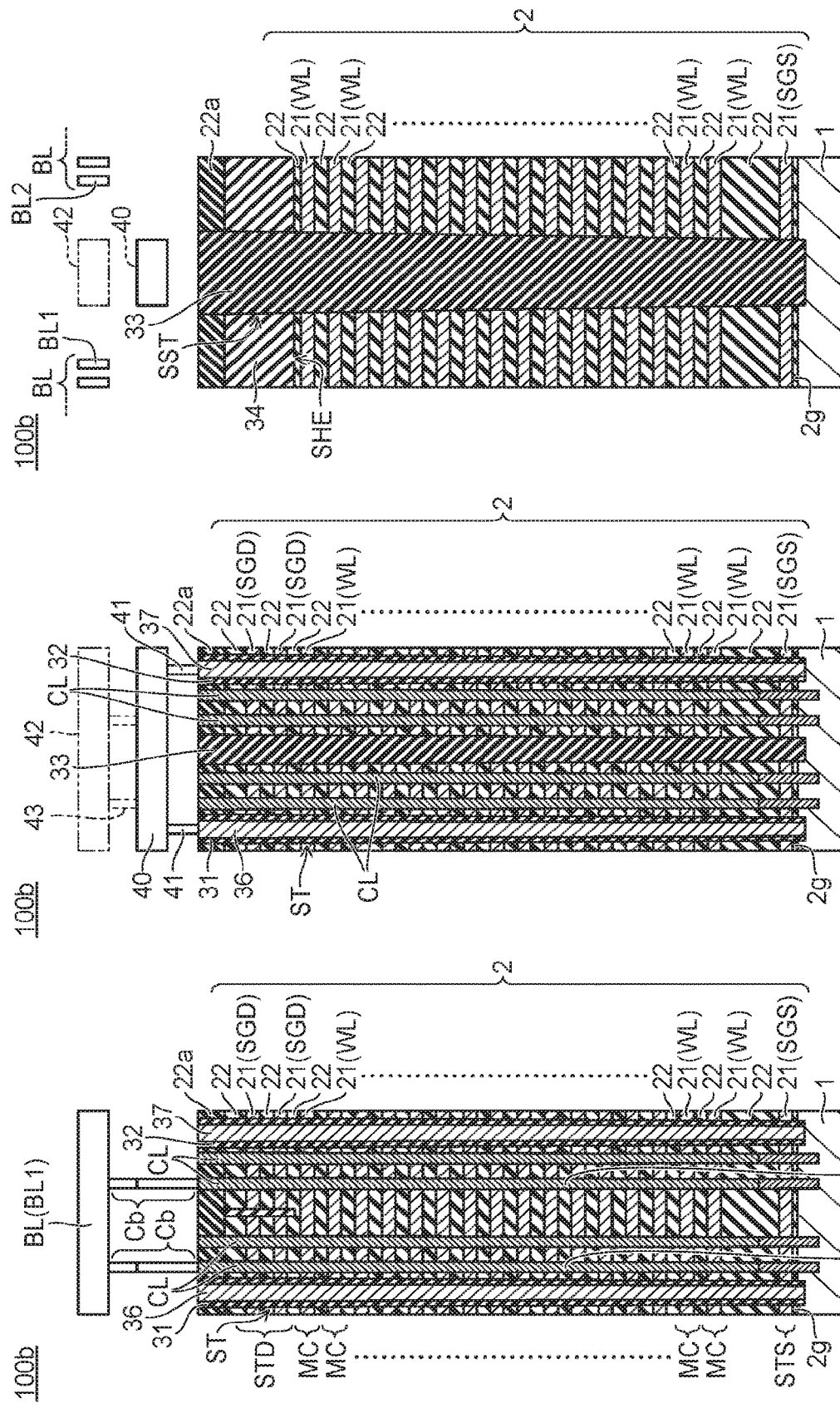
FIG. 29A is a schematic cross-sectional view along line XXIXA-XXIXA in FIG. 28A and FIG. 28B.
FIG. 29B is a schematic cross-sectional view along line XXIXB-XXIXB in FIG. 28A and FIG. 28B.
FIG. 29C is a schematic cross-sectional view along line XXIXC-XXIXC in FIG. 28A and FIG. 28B.

FIG. 28A and FIG. 28B are schematic cross-sectional views (X-Y cross sections) illustrating a semiconductor device 100b according to a second embodiment. The cross section shown in FIG. 28A corresponds to a cross section along line IIA-IIA in FIG. 1A; and the cross section shown in FIG. 28B corresponds to a cross section along line IIB-IIB in FIG. 1A. FIG. 29A is a schematic cross-sectional view (a Y-Z cross section) along line XXIXA-XXIXA in FIG. 28A and FIG. 28B. FIG. 29B is a schematic cross-sectional view (a Y-Z cross section) along line XXIXB-XXIXB in FIG. 28A and FIG. 28B. FIG. 29C is a schematic cross-sectional view (an X-Z cross section) along line XXIXC-XXIXC in FIG. 28A and FIG. 28B.

As shown in FIG. 28A to FIG. 29C, the semiconductor device 100b differs from the semiconductor device 100a according to the first embodiment in that the semiconductor device 100b includes a shunt line 40 disposed between a first bit line BL1 and a second bit line BL2 separated from the first bit line BL1 in the X-axis direction. The first bit line BL1 extends in the Y-axis direction and is separated from the stacked body 2 in the Z-axis direction. The second bit line BL2 extends in the Y-axis direction, is separated from the stacked body 2 in the Z-axis direction, and is separated from the first bit line BL1 in the X-axis direction. The shunt line 40 extends in the Y-axis direction, is separated from the stacked body 2 in the Z-axis direction, and is electrically connected to each of the first and second conductive bodies 36 and 37 via, for example, interconnect members 41.

The semiconductor device 100b further includes the first to fourth columnar portions CL1 to CL4. The first to fourth columnar portions CL1 to CL4 each are provided along the Z-axis direction from the upper end of the stacked body 2 to the lower end of the stacked body 2. The first columnar portion CL1 is provided inside the stacked body 2 between the first insulating body 31 and the fourth insulating bodies 34; and the second columnar portion CL2 is provided inside the stacked body 2 between the second insulating body 32 and the fourth insulating bodies 34. The first and second columnar portions CL1 and CL2 each are electrically connected to the first bit line BL1. The third columnar portion CL3 is provided inside the stacked body 2 between the first insulating body 31 and the fourth insulating bodies 34; and the fourth columnar portion CL4 is provided inside the stacked body 2 between the second insulating body 32 and the fourth insulating bodies 34. The third and fourth columnar portions CL3 and CL4 each are electrically connected to the second bit line BL2.

The third insulating body 33 is provided inside the stacked body 2 along the Z-axis direction from the upper end of the stacked body 2 to the lower end of the stacked body 2, is in contact with the fourth insulating body 34, and overlaps the shunt line 40 in the Z-axis direction.

Thus, for example, it is also possible to provide the third insulating body 33 at a position overlapping, in the X-axis direction, the shunt line 40 electrically connected to each of the first and second conductive bodies 36 and 37.

A conductive layer that is provided between the bit line BL and the stacked body 2 may be utilized as the shunt line 40. In such a case, an interconnect layer 42 that utilizes the same conductive layer as the bit line BL may be further connected to the shunt line 40 via a connection member 43.

It is possible to combine the second embodiment with the first embodiment and the first to ninth and eleventh modifications described in the first embodiment.

Third Embodiment

Figure 30A:
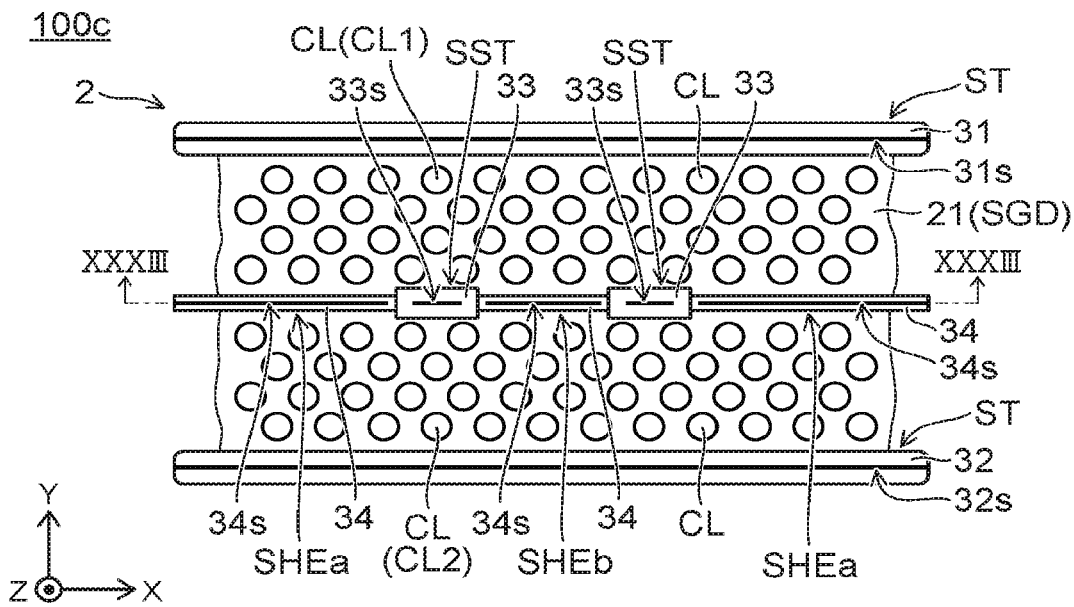
FIG. 30A and FIG. 30B are schematic cross-sectional views illustrating a semiconductor device according to a third embodiment.
Figure 30B:
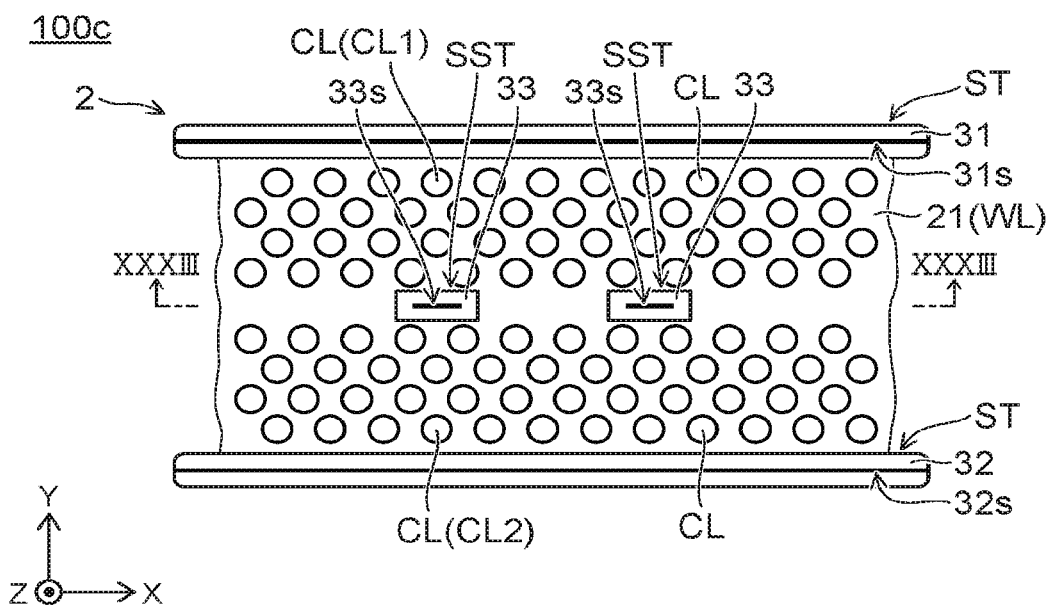

FIG. 30A and FIG. 30B are schematic cross-sectional views (X-Y cross sections) illustrating a semiconductor device 100c according to a third embodiment. FIG. 30A corresponds to the cross section along line IIA-IIA in FIG. 1A; and FIG. 30B corresponds to the cross section along line IIB-IIB in FIG. 1A.

In the semiconductor device 100c as shown in FIG. 30A and FIG. 30B, the shallow slits SHE are formed in perforated configurations. The shallow slits SHE that have the perforated configurations alternately include shallow slits SHEa and SHEb along the X-axis direction. The fourth insulating body 34 is provided inside each of the slits SHEa and SHEb.

Seams 31s to 34s that occur in the first to fourth insulating bodies 31 to 34 are illustrated in FIG. 30A and FIG. 30B. For example, the seams 31s to 34s occur when forming the first to fourth insulating bodies 31 to 34 by using CVD (Chemical Vapor Deposition). In the semiconductor device 100c, the third insulating body 33 does not contact the seam 34s of the fourth insulating body 34.

Figure 31A:
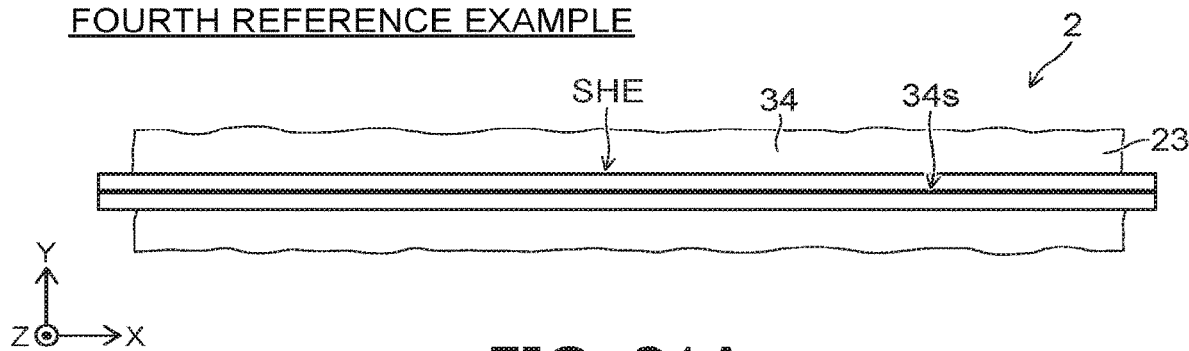
FIG. 31A and FIG. 31B are schematic cross-sectional views showing a fourth reference example.
Figure 31B:
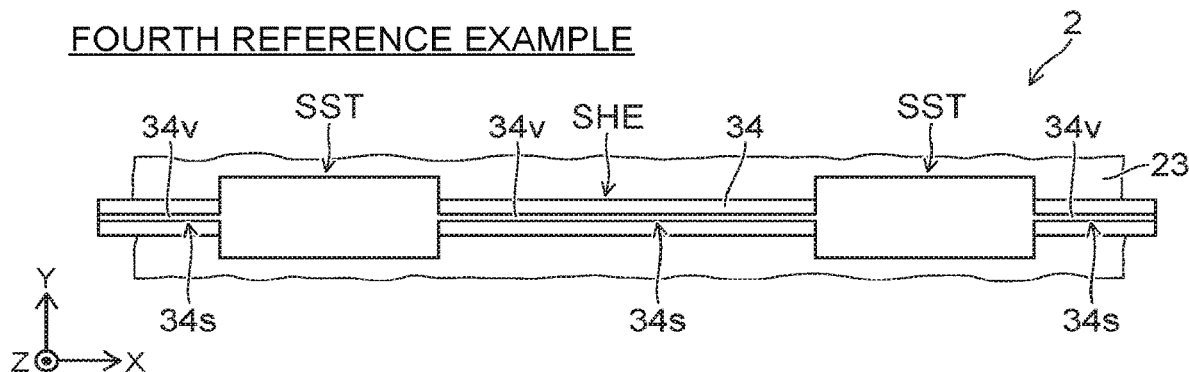

FIG. 31A and FIG. 31B are schematic cross-sectional views (X-Y cross sections) showing a fourth reference example (FOURTH REFERENCE EXAMPLE).

As shown in FIG. 31A, the shallow slit SHE is formed in the stacked body 2; and, for example, the seam 34s occurs along the X-axis direction by filling the shallow slit SHE with the fourth insulating body 34.

Then, as shown in FIG. 31B, the deep and short slit SST is formed in the stacked body 2 to pierce the fourth insulating body 34 in which the seam 34s occurred. Further, the sacrificial films 23 that are provided inside the stacked body 2 (e.g., FIG. 6B) are removed from the stacked body 2 via the deep and short slit SST. After such a process, there is a possibility that, for example, the seam 34s may widen in the Y-axis direction, and voids 34v may occur in the fourth insulating body 34 because the deep and short slit SST and the seam 34s are in contact.

If the conductive layer 21 is formed in the space S inside the stacked body 2 via the deep and short slit SST (e.g., FIG. 7A) in the state in which the voids 34v have occurred, there is a possibility that the conductive layer 21 may be formed inside the voids 34v. If the conductive layer 21 is formed undesirably inside the voids 34v, the insulation breakdown voltage of the fourth insulating body 34 undesirably decreases.

Figure 32A:
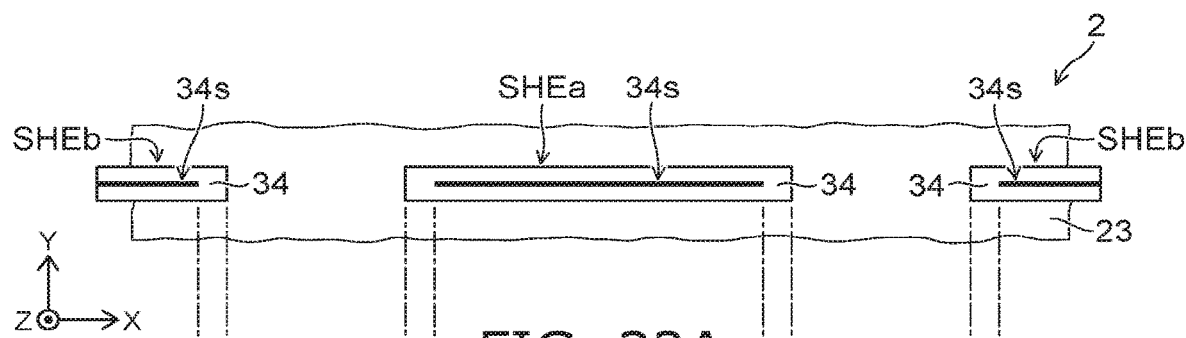
FIG. 32A is a schematic cross-sectional view illustrating the state of the semiconductor device according to the third embodiment in which the shallow slits and the fourth insulating bodies are formed.
Figure 32B:
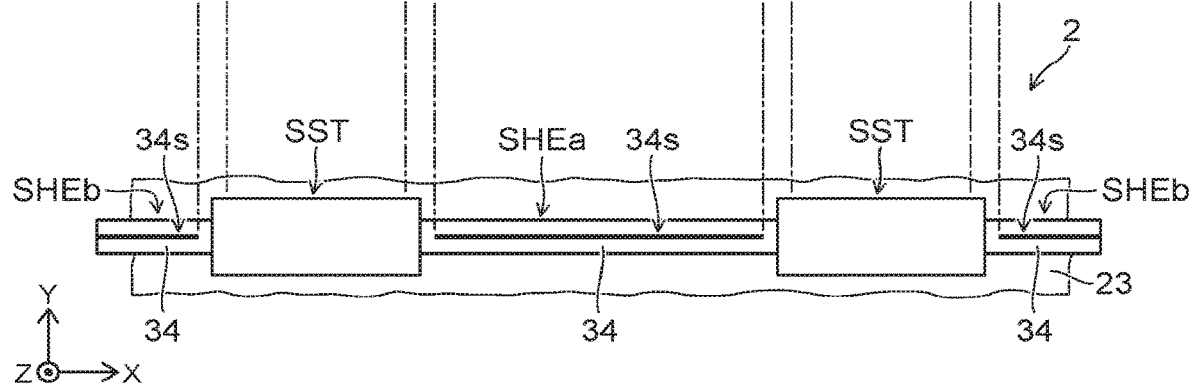
FIG. 32B is a schematic cross-sectional view showing the state in which the deep and short slit SST is formed.

FIG. 32A is a schematic cross-sectional view (an X-Y cross section) illustrating the state of the semiconductor device 100c according to the third embodiment in which the shallow slits SHEa and SHEb and the fourth insulating bodies 34 are formed; and FIG. 32B is a schematic cross-sectional view (an X-Y cross section) showing the state in which the deep and short slit SST is formed.

In the third embodiment as shown in FIG. 32A, the shallow slits SHEa and SHEb that has the perforated configurations are formed in the stacked body 2. Then, the fourth insulating bodies 34 are formed respectively in the shallow slits SHEa and SHEb by filling the shallow slits SHEa and SHEb with an insulator. The seams 34s occur along the X-axis direction in the fourth insulating bodies 34. The shallow slit SHEa and the shallow slit SHEb are separated from each other along the X-axis direction. Therefore, the seams 34s do not contact each other.

Further, as shown in FIG. 32B, the deep and short slit SST is formed in the portion of the stacked body 2 corresponding to the region between the fourth insulating bodies 34. At this time, the deep and short slit SST is formed in the stacked body 2 not to contact the seams 34s. Thereby, the circumstance in which the deep and short slit SST and the seams 34s are in contact can be suppressed. Accordingly, the likelihood of the seams 34s widening in, for example, the Y-axis direction and the voids 34v occurring in the fourth insulating bodies 34 can be reduced.

Third Embodiment: Method for Manufacturing

One example of a manufacturing method according to the third embodiment will be illustrated.

FIG. 33A to FIG. 35B are schematic cross-sectional views in order of the processes (X-Z cross sections) illustrating the method for manufacturing the semiconductor device according to the third embodiment. FIG. 33B to FIG. 35B are schematic cross-sectional views along line XXXIII-XXXIII in FIG. 30A and FIG. 30B.

Figure 33A:
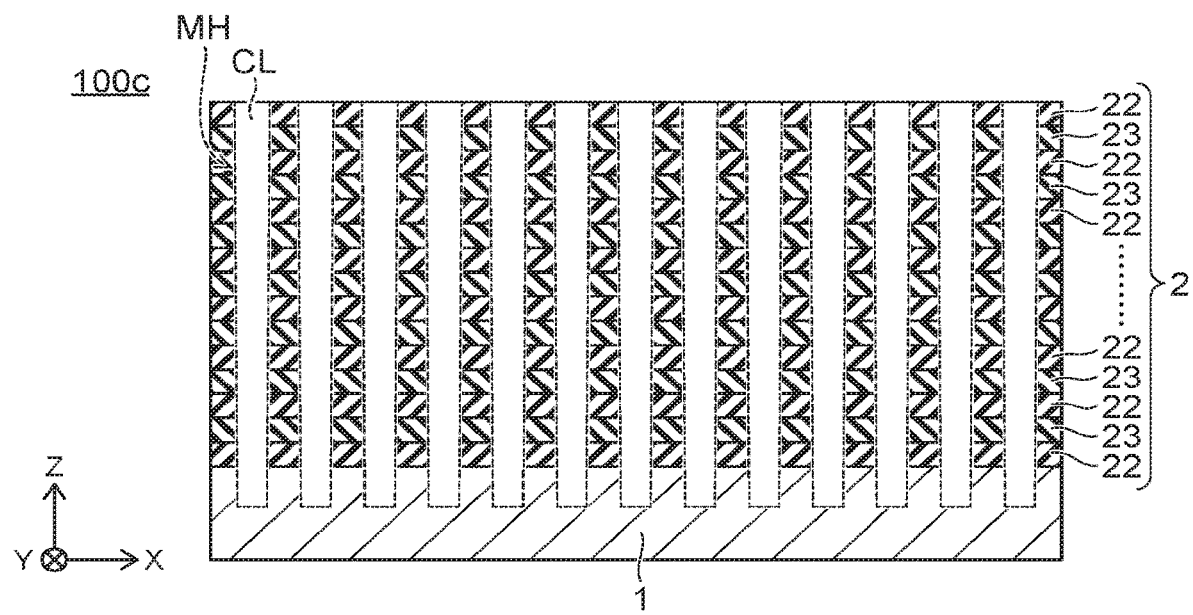
FIG. 33A to FIG. 33B are schematic cross-sectional views in order of the processes illustrating the method for manufacturing the semiconductor device according to the third embodiment.

As shown in FIG. 33A, the stacked body 2 is formed on the semiconductor substrate 1. The stacked body 2 is formed by alternately stacking the insulating layers 22 and the sacrificial films 23 along the Z-axis direction on the semiconductor substrate 1. Then, the memory holes MH are formed inside the stacked body 2 along the Z-axis direction from the upper end of the stacked body 2 to the lower end of the stacked body 2. The memory holes MH reach the interior of the semiconductor substrate 1. Then, the columnar portions CL are formed inside the memory holes MH. The columnar portions CL are not illustrated in FIG. 33B to FIG. 35B referred to below.

Figure 33B:
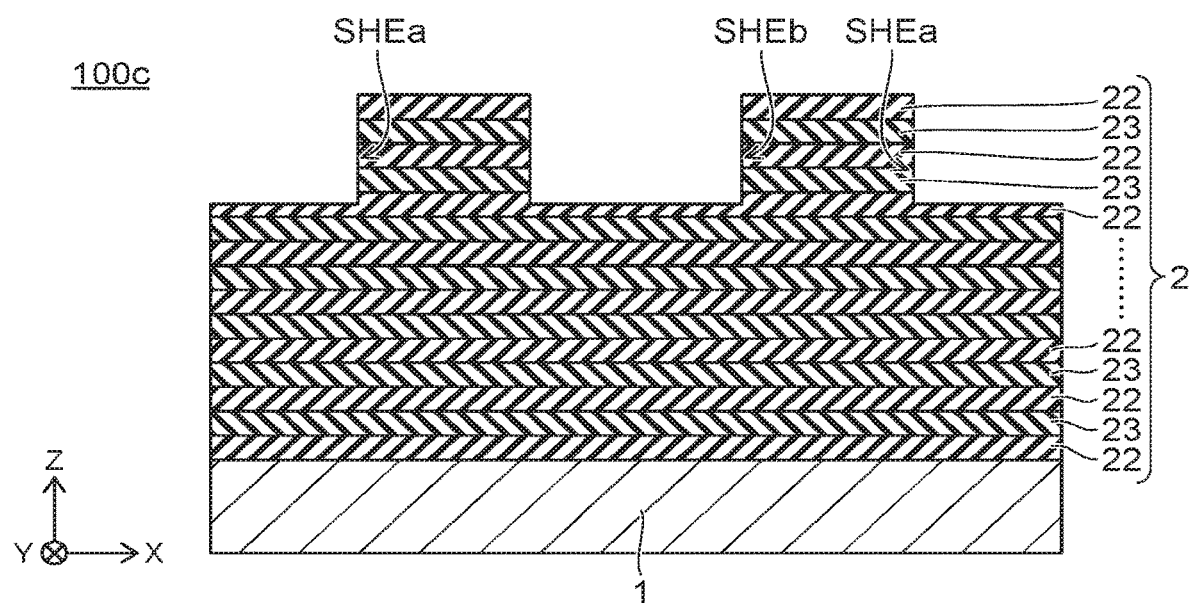

Then, as shown in FIG. 33B, the shallow slits SHEa and SHEb that have the perforated configurations are formed inside the stacked body 2 along the Z-axis direction from the upper end of the stacked body 2 partway through the stacked body 2. For example, the lower ends of the shallow slits SHEa and SHEb are positioned partway through the insulating layer 22 inside the stacked body 2.

Figure 34A:
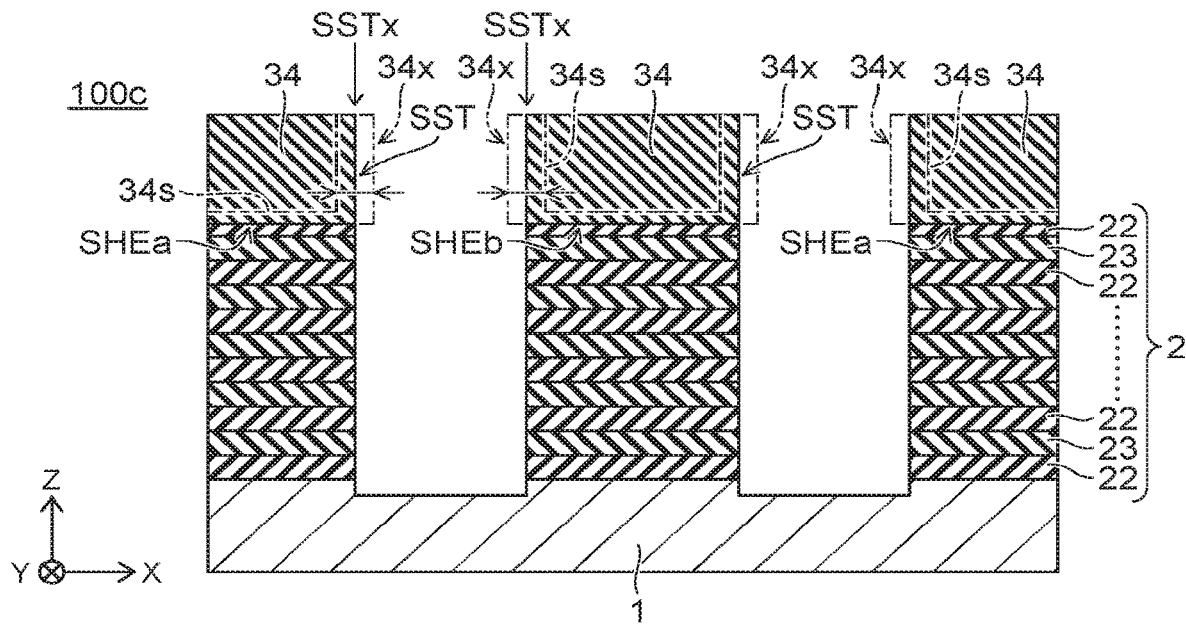
FIG. 34A to FIG. 34B are schematic cross-sectional views in order of the processes illustrating the method for manufacturing the semiconductor device according to the third embodiment.

Continuing as shown in FIG. 34A, the fourth insulating bodies 34 are formed in the interiors of the shallow slits SHEa and SHEb. Then, the deep slits ST (not illustrated) and the deep and short slits SST are formed inside the stacked body 2 along the Z-axis direction from the upper end of the stacked body 2 to the lower end of the stacked body 2. The deep slits ST (not illustrated) and the deep and short slits SST each reach the interior of the semiconductor substrate 1. When forming the deep and short slit SST, two X-axis direction end portions SSTx are formed to be positioned between the seam 34s and an X-axis direction end portion 34x of the fourth insulating body 34. Thereby, the deep and short slit SST contacts the fourth insulating body 34; and the contact of the deep and short slit SST with the seam 34s of the fourth insulating body 34 is suppressed.

Figure 34B:
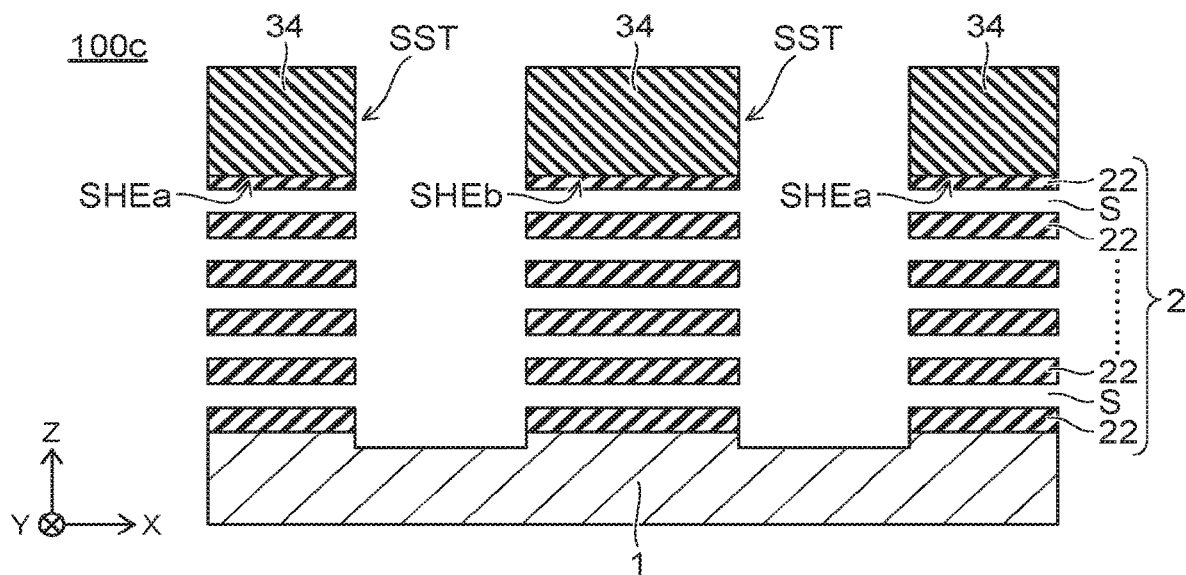

Then, as shown in FIG. 34B, the sacrificial films 23 are removed via the deep slits ST (not illustrated) and the deep and short slits SST. Thereby, the space S is formed between the insulating layers 22. The insulating layers 22 include, for example, silicon oxide; and the sacrificial films 23 include, for example, silicon nitride. For example, wet etching that uses a heated etchant including phosphoric acid is used to remove the sacrificial films 23.

Figure 35A:
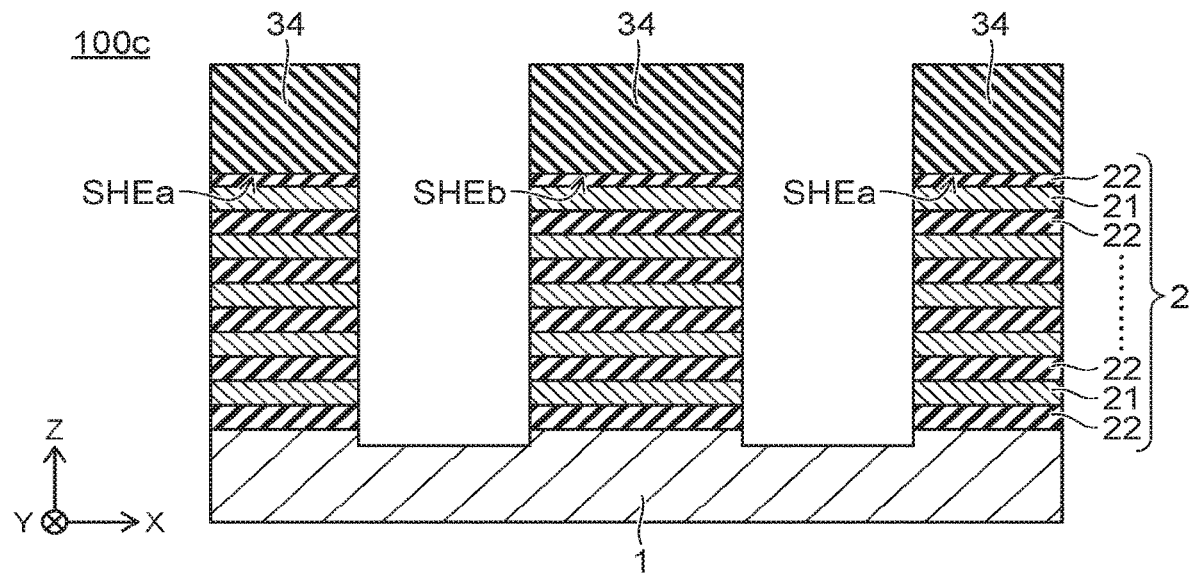
FIG. 35A to FIG. 35B are schematic cross-sectional views in order of the processes illustrating the method for manufacturing the semiconductor device according to the third embodiment.

Continuing as shown in FIG. 35A, the conductive layer 21 is formed between the insulating layers 22 by filling the interior of the space S with a metal (a conductor) via the deep slits ST (not illustrated) and the deep and short slits SST. The metal that is included in the conductive layer 21 is, for example, tungsten; and CVD that uses tungsten fluoride as a metal precursor is used to form the conductive layer 21. Before forming the conductive layer 21, a blocking insulating film (not illustrated) and a barrier film (not illustrated) may be formed inside the space S. Then, the conductive layer 21 that is on the side walls and the bottom surfaces of the deep slits ST and the deep and short slits SST is removed by using RIE.

Figure 35B:
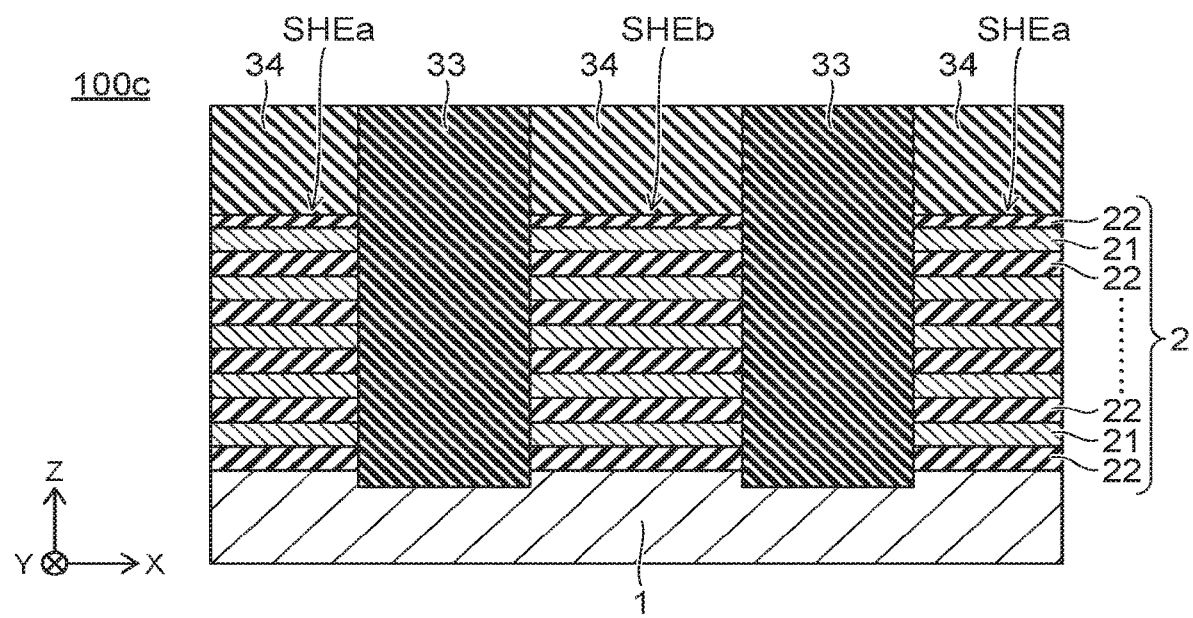

Then, as shown in FIG. 35B, the interiors of the deep slits ST (not illustrated) and the deep and short slits SST are filled with the first to third insulating bodies 31 to 33. The first to third insulating bodies 31 to 33 are, for example, silicon oxide.

Subsequently, although not particularly illustrated, the semiconductor device 100c according to the third embodiment can be manufactured by forming the bit lines BL, etc., according to well-known methods.

Thus, in the semiconductor device 100c, each of the multiple portions of the fourth insulating body 34 include the seams 34s along the X-axis direction. Further, the third insulating body 33 does not contact the seams 34s.

According to such a semiconductor device 100c, the unexpected formation of a metal layer inside the fourth insulating body 34 does not occur easily; and an advantage can be obtained in that the decrease of the insulation breakdown voltage of the insulating body subdividing the block BLOCK into the fingers F can be suppressed.

It is possible to combine the third embodiment with the first embodiment, the first to eleventh modifications described for the first embodiment, and the second embodiment.

Memory Cell Example

Figure 36:
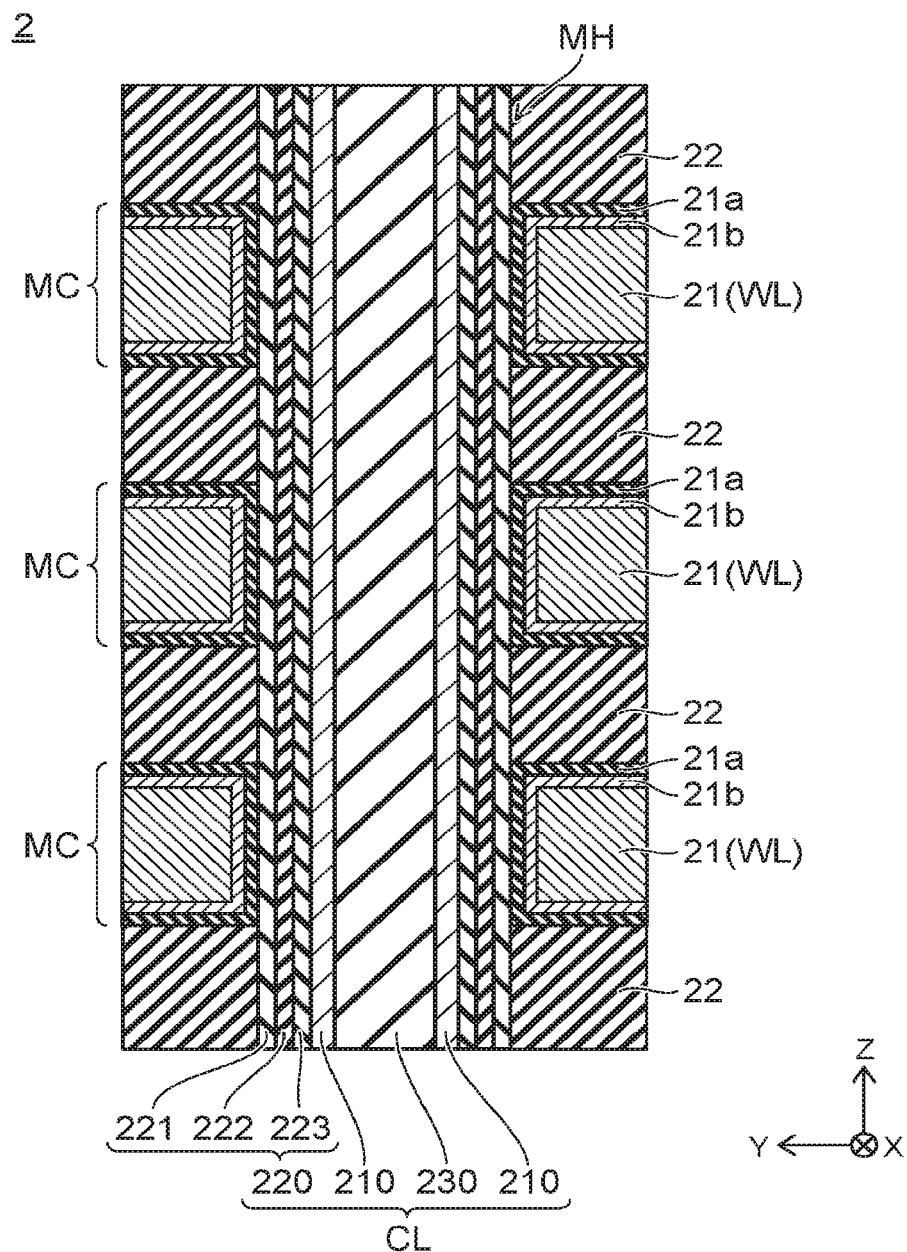
FIG. 36 is a schematic cross-sectional view illustrating memory cells having a three-dimensional structure.

FIG. 36 is a schematic cross-sectional view illustrating memory cells having a three-dimensional structure. In FIG. 36, one simplified example of the memory cells having the three-dimensional structure is shown.

The semiconductor devices 100a to 100c according to the first to third embodiments each are nonvolatile memory including the memory cells having the three-dimensional structure.

As shown in FIG. 36, the stacked body 2 includes the multiple conductive layers 21 and the multiple insulating layers 22. The conductive layers 21 and the insulating layers 22 are stacked alternately in the Z-axis direction. The conductive layers 21 are included in the word lines WL, the source-side selection gate SGS, and the drain-side selection gate SGD. Only the word lines WL are shown in FIG. 36. The conductive layers 21 include, for example, tungsten as a conductive body. The insulating layers 22 include, for example, silicon oxide and electrically insulate the conductive layers 21 from each other.

The memory hole MH is provided inside the stacked body 2. The memory hole MH extends in the Z-axis direction. Although not particularly illustrated, the configuration of the memory hole MH in the X-Y cross section may be a circle or an ellipse. The columnar portion CL is provided inside the memory hole MH. The columnar portion CL includes a semiconductor body 210, a memory film 220, and a core layer 230.

A blocking insulating film 21a and a barrier film 21b are provided between the conductive layer 21 and the insulating layer 22 and between the conductive layer 21 and the memory film 220. The blocking insulating film 21a is, for example, a silicon oxide film or a metal oxide film. For example, in the case where the conductive layer 21 is tungsten, for example, a stacked structure film of titanium nitride and titanium is selected as the barrier film 21b. The blocking insulating film 21a suppresses back-tunneling of charge from the memory film 220 into the conductive layer 21. The barrier film 21b improves the adhesion between the conductive layer 21 and the silicon oxide film, etc.

In the case where the blocking insulating film 21a and the barrier film 21b exist inside the stacked body 2, the space S becomes narrow; and pinch-off of the conductive layer 21 occurs easily. Therefore, the first to third embodiments are particularly advantageous in the case where, for example, the semiconductor devices 100a to 100c include the blocking insulating film 21a and the barrier film 21b inside the stacked body 2.

The semiconductor body 210 is provided inside the memory hole MH. The configuration of the semiconductor body 210 is, for example, a tubular configuration including a bottom. The semiconductor body 210 includes, for example, silicon. The silicon is, for example, polysilicon made of amorphous silicon that is crystallized. The conductivity type of the silicon is, for example, a P-type. The semiconductor body 210 is electrically connected between the semiconductor substrate 1 (FIG. 27) and the bit line BL (FIG. 1A) or between the second semiconductor region 14 (FIG. 26) and the bit line BL.

The memory film 220 is provided between the semiconductor body 210 and the inner wall of the memory hole MH. The configuration of the memory film 220 is, for example, a tubular configuration. The multiple memory cells MC are stacked in the Z-axis direction and are disposed between the semiconductor body 210 and each of the conductive layers 21 used as the word lines. The memory film 220 includes a cover insulating film 221, a charge-storable film 222, and a tunneling insulating film 223.

The cover insulating film 221 is provided between the charge-storable film 222 and the conductive layer 21 and between the charge-storable film 222 and the insulating layer 22. The cover insulating film 221 includes, for example, silicon oxide. The cover insulating film 221 protects the charge-storable film 222 so that the charge-storable film 222 is not etched when replacing the sacrificial films 23 (FIGS. 6A and 6B) with the conductive layers 21.

The charge-storable film 222 is provided between the cover insulating film 221 and the tunneling insulating film 223. The charge-storable film 222 includes, for example, silicon nitride and has trap sites that trap charge inside a film. In the charge-storable film 222, the portion that is interposed between the semiconductor body 210 and the conductive layer 21 used as the word line functions as a charge storage portion. The threshold voltage of the memory cell MC changes due to the existence or absence of the charge inside the charge storage portion or due to the amount of the charge trapped inside the charge storage portion. Thereby, the memory cell MC stores information.

The tunneling insulating film 223 is provided between the semiconductor body 210 and the charge-storable film 222. The tunneling insulating film 223 includes, for example, silicon oxide, or silicon oxide and silicon nitride. The tunneling insulating film 223 is a potential barrier between the semiconductor body 210 and the charge-storable film 222. Tunneling of electrons or holes occurs in the tunneling insulating film 223 when the electrons are injected from the semiconductor body 210 into the charge storage portion (a program operation) and when the holes are injected from the semiconductor body 210 into the charge storage portion (an erase operation).

The core layer 230 fills the interior of the semiconductor body 210 having the tubular configuration. The configuration of the core layer 230 is, for example, a columnar configuration. The core layer 230 includes, for example, silicon oxide and is insulative.

For example, the semiconductor devices 100a to 100c according to the first to third embodiments multiply include the memory cells MC such as those shown in FIG. 36 inside the columnar portion CL.

Thus, according to the embodiments, a semiconductor device can be provided in which it is possible to suppress the resistance value increase of the conductive layer inside the stacked body, etc.

The embodiments of the invention are described while referring to specific examples and several modifications. However, the embodiments of the invention are not limited to these specific examples and modifications.

One skilled in the art may similarly practice the invention by appropriately selecting specific configurations of components such as the semiconductor substrate 1, the stacked body 2, the columnar portion CL, etc., from known art; and such practice is within the scope of the invention to the extent that similar effects can be obtained.

Any two or more components of the examples may be combined within the extent of technical feasibility and are within the scope of the invention to the extent that the spirit of the invention is included.

All semiconductor devices practicable by an appropriate design modification by one skilled in the art based on the semiconductor devices described above as the embodiments of the invention also are within the scope of the invention to the extent that the spirit of the invention is included.

Various modifications and alterations within the spirit of the invention will be readily apparent to those skilled in the art; and all such modifications and alterations should be seen as being within the scope of the invention.

The embodiments recited above are presented as examples and are not intended to limit the scope of the invention. The novel embodiments recited above may be implemented in other various forms; and various omissions, substitutions, and modifications can be performed without departing from the spirit of the invention. These embodiments and their modifications are within the scope and spirit of the invention and are included in the invention described in the claims and their equivalents.

What is claimed is:
1. A semiconductor device, comprising:
a stacked body including a plurality of conductive layers and a plurality of insulating layers, the conductive layers and the insulating layers being stacked alternately along a first direction, the conductive layers including a first conductive layer and a second conductive layer disposed above the first conductive layer;
a first insulating body extending in a second direction and being provided inside the stacked body along the first direction and dividing the first conductive layer and the second conductive layer, the second direction crossing the first direction;
a second insulating body extending in the second direction and being provided inside the stacked body along the first direction and dividing the first conductive layer and the second conductive layer, the second insulating body being at a position different from the first insulating body in a third direction, the third direction crossing the first direction and the second direction;
a third insulating body provided inside the stacked body along the first direction and dividing the first conductive layer and the second conductive layer, the third insulating body being between the first insulating body and the second insulating body;
a fourth insulating body provided inside the stacked body along the first direction, dividing the second conductive layer, and not dividing the first conductive layer, the fourth insulating body being between the first insulating body and the second insulating body, the fourth insulating body including a plurality of portions extending in the second direction, the plurality of portions contacting the third insulating body and being separated from each other in the second direction with the third insulating body interposed;
a first columnar portion provided inside the stacked body along the first direction and penetrating the first conductive layer and the second conductive layer, the first columnar portion being between the first insulating body and the fourth insulating body and including a semiconductor layer; and a second columnar portion provided inside the stacked body along the first direction and penetrating the first conductive layer and the second conductive layer, the second columnar portion being between the second insulating body and the fourth insulating body and including a semiconductor layer.

2. The device according to claim 1, wherein
a configuration of the third insulating body is an ellipse in a cross section, the cross section being along the second direction and the third direction.

3. The device according to claim 2, wherein a major axis of the ellipse is tilted from an extension direction of the fourth insulating body.

4. The device according to claim 2, wherein a major axis of the ellipse substantially matches an extension direction of the fourth insulating body.

5. The device according to claim 1, wherein
a configuration of the third insulating body is a rectangle in a cross section, the cross section being along the second direction and the third direction.

6. The device according to claim 5, wherein a major axis of the rectangle substantially matches an extension direction of the fourth insulating body.

7. The device according to claim 1, wherein
the stacked body includes a plurality of rows including a plurality of columnar portions along the second direction, each of the plurality of columnar portions including a semiconductor layer and being provided inside the stacked body along the first direction from the upper end of the stacked body to the lower end of the stacked body, each of the plurality of columnar portions being between the first insulating body and the fourth insulating body or between the second insulating body and the fourth insulating body,
the first columnar portion is included in one of the plurality of rows,
the second columnar portion is included in another one of the plurality of rows,
the number of the columnar portions included in a first row is less than the number of the columnar portions included in a second row,
the first row is a row adjacent to the fourth insulating body, and
the second row is a row separated from the fourth insulating body with the first row interposed.

8. The device according to claim 7, wherein the first row includes the columnar portions and the third insulating body.

9. The device according to claim 1, wherein
the stacked body includes a plurality of rows including a plurality of columnar portions along the second direction, each of the plurality of columnar portions including a semiconductor layer and being provided inside the stacked body along the first direction from the upper end of the stacked body to the lower end of the stacked body, each of the plurality of columnar portions being between the first insulating body and the fourth insulating body or between the second insulating body and the fourth insulating body,
the first columnar portion is included in one of the plurality of rows,
the second columnar portion is included in another one of the plurality of rows,
the number of the columnar portions included in a first row is equal to the number of the columnar portions included in a second row,
the first row is a row adjacent to the third insulating body and the fourth insulating body, and
the second row is a row separated from the third insulating body and the fourth insulating body with the first row interposed.

10. The device according to claim 9, wherein
a pitch along the third direction between the columnar portions included in the first row and the columnar portions included in a third row is wider than a pitch along the third direction between the columnar portions included in the first row and the columnar portions included in the second row, and
the third row is a row adjacent to the third insulating body and the fourth insulating body, the third row being separated from the first row with the third insulating body and the fourth insulating body interposed.

11. The device according to claim 1, wherein a plurality of the third insulating bodies is provided along the second direction inside the stacked body between the first insulating body and the second insulating body.

12. The device according to claim 1, wherein
the stacked body between the first insulating body and the second insulating body is included in a block, and the stacked body included in the block is multiply arranged along the third direction,
a plurality of the third insulating bodies is provided inside the multiply-arranged stacked bodies along the second direction and along the third direction, and
the plurality of third insulating bodies is arranged in a staggered configuration in a plane, the plane being along the second direction and the third direction.

13. The device according to claim 12, wherein
the multiply-arranged stacked bodies include a plurality of columns including a plurality of columnar portions along the third direction, each of the plurality of columnar portions including a semiconductor layer and being provided inside one of the stacked bodies along the first direction from the upper end of the stacked body to the lower end of the stacked body,
the first columnar portion is included in one of the plurality of columns,
the second columnar portion is included in another one of the plurality of columns, and
each of the plurality of columns includes the columnar portions and the third insulating body.

14. The device according to claim 13, wherein the number of the columnar portions included in each of the plurality of columns is the same between the plurality of columns.

15. The device according to claim 14, further comprising:
a first bit line extending in the third direction; and
a second bit line extending in the third direction,
the first bit line being electrically connected to the columnar portions included in one of the plurality of columns,
the second bit line being electrically connected to the columnar portions included in another one of the plurality of columns,
the number of the columnar portions electrically connected to the first bit line being equal to the number of the columnar portions electrically connected to the second bit line.

16. The device according to claim 1, wherein
a plurality of the fourth insulating bodies is provided along the third direction inside the stacked body between the first insulating body and the second insulating body,
a plurality of the third insulating bodies is provided along the second direction and along the third direction inside the stacked body between the first insulating body and the second insulating body, and the plurality of third insulating bodies is arranged in a staggered configuration in a plane, the plane being along the second direction and the third direction.

17. The device according to claim 1, wherein
each of the plurality of portions of the fourth insulating body includes a seam along the second direction, and
the third insulating body does not contact the seam.

18. A semiconductor device, comprising: a stacked body including a conductive layer and an insulating layer, the conductive layer and the insulating layer being stacked alternately along a first direction;
a first insulating body extending in a second direction and being provided inside the stacked body along the first direction from an upper end of the stacked body to a lower end of the stacked body, the second direction crossing the first direction;
a second insulating body extending in the second direction and being provided inside the stacked body along the first direction from the upper end of the stacked body to the lower end of the stacked body, the second insulating body being at a position different from the first insulating body in a third direction, the third direction crossing the first direction and the second direction;
a third insulating body provided inside the stacked body along the first direction from the upper end of the stacked body to the lower end of the stacked body, the third insulating body being between the first insulating body and the second insulating body;
a fourth insulating body provided inside the stacked body along the first direction from the upper end of the stacked body partway through the stacked body, the fourth insulating body being between the first insulating body and the second insulating body and including a first portion and a second portion extending in the second direction, the first portion and the second portion being separated from each other in the second direction with the third insulating body interposed;
a first columnar portion provided inside the stacked body along the first direction from the upper end of the stacked body to the lower end of the stacked body, the first columnar portion being between the first insulating body and the first portion and including a semiconductor layer;
a second columnar portion provided inside the stacked body along the first direction from the upper end of the stacked body to the lower end of the stacked body, the second columnar portion being between the second insulating body and the first portion and including a semiconductor layer,
a third columnar portion provided inside the stacked body along the first direction from the upper end of the stacked body to the lower end of the stacked body, the third columnar portion being between the first insulating body and the second portion and including a semiconductor layer; and
a fourth columnar portion provided inside the stacked body along the first direction from the upper end of the stacked body to the lower end of the stacked body, the fourth columnar portion being between the second insulating body and the second portion and including a semiconductor layer;

a first bit line extending in the third direction and being electrically connected to the first columnar portion and the second columnar portion;
a second bit line extending in the third direction and being electrically connected to the third columnar portion and the fourth columnar portion; and
a shunt line extending in the third direction, being disposed between the first bit line and the second bit line, and passing above the third insulating body.

19. The device according to claim 18, further comprising:
a first conductive body electrically connected to the shunt line and electrically insulated from the stacked body by the first insulating body; and
a second conductive body electrically connected to the shunt line and electrically insulated from the stacked body by the second insulating body.

20. A semiconductor device, comprising:
a stacked body including a plurality of conductive layers and a plurality of insulating layers, the conductive layers and the insulating layers being stacked alternately along a first direction, the conductive layers including a first conductive layer and a second conductive layer disposed above the first conductive layer;
a first insulating body extending in a second direction and being provided inside the stacked body along the first direction and dividing the first conductive layer and the second conductive layer, the second direction crossing the first direction;
a second insulating body extending in the second direction and being provided inside the stacked body along the first direction and dividing the first conductive layer and the second conductive layer, the second insulating body being at a position different from the first insulating body in a third direction, the third direction crossing the first direction and the second direction;
a third insulating body provided inside the stacked body along the first direction and dividing the first conductive layer and the second conductive layer, the third insulating body being between the first insulating body and the second insulating body;
a fourth insulating body extending in the second direction and being provided inside the stacked body along the first direction, dividing the second conductive layer, and not dividing the first conductive layer, the fourth insulating body being between the first insulating body and the second insulating body, the fourth insulating body being at a position overlapping the third insulating body in the third direction;
a first columnar portion provided inside the stacked body along the first direction and penetrating the first conductive layer and the second conductive layer, the first columnar portion being between the first insulating body and the fourth insulating body and including a semiconductor layer; and
a second columnar portion provided inside the stacked body along the first direction and penetrating the first conductive layer and the second conductive layer, the second columnar portion being between the second insulating body and the fourth insulating body and including a semiconductor layer.

* * * * *